United States Patent
Hanson et al.

[19]

[11] Patent Number: 6,091,498
[45] Date of Patent: Jul. 18, 2000

[54] SEMICONDUCTOR PROCESSING APPARATUS HAVING LIFT AND TILT MECHANISM

[75] Inventors: Kyle Hanson, Kalispell, Mont.; Mark Dix, Seattle, Wash.; Vladimir Zila, Toronto, Canada; Daniel J. Woodruff, Kalispell, Mont.

[73] Assignee: Semitool, Inc., Kalispell, Mont.

[21] Appl. No.: 08/991,062

[22] Filed: Dec. 15, 1997

Related U.S. Application Data

[63] Continuation-in-part of application No. 08/940,524, Sep. 30, 1997, and a continuation-in-part of application No. 08/680,056, Jul. 15, 1996, abandoned.

[51] Int. Cl.$^7$ .......................... G01B 11/14; G01N 21/00
[52] U.S. Cl. ........................ 356/375; 250/559.3
[58] Field of Search ...................... 356/372, 373, 356/375; 414/222, 225, 680, 687, 718, 728, 744.3, 744.6, 744.7, 156, 152, 172, 736, 729; 250/559.01, 559.29, 55, 9.3

[56] References Cited

U.S. PATENT DOCUMENTS

| | | | |
|---|---|---|---|
| 3,968,885 | 7/1976 | Hassan et al. | 414/591 |
| 4,300,581 | 11/1981 | Thompson | 134/578 |
| 4,313,266 | 2/1982 | Tam | 34/317 |
| 4,431,361 | 2/1984 | Bayne | 414/405 |
| 4,449,885 | 5/1984 | Hertel et al. | 414/417 |
| 4,571,850 | 2/1986 | Hunt et al. | 34/242 |
| 4,651,440 | 3/1987 | Karl | 34/58 |
| 4,693,017 | 9/1987 | Oehler et al. | 34/58 |
| 4,746,256 | 5/1988 | Boyle et al. | 414/940 X |
| 4,840,530 | 6/1989 | Nguyen | 414/404 |
| 4,907,349 | 3/1990 | Aigo | 34/58 |
| 4,924,890 | 5/1990 | Giles | 134/61 |
| 4,962,726 | 10/1990 | Matsushita et al. | 118/719 |
| 5,026,239 | 6/1991 | Chiba et al. | 414/217 |
| 5,054,988 | 10/1991 | Shiraiwa | 414/404 |
| 5,055,036 | 10/1991 | Asano et al. | 432/15 |
| 5,059,079 | 10/1991 | Foulke et al. | 414/940 X |
| 5,064,337 | 11/1991 | Asakawa et al. | 414/940 X |
| 5,083,364 | 1/1992 | Olbrich et al. | 29/564 |
| 5,110,248 | 5/1992 | Asano et al. | 414/172 |
| 5,123,804 | 6/1992 | Ishii et al. | 414/680 |
| 5,125,784 | 6/1992 | Asano | 414/404 |
| 5,168,886 | 12/1992 | Thompson et al. | 134/153 |
| 5,168,887 | 12/1992 | Thompson et al. | 134/153 |
| 5,174,045 | 12/1992 | Thompson et al. | 34/58 |
| 5,178,639 | 1/1993 | Nishi | 29/25.02 |
| 5,180,273 | 1/1993 | Sakaya et al. | 414/404 |
| 5,186,594 | 2/1993 | Toshima et al. | 414/217 |
| 5,224,503 | 7/1993 | Thompson et al. | 134/95.2 |
| 5,225,691 | 7/1993 | Powers et al. | 250/561 |
| 5,232,328 | 8/1993 | Owczarz et al. | 414/590 |

(List continued on next page.)

FOREIGN PATENT DOCUMENTS

| | | |
|---|---|---|
| 0047132 | 3/1982 | European Pat. Off. . |
| 0292090 | 11/1988 | European Pat. Off. . |
| 0452939 | 10/1991 | European Pat. Off. . |
| 544311 | 6/1993 | European Pat. Off. . |
| 64-48442 | 2/1989 | Japan . |
| 157755 | 5/1992 | Japan ..................... 414/937 |
| 4-144150 | 5/1992 | Japan . |
| 5-146984 | 6/1993 | Japan . |
| 5-211224 | 8/1993 | Japan . |
| 2217107 | 10/1989 | United Kingdom . |
| WO 81/02533 | 9/1981 | WIPO . |
| WO 92/16015 | 9/1992 | WIPO . |
| WO 95/06326 | 3/1995 | WIPO . |

*Primary Examiner*—Frank G. Font
*Assistant Examiner*—Michael P. Stafira
*Attorney, Agent, or Firm*—Rockey, Milnamow & Katz, Ltd.

[57] ABSTRACT

A lift/tilt assembly for use in a semiconductor wafer processing device is set forth. The lift/tilt assembly includes a linear guide/actuator comprising a fixed frame and a movable frame. A nest for accepting a plurality of semiconductor wafers is rotatably connected to the movable frame. The nest rotates between a wafer-horizontal orientation and a wafer-vertical orientation as it is driven with the movable frame by a motor that is coupled to the linear way. A lever connected to the nest provides an offset from true vertical for the nest when the nest is in the wafer-vertical orientation.

12 Claims, 38 Drawing Sheets

U.S. PATENT DOCUMENTS

| | | | |
|---|---|---|---|
| 5,232,511 | 8/1993 | Bergman | 134/2 |
| 5,235,995 | 8/1993 | Bergman et al. | 134/105 |
| 5,238,500 | 8/1993 | Bergman | 134/3 |
| 5,261,935 | 11/1993 | Ishii et al. | 414/940 X |
| 5,301,700 | 4/1994 | Kamikawa et al. | 134/76 |
| 5,332,445 | 7/1994 | Bergman | 134/3 |
| 5,377,708 | 1/1995 | Bergman et al. | 134/105 |
| 5,388,945 | 2/1995 | Garric et al. | 414/217.1 |
| 5,404,894 | 4/1995 | Shiraiwa | 414/937 X |
| 5,445,172 | 8/1995 | Thompson et al. | 134/153 |
| 5,464,313 | 11/1995 | Ohsawa | 414/172 |
| 5,468,112 | 11/1995 | Ishii et al. | 414/940 X |
| 5,486,080 | 1/1996 | Sieradzki | 414/937 X |
| 5,500,081 | 3/1996 | Bergman | 438/706 |
| 5,507,614 | 4/1996 | Leonov et al. | 414/940 X |
| 5,544,421 | 8/1996 | Thompson et al. | 34/58 |
| 5,562,383 | 10/1996 | Iwai et al. | 414/937 X |
| 5,575,611 | 11/1996 | Thompson et al. | 414/810 |
| 5,658,387 | 8/1997 | Reardon et al. | 118/323 |
| 5,660,517 | 8/1997 | Thompson et al. | 414/217 |
| 5,664,337 | 9/1997 | Davis et al. | 34/58 |
| 5,678,320 | 10/1997 | Thompson et al. | 34/58 | ns
SEMICONDUCTOR PROCESSING APPARATUS HAVING LIFT AND TILT MECHANISM

CROSS-REFERENCE TO RELATED APPLICATIONS

The present application is a continuation-in-part of U.S. Ser. No. 08/940,524 filed Sep. 30, 1997 and of U.S. Ser. No. 08/680,056, filed Jul. 15, 1996, abandoned, which are hereby incorporated by reference.

STATEMENT REGARDING FEDERALLY SPONSORED RESEARCH OR DEVELOPMENT

Not Applicable

BACKGROUND OF THE INVENTION

In the production of semiconductor integrated circuits and other semiconductor articles from semiconductor wafers, it is often necessary to provide multiple metal layers on the wafer to serve as interconnect metallization which electrically connects the various devices on the integrated circuit to one another. Traditionally, aluminum has been used for such interconnects, however, it is now recognized that copper metallization may be preferable.

The application of copper onto semiconductor wafers has, in particular, proven to be a great technical challenge. At this time copper metallization has not achieved commercial reality due to practical problems of forming copper layers on semiconductor devices in a reliable and cost efficient manner. This is caused, in part, by the relative difficulty in performing reactive ion etching or other selective removal of copper at reasonable production temperatures. The selective removal of copper is desirable to form patterned layers and provide electrically conductive interconnects between adjacent layers of the wafer or other wafer.

Because reactive ion etching cannot be efficiently used, the industry has sought to overcome the problem of forming patterned layers of copper by using a damascene electroplating process where holes, more commonly called vias, trenches and other recesses are used in which the pattern of copper is desired. In the damascene process, the wafer is first provided with a metallic seed layer which is used to conduct electrical current during a subsequent metal electroplating step. The seed layer is a very thin layer of metal which can be applied using one or more of several processes. For example, the seed layer of metal can be laid down using physical vapor deposition or chemical vapor deposition processes to produce a layer on the order of 1000 angstroms thick. The seed layer can advantageously be formed of copper, gold, nickel, palladium, and most or all other metals. The seed layer is formed over a surface which is convoluted by the presence of the vias, trenches, or other device features which are recessed. This convoluted nature of the exposed surface provides increased difficulties in forming the seed layer in a uniform manner. Nonuniformities in the seed layer can result in variations in the electrical current passing from the exposed surface of the wafer during the subsequent electroplating process. This in turn can lead to nonuniformities in the copper layer which is subsequently electroplated onto the seed layer. Such nonuniformities can cause deformities and failures in the resulting semiconductor device being formed.

In damascene processes, the copper layer that is electroplated onto the seed layer is in the form of a blanket layer. The blanket layer is plated to an extent which forms an overlying layer, with the goal of completely providing a copper layer that fills the trenches and vias and extends a certain amount above these features. Such a blanket layer will typically be formed in thicknesses on the order of 10,000–15,000 angstroms (1–1.5 microns).

The damascene processes also involve the removal of excess metal material present outside of the vias, trenches or other recesses. The metal is removed to provide a resulting patterned metal layer in the semiconductor integrated circuit being formed. The excess plated material can be removed, for example, using chemical mechanical planarization. Chemical mechanical planarization is a processing step which uses the combined action of a chemical removal agent and an abrasive which grind and polish the exposed metal surface to remove undesired parts of the metal layer applied in the electroplating step.

Automation of the copper electroplating process has been elusive, and there is a need in the art for improved semiconductor plating systems which can produce copper layers upon semiconductor articles which are uniform and can be produced in an efficient and cost-effective manner. More particularly, there is a substantial need to provide a copper plating system that is effectively and reliably automated.

BRIEF SUMMARY OF THE INVENTION

A lift/tilt assembly for use in a semiconductor wafer processing device is set forth. The lift/tilt assembly includes a linear guide/actuator comprising a fixed frame and a moveable frame. A nest for accepting a plurality of semiconductor wafers is rotatably connected to the moveable frame. The nest rotates between a wafer-horizontal orientation and a wafer-vertical orientation as it is driven with the movable frame by a motor that is coupled to the linear guide/actuator. A lever connected to the nest provides an offset from true vertical for the nest when the nest is in the wafer-vertical orientation.

DETAILED DESCRIPTION OF THE INVENTION

Figure 1:
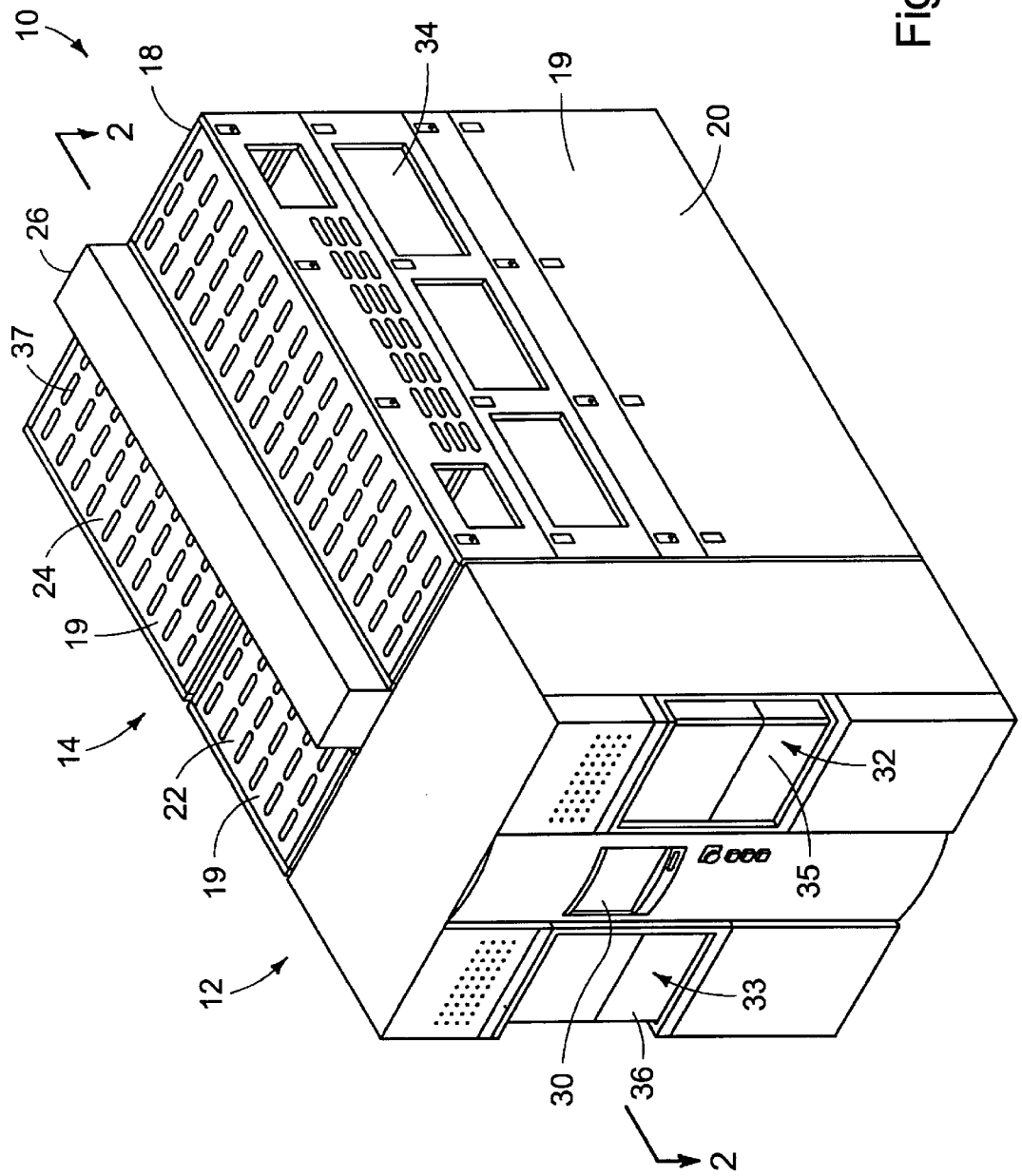
FIG. 1 is an isometric view of the semiconductor wafer processing tool in accordance with the present invention.

Referring to FIG. 1, a present preferred embodiment of the semiconductor wafer processing tool 10 is shown. The processing tool 10 may comprise an interface section 12 and processing section 14. Semiconductor wafer cassettes 16 containing a plurality of semiconductor wafers, generally designated W, may be loaded into the processing tool 10 or unloaded therefrom via the interface section 12. In particular, the wafer cassettes 16 are preferably loaded or unloaded through at least one port such as first port 32 within a front outwardly facing wall of the processing tool 10. An additional second port 33 may be provided within the interface section 12 of the processing tool 10 to improve access and port 32 may be utilized as an input and port 33 may be utilized as an output.

Respective powered doors 35, 36 may be utilized to cover access ports 32, 33 thereby isolating the interior of the processing tool 10 from the clean room. Each door 35, 36 may comprise two portions. The upper portions and lower portion move upward and downward, respectively, into the front surface of the processing tool 10 to open ports 32, 33 and permit access therein.

Wafer cassettes 16 are typically utilized to transport a plurality of semiconductor wafers. The wafer cassettes 16 are preferably oriented to provide the semiconductor wafers therein in an upright or vertical position for stability during transportation of the semiconductor wafers into or out of the processing tool 10.

The front outwardly facing surface of the processing tool 10 may advantageously join a clean room to minimize the number of harmful contaminants which may be introduced into the processing tool 10 during insertion and removal of wafer cassettes 16. In addition, a plurality of wafer cassettes 16 may be introduced into processing tool 10 or removed therefrom at one time to minimize the opening of ports 32, 33 and exposure of the processing tool 10 to the clean room environment.

The interface section 12 joins a processing section 14 of the processing tool 10. The processing section 14 may include a plurality of semiconductor wafer processing modules for performing various semiconductor process steps. In particular, the embodiment of the processing tool 10 shown in FIG. 1 includes a plating module 20 defining a first lateral surface of the processing section 14. The processing section 14 of the tool 10 may advantageously include additional modules, such as prewet module 22 and resist strip module 24, opposite the plating module 20.

Alternatively, other modules for performing additional processing functions may also be provided within the processing tool 10. The specific processing performed by processing modules of the processing tool 10 may be different or of similar nature. Various liquid and gaseous processing steps can be used in various sequences. The processing tool 10 is particularly advantageous in allowing a series of complex processes to be run serially in different processing modules set up for different processing solutions. All the processing can be advantageously accomplished without human handling and in a highly controlled working space 11, thus reducing human operator handling time and the chance of contaminating the semiconductor wafers.

The processing modules of the process tool 10 are preferably modular, interchangeable, stand-alone units. The processing functions performed by the processing tool 10 may be changed after installation of the processing tool 10 increasing flexibility and allowing for changes in processing methods. Additional wafer processing modules may be added to the processing tool 10 or replace existing processing modules 19.

The processing tool 10 of the present invention preferably includes a rear closure surface 18 joined with the lateral sides of the processing tool 10. As shown in FIG. 1, an air supply 26 may be advantageously provided intermediate opposing processing modules of the processing section 14. The interface section 12, lateral sides of the processing section 14, closure surface 18, and air supply 26 preferably provide an enclosed work space 11 within the processing tool 10. The air supply 26 may comprise a duct coupled with a filtered air source (not shown) for providing clean air into the processing tool 10. More specifically, the air supply 26 may include a plurality of vents intermediate the processing modules 19 for introducing clean air into work space 11.

Figure 16:
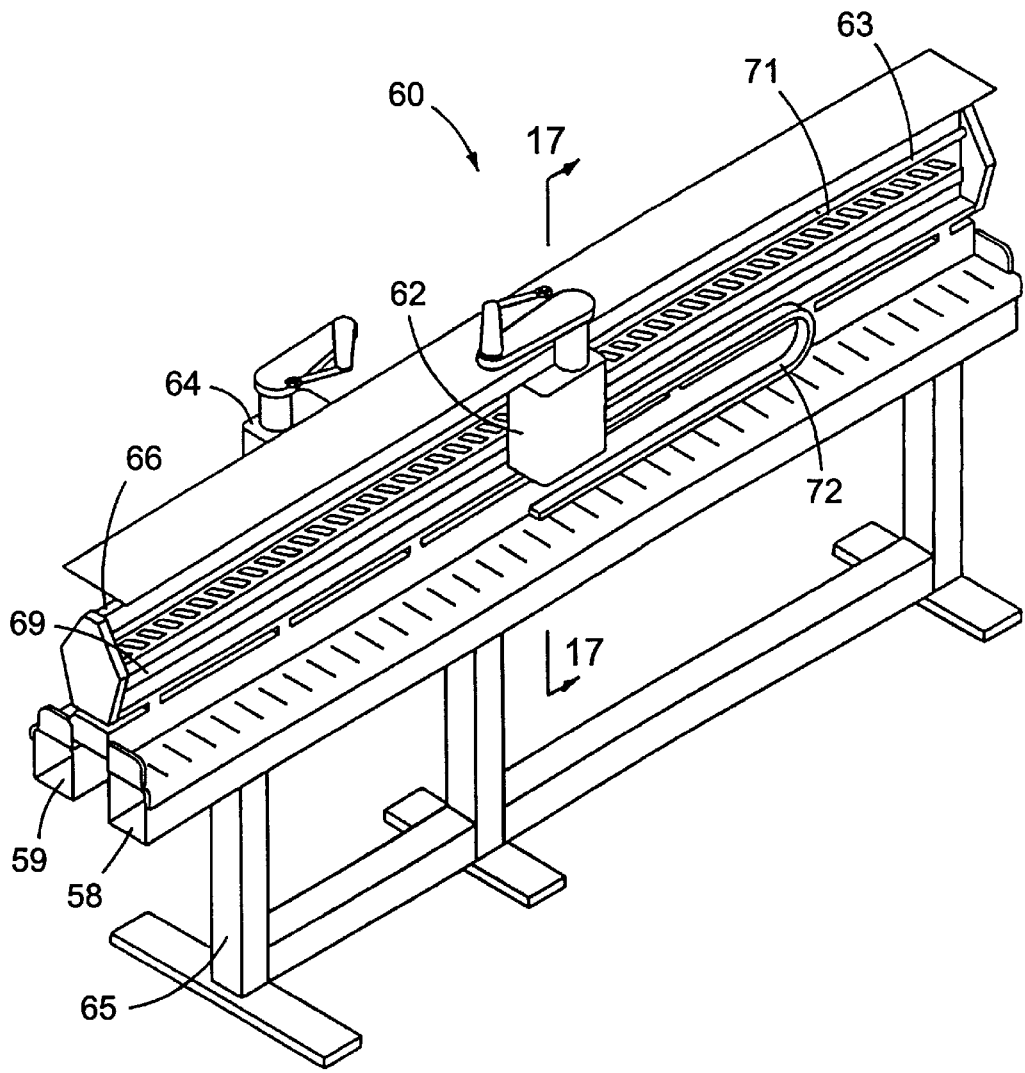
FIGS. 16–19 illustrate a wafer conveying system in accordance with one embodiment of the present invention.

Referring to FIG. 16, exhaust ducts 58, 59 may be provided adjacent the frame 65 of a wafer transport unit guide 66 to remove the circulated clean air and the contaminants therein. Exhaust ducts 58, 59 may be coupled with the each of the processing modules 19 for drawing supplied clean air therethrough. In particular, clean air is supplied to the workspace 11 of the processing tool 10 via air supply 26. The air may be drawn adjacent the wafer transport units 62, 64 and into the processing modules 19 via a plurality of vents 57 formed within a shelf or process deck thereof by an exhaust fan (not shown) coupled with the output of exhaust ducts 58, 59. Each processing module 19 within the processing tool 10 may be directly coupled with ducts 58, 59. The air may be drawn out of the ducts 58, 59 of the processing tool 10 through the rear closant surface 18 or through a bottom of surface of the processing tool 10. Providing an enclosed work space and controlling the environment within the work space greatly reduces the presence of contaminants in the processing tool 10.

Each of the processing modules may be advantageously accessed through exterior panels of the respective modules forming the lateral side of the processing tool 10. The lateral sides of the processing tool 10 may be adjacent a gray room environment. Gray rooms have fewer precautions against contamination compared with the clean rooms. Utilizing this configuration reduces plant costs while allowing access to the processing components and electronics of each wafer module of the processing tool 10 which require routine maintenance.

A user interface 30 may be provided at the outwardly facing front surface of the processing tool as shown in FIG. 1. The user interface 30 may advantageously be a touch screen cathode ray tube control display allowing finger contact to the display screen to effect various control functions within the processing tool 10. An additional user interface 30 may also be provided at the rear of the processing tool 10 or within individual processing modules so that processing tool 10 operation can be effected from alternate locations about the processing tool 10. Further, a portable user interface 30 may be provided to permit an operator to move about the processing tool 10 and view the operation of the processing components therein. The user interface 30 may be utilized to teach specified functions and operations to the processing modules 19 and semiconductor wafer transport units 62, 64.

Each module 20, 22, 24 within the processing tool 10 preferably includes a window 34 allowing visual inspection of processing tool 10 operation from the gray room. Further, vents 37 may be advantageously provided within a top surface of each processing module 20, 22, 24. Processing module electronics are preferably located adjacent the vents 37 allowing circulating air to dissipate heat generated by such electronics.

Figure 2:
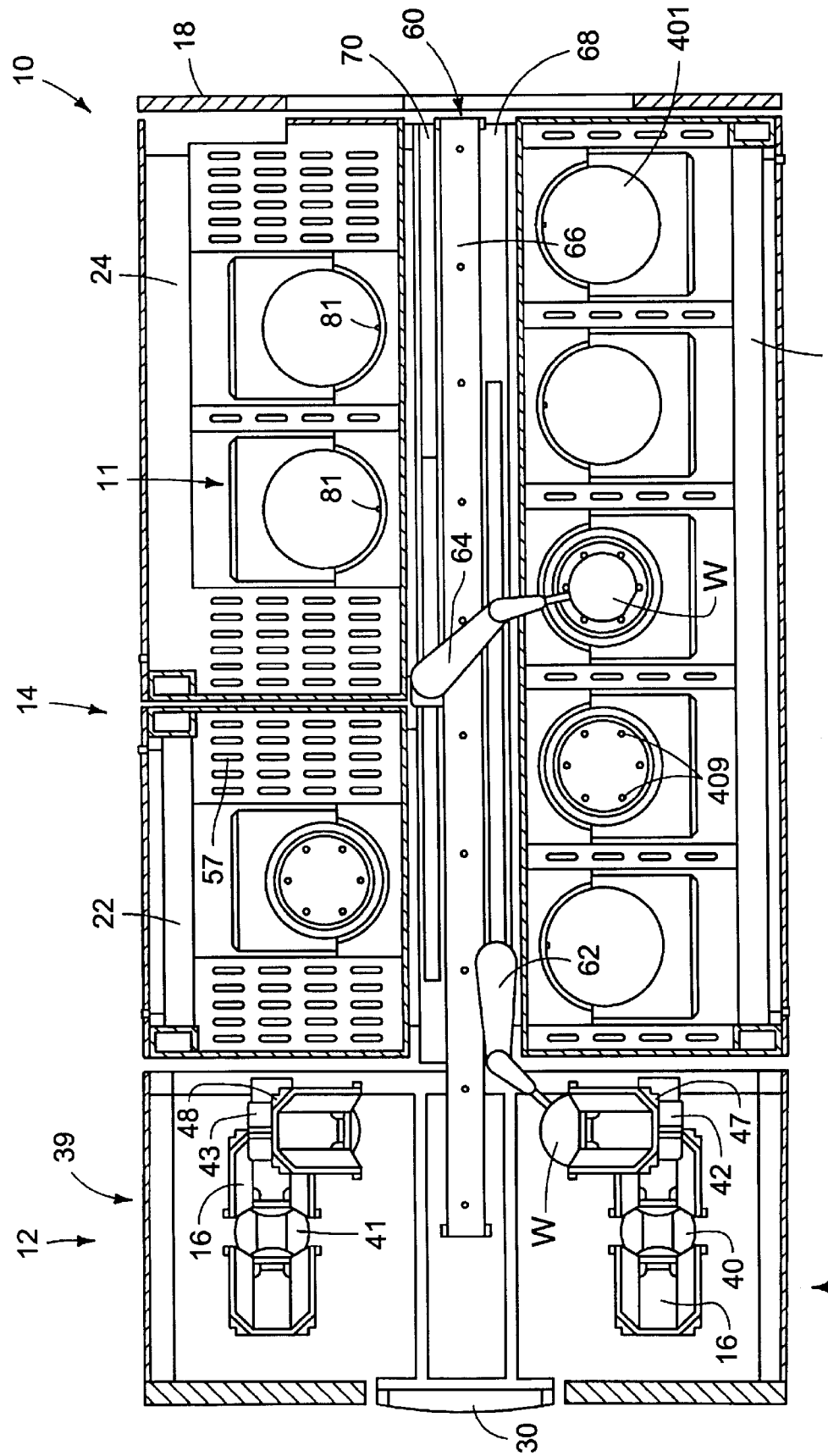
FIG. 2 is a cross-sectional view taken along line 2—2 of the semiconductor wafer processing tool shown in FIG. 1.

The work space 11 within the interface section 12 and processing section 14 of an embodiment of the processing tool 10 is shown in detail in FIG. 2.

The interface section 12 includes two interface modules 38, 39 for manipulating wafer cassettes 16 within the processing tool 10. The interface modules 38, 39 receive wafer cassettes 16 through the access ports 32, 33 and may store the wafer cassettes 16 for subsequent processing of the semiconductor wafers therein. In addition, the interface modules 38, 39 store the wafer cassettes for removal from the processing tool 10 upon completion of the processing of the semiconductor wafers within the respective wafer cassette 16.

Each interface module 38, 39 may comprise a wafer cassette turnstile 40, 41 and a wafer cassette elevator 42, 43. The wafer cassette turnstiles 40, 41 generally transpose the wafer cassettes 16 from a stable vertical orientation to a horizontal orientation where access to the semiconductor wafers is improved. Each wafer cassette elevator 42, 43 has a respective wafer cassette support 47, 48 for holding wafer cassettes 16. Each wafer cassette elevator 42, 43 is utilized to position a wafer cassette 16 resting thereon in either a transfer position and extraction position. The operation of the wafer interface modules 38, 39 is described in detail below.

In a preferred embodiment of the present invention, the first wafer interface module 38 may function as an input wafer cassette interface for receiving unprocessed semiconductor wafers into the processing tool 10. The second wafer interface module 39 may function as an output wafer cassette interface for holding processed semiconductor wafers for removal from the processing tool 10. Wafer transport units 62, 64 within the processing tool 10 may access wafer cassettes 16 held by either wafer interface module 38, 39. Such an arrangement facilitates transferring of semiconductor wafers throughout the processing tool 10.

A semiconductor wafer conveyor 60 is shown intermediate processing modules 20, 22, 24 and interface modules 38, 39 in FIG. 2. The wafer conveyor 60 includes wafer transport units 62, 64 for transferring individual semiconductor wafers W between each of the wafer interface modules 38, 39 and the wafer processing modules 19.

Wafer conveyor 60 advantageously includes a transport unit guide 66, such as an elongated rail, which defines a plurality of paths 68, 70 for the wafer transport units 62, 64 within the processing tool 10. A wafer transport unit 62 on a first path 68 may pass a wafer transport unit 64 positioned on a second path 70 during movement of the transport units 62, 64 along transport guide 66. The processing tool 10 may include additional wafer transport units to facilitate the transfer of semiconductor wafers W between the wafer processing modules 20, 22, 24 and wafer interface modules 38, 39.

More specifically, the second arm extension 88 may support a semiconductor wafer W via vacuum support 89. The appropriate wafer transport unit 62, 64 may approach a wafer support 401 by moving along transport unit guide 66. After reaching a proper location along guide 66, the first extension 87 and second extension 88 may rotate to approach the wafer support 401. The second extension 88 is positioned above the wafer support 401 and subsequently lowered toward engagement finger assemblies 409 on the wafer support 401. The vacuum is removed from vacuum support 89, and finger assemblies within the processing modules grasp the semiconductor wafer W positioned therein. Second extension 88 may be lowered and removed from beneath the semiconductor wafer held by the wafer engagement fingers.

Following completion of processing of the semiconductor wafer within the appropriate processing module 20, 22, 24, a wafer transport unit 62, 64 may retrieve the wafer and either deliver the wafer to another processing module 20, 22, 24 or return the wafer to a wafer cassette 16 for storage or removal from the processing tool 10.

Each of the wafer transport units 62, 64 may access a wafer cassette 16 adjacent the conveyor 60 for retrieving a semiconductor wafer from the wafer cassette 16 or depositing a semiconductor wafer therein. In particular, wafer transport unit 62 is shown withdrawing a semiconductor wafer W from wafer cassette 16 upon elevator 42 in FIG. 2. More specifically, the second extension 88 and vacuum support 89 connected therewith may be inserted into a wafer cassette 16 positioned in the extraction position. Second extension 88 and vacuum support 89 enter below the lower surface of the bottom semiconductor wafer W held by wafer cassette 16. A vacuum may be applied via vacuum support 89 once support 89 is positioned below the center of the semiconductor wafer W being removed. The second extension 88, vacuum support 89 and semiconductor wafer W attached thereto may be slightly raised via transfer arm elevator 90. Finally, first extension 87 and second extension 88 may be rotated to remove the semiconductor wafer W from the wafer cassette 16. The wafer transport unit 62, 64 may thereafter deliver the semiconductor wafer W to a wafer processing module 19 for processing.

Thereafter, wafer transport unit 62 may travel along path 68 to a position adjacent an appropriate processing module 20, 22, 24 for depositing the semiconductor wafer upon wafer processing support 401 for processing of the semiconductor wafer.

INTERFACE MODULE

Referring to FIG. 3–FIG. 8, the operation of the interface module 38 is shown in detail. The following discussion is limited to wafer interface module 38 but is also applicable to wafer interface module 39 inasmuch as each interface module 38, 39 may operate in substantially the same manner.

Preferably, the first wafer interface module 38 and the second wafer interface module 39 may function as a respective semiconductor wafer cassette 16 input module and output module of the processing tool 10. Alternately, both modules can function as both input and output. More specifically, wafer cassettes 16 holding unprocessed semiconductors wafers may be brought into the processing tool 10 via port 32 and temporarily stored within the first wafer interface module 38 until the semiconductor wafers are to be removed from the wafer cassette 16 for processing. Processed semiconductor wafers may be delivered to a wafer cassette 16 within the second wafer interface module 39 via wafer transport units 62, 64 for temporary storage and/or removal from the processing tool 10.

The wafer interface modules 38, 39 may be directly accessed by each of the wafer transport units 62, 64 within the processing tool 10 for transferring semiconductor wafers therebetween. Providing a plurality of wafer cassette interface modules 38, 39 accessible by each wafer transport unit 62, 64 facilitates the transport of semiconductor wafers W throughout the processing tool 10 according to the present invention.

Each wafer interface module 38, 39 preferably includes a wafer cassette turnstile 40 and a wafer cassette elevator 42 adjacent thereto. The access ports 32, 33 are adjacent the respective wafer cassette turnstiles 40, 41. Wafer cassettes 16 may be brought into the processing tool 10 or removed therefrom via ports 32, 33.

Wafer cassettes 16 are preferably placed in a vertical position onto cassette trays 50 prior to delivery into the processing tool 10. Cassette trays 50 are shown in detail in FIG. 9. The vertical position of wafer cassettes 16 and the semiconductor wafers therein provides a secure orientation to maintain the semiconductor wafers within the wafer cassette 16 for transportation.

Each wafer cassette turnstile 40, 41 preferably includes two saddles 45, 46 each configured to hold a wafer cassette 16. Providing two saddles 45, 46 enables two wafer cassettes 16 to be placed into the processing tool 10 or removed therefrom during a single opening of a respective access door 35, 36 thereby minimizing exposure of the workspace 11 within the processing tool 10 to the clean room environment.

Each saddle 45, 46 includes two forks engageable with the cassette tray 50. Saddles 45, 46 are powered by motors within the wafer cassette turnstile shaft 49 to position the wafer cassette 16 in a horizontal or vertical orientation. The wafer cassettes 16 and semiconductor wafers therein are preferably vertically oriented for passage through the access ports 32, 33 and horizontally oriented in a transfer or extraction position to provide access of the wafers therein to the wafer transport units 62, 64.

Figure 3:
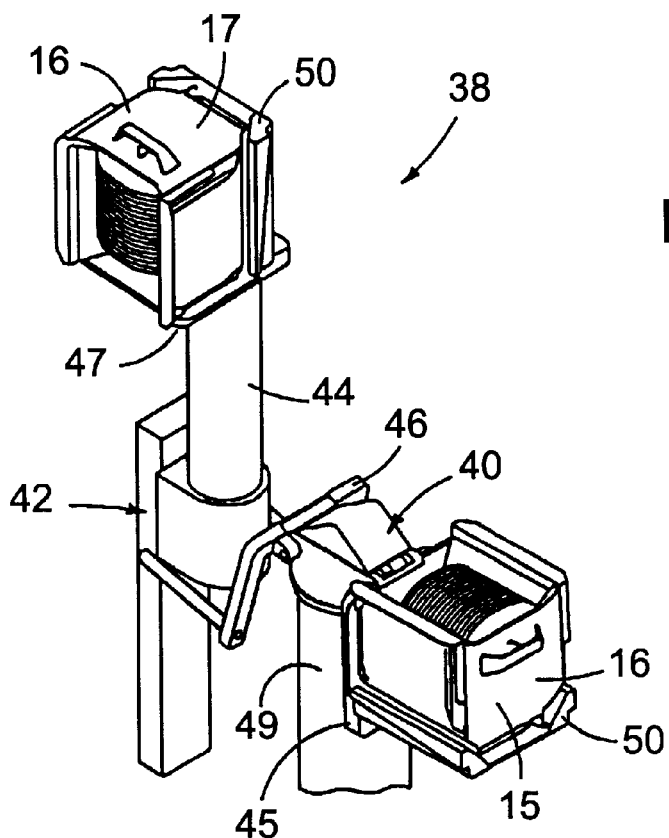
FIGS. 3–8 are a diagrammatic representation of a wafer cassette turnstile and elevator of a preferred interface module of the semiconductor wafer processing tool according to the present invention operating to exchange wafer cassettes between a hold position and an extraction position.

The wafer cassette 16 held by wafer cassette turnstile 40 in FIG. 3, also referred to as wafer cassette 15, is in a hold position (also referred to herein as a load position). The semiconductor wafers within a wafer cassette 16 in the hold position may be stored for subsequent processing. Alternatively, the semiconductor wafers within a wafer cassette 16 in the hold position may be stored for subsequent removal from the processing tool 10 through an access port 32, 33.

Referring to FIG. 3, the wafer cassette 16 supported by the wafer cassette elevator 42, also referred to as wafer cassette 17, is in an extraction or exchange position. Semiconductor wafers may either be removed from or placed into a wafer cassette 16 positioned in the extraction position via a wafer transport unit 62, 64.

The wafer cassette turnstile 41 and wafer cassette elevator 42 may exchange wafer cassettes 15, 17 to transfer a wafer cassette 17 having processed semiconductor wafers therein from the extraction position to the hold position for removal from the processing tool 10. Additionally, such an exchange may transfer a wafer cassette 15 having unprocessed semiconductor wafers therein from the hold position to the extraction position providing wafer transport units 62, 64 with access to the semiconductor wafer therein.

Figure 4:
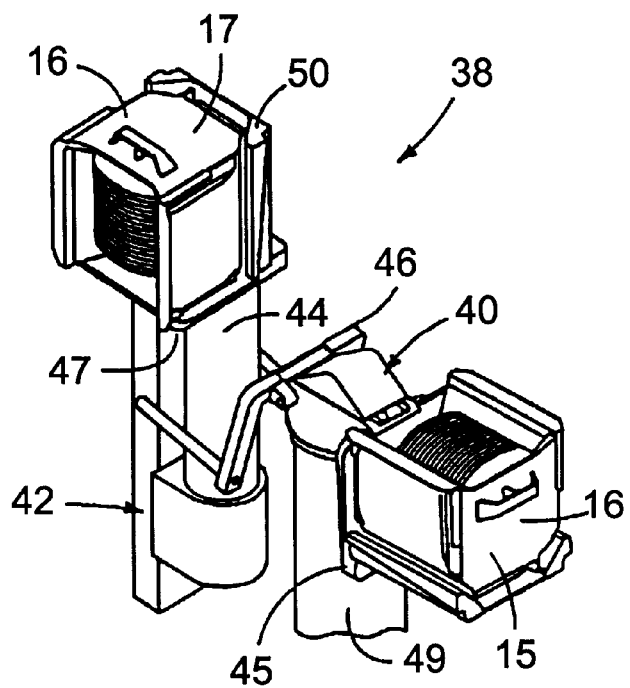

The exchange of wafer cassettes 15, 17 is described with reference to FIG. 4–FIG. 8. Specifically, saddle 46 is positioned below a powered shaft 44 of wafer cassette elevator 42. Shaft 44 is coupled with a powered wafer cassette support 47 for holding a wafer cassette 16. Shaft 44 and wafer cassette support 47 attached thereto are lowered as shown in FIG. 4 and shaft 44 passes between the forks of saddle 46.

Figure 5:
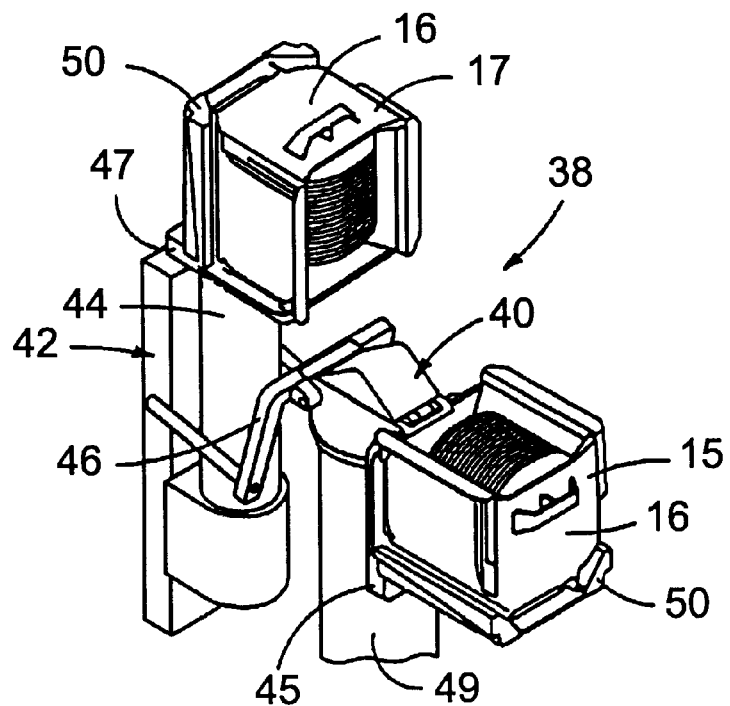
Figure 6:
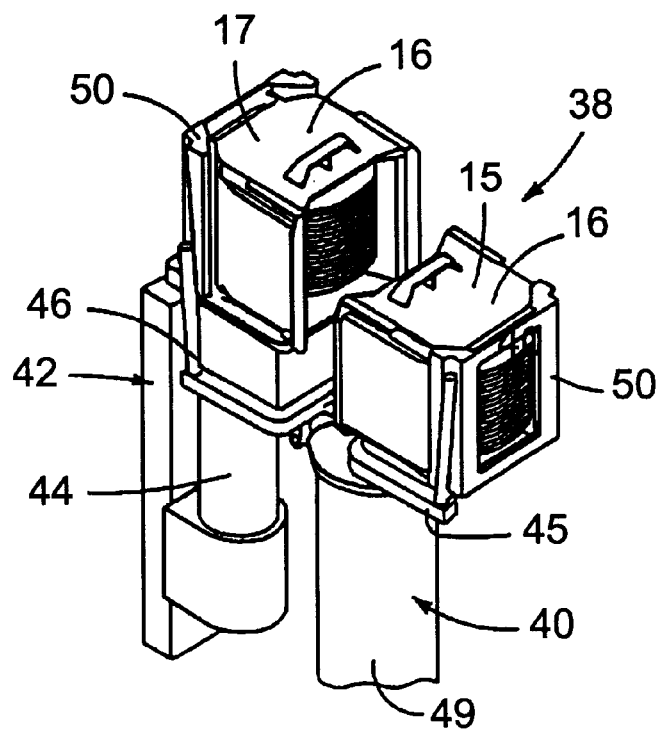
Figure 7:
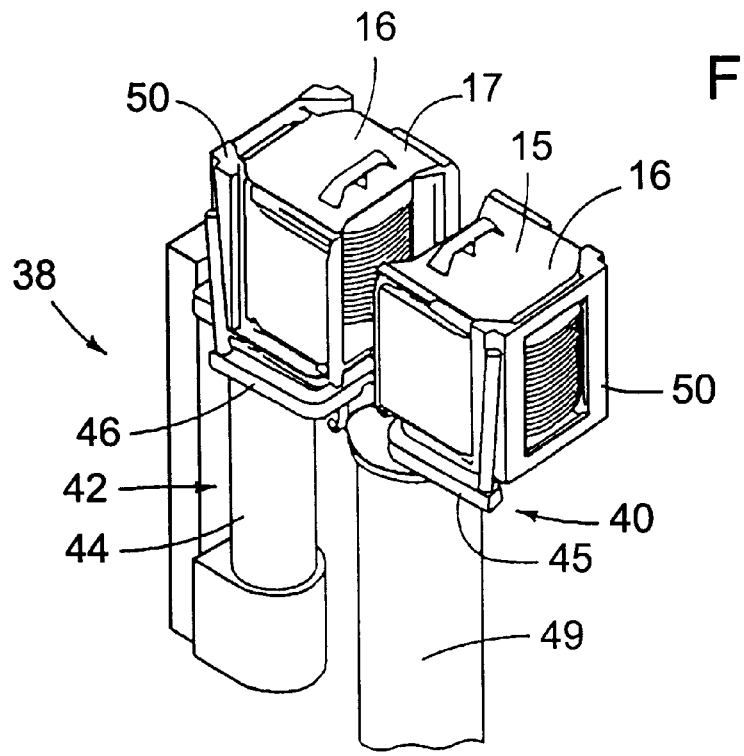
Figure 8:
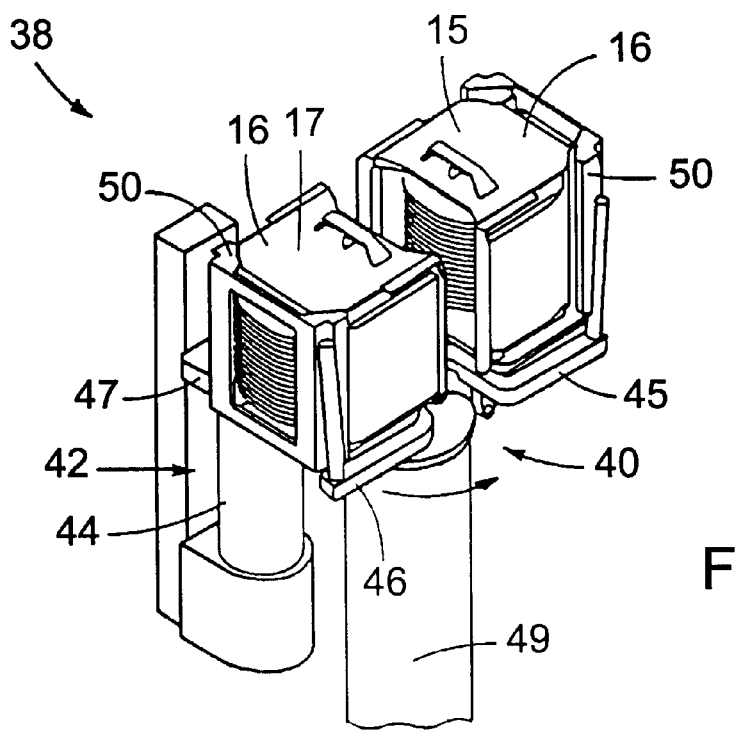

Referring to FIG. 5, a motor within shaft 44 rotates wafer cassette support 47 about an axis through shaft 44 providing the wafer cassette 17 thereon in an opposing relation to the wafer cassette 15 held by wafer cassette turnstile 40. Both saddles 45, 46 of wafer cassette turnstile 40 are subsequently tilted into a horizontal orientation as shown in FIG. 6. The shaft 44 of wafer cassette elevator 42 is next lowered and wafer cassette 17 is brought into engagement with saddle 46 as depicted in FIG. 7. The shaft 44 and wafer cassette support 47 are lowered an additional amount to clear rotation of wafer cassettes 16. Referring to FIG. 8, wafer cassette turnstile 40 rotates 180 degrees to transpose wafer cassettes 15, 17.

Wafer cassette 17 having processed semiconductor wafers therein is now accessible via port 32 for removal from the processing tool 10. Wafer cassette 15 having unprocessed semiconductors therein is now positioned for engagement with wafer cassette support 47. The transfer process steps shown in FIG. 3–FIG. 8 may be reversed to elevate the wafer cassette 15 into the extraction position providing access of the semiconductor wafers to wafer transport units 62, 64.

Figure 10:
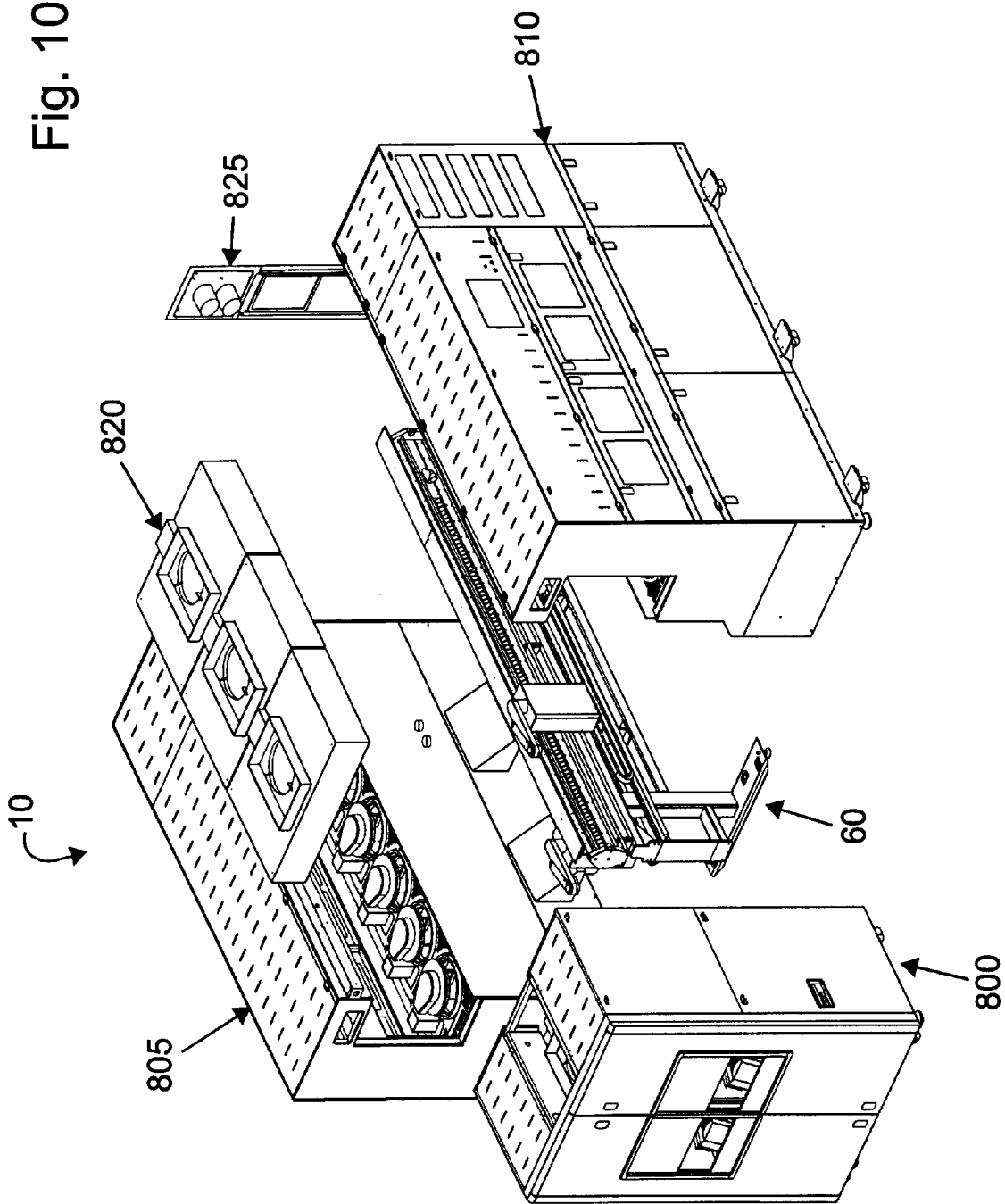
FIGS. 10–15 illustrate one manner in which the processing tool may be modularized to facilitate end-to-end connection of sequential processing units.

FIG. 10 illustrates one manner in which the apparatus 10 may be modularized. As illustrated, the apparatus 10 is comprised of an input/output assembly 800, left and right processing modules 805, 810, wafer conveyor system 60, top exhaust assembly 820, and end panel 825. As illustrated, left and right processing modules 805 and 810 may be secured to one another about the wafer conveying system 60 to form a processing chamber having an inlet and 830 and an outlet 835. A plurality of these processing modules may thus be secured in an end-to-end configuration to thereby provide an extended processing chamber capable of performing a substantially larger number of processes on each wafer or, in the alternative, process a larger number of wafers concurrently. In such instances, the wafer conveying system 60 of one apparatus 10 is programmed to cooperate with the wafer conveying system 60 of one or more prior or subsequent conveying systems 60.

Figure 11:
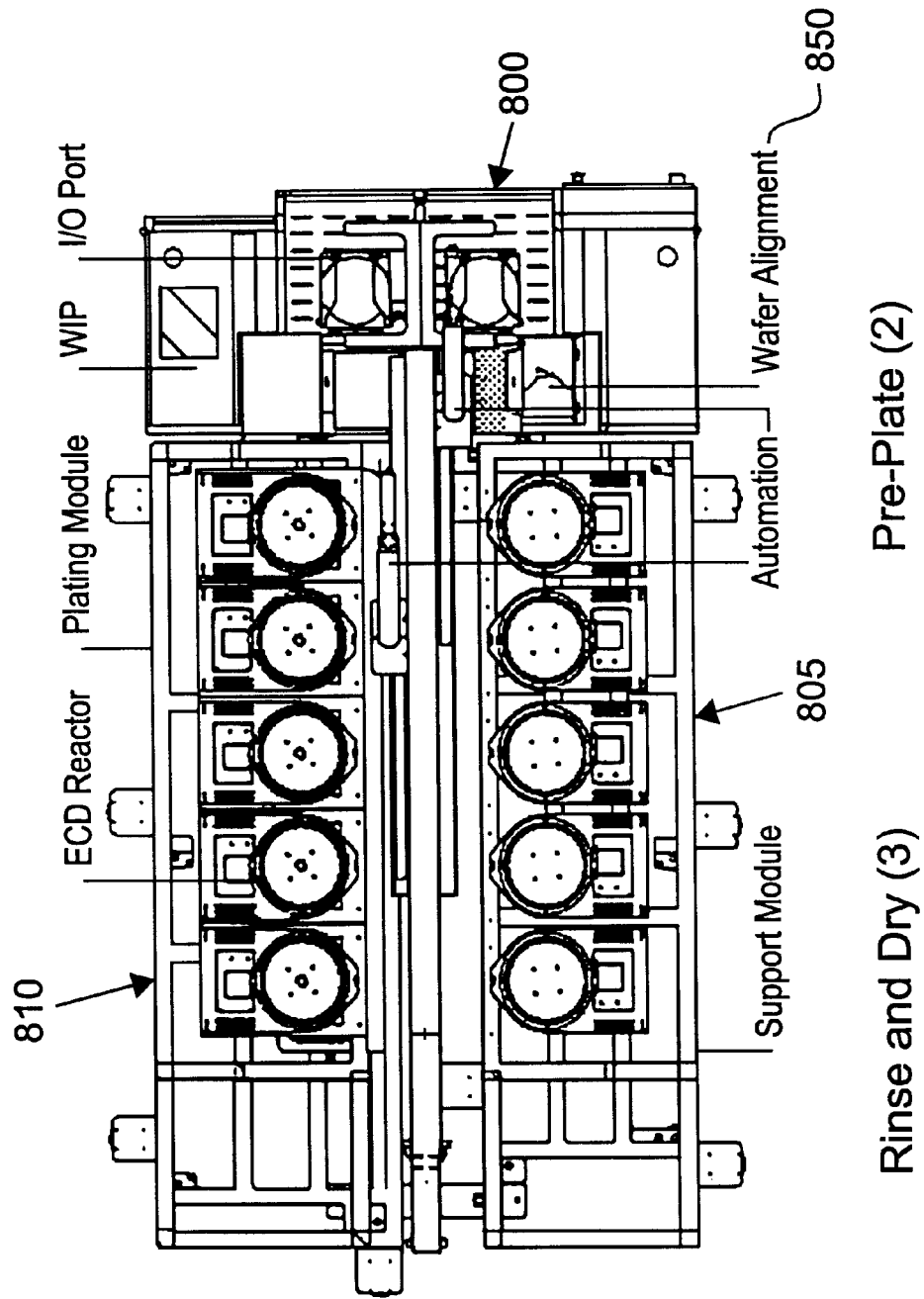

FIG. 11 illustrates one manner of arranging processing heads within the apparatus 10. In this embodiment, the left hand processing module 805 is comprised of three processing heads that are dedicated to rinsing and drying each wafer after electrochemical deposition and two processing heads for performing wetting of the wafers prior to electrochemical deposition. Generically, the left hand processing module 805 constitutes a support module having processing heads used in pre-processing and post-processing of the wafers with respect to electrochemical copper deposition. The right-hand module 810 generically constitutes a plating module and includes five reactor heads dedicated to electrochemical copper deposition. In the embodiment of FIG. 11, a wafer alignment station 850 is provided to ensure thickness proper orientation of each wafer as it is processed in the apparatus. Wafer alignment may be based upon sensing of registration marks or the like on each wafer.

Figure 12:
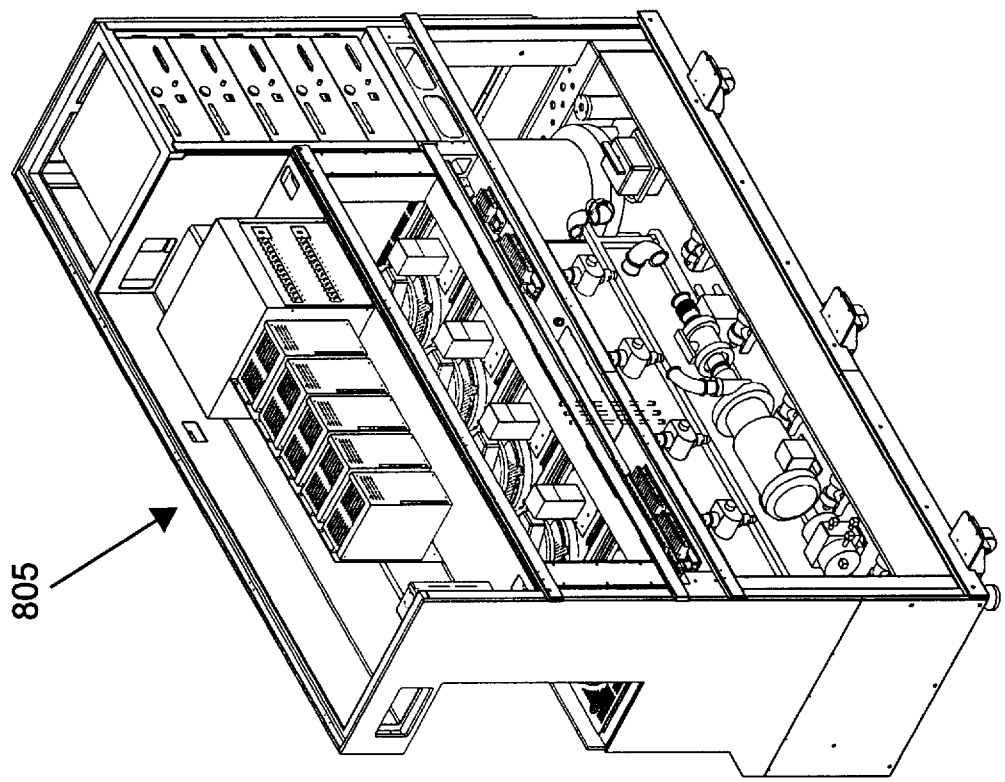
Figure 13:
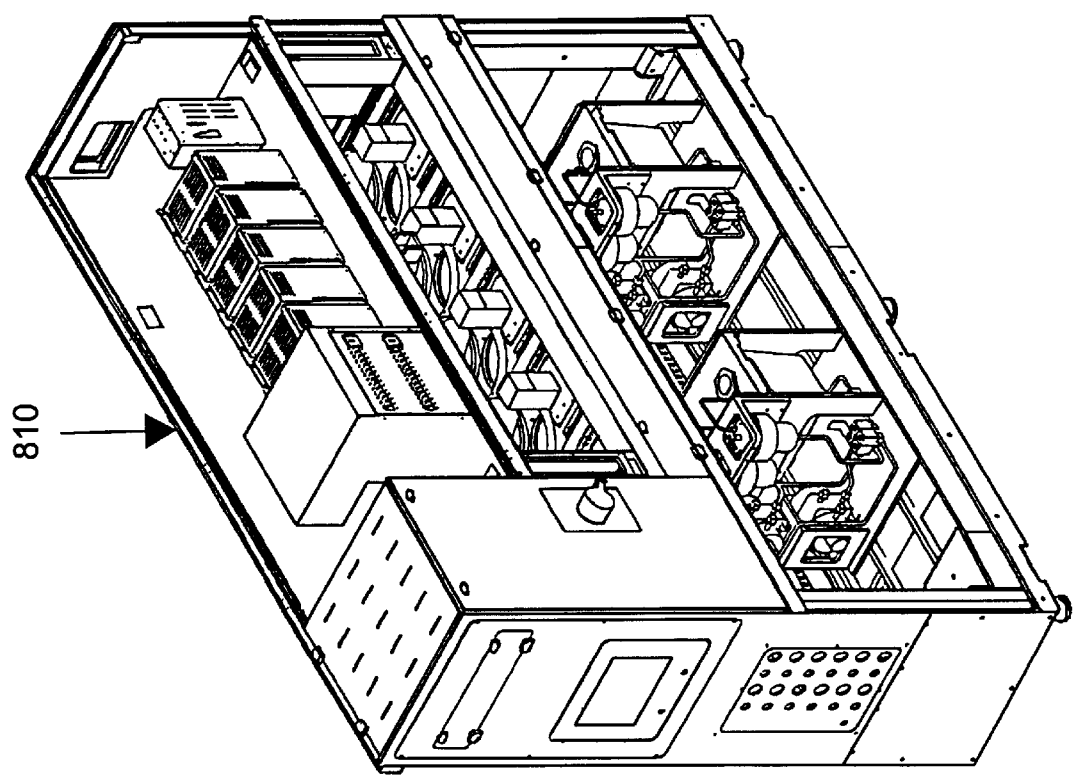

FIGS. 12 and 13 illustrate embodiments of the left and right hand processing modules 805 and 810, respectively. In these figures, the exterior portions of the respective housing have been removed thereby exposing various system components. Preferably, electronic components such as power supplies, controllers, etc., are disposed in the upper portion of each of the processing modules 805 and 810, while moving components and the like are disposed in a lower portion of each of the processing modules.

Figure 14:
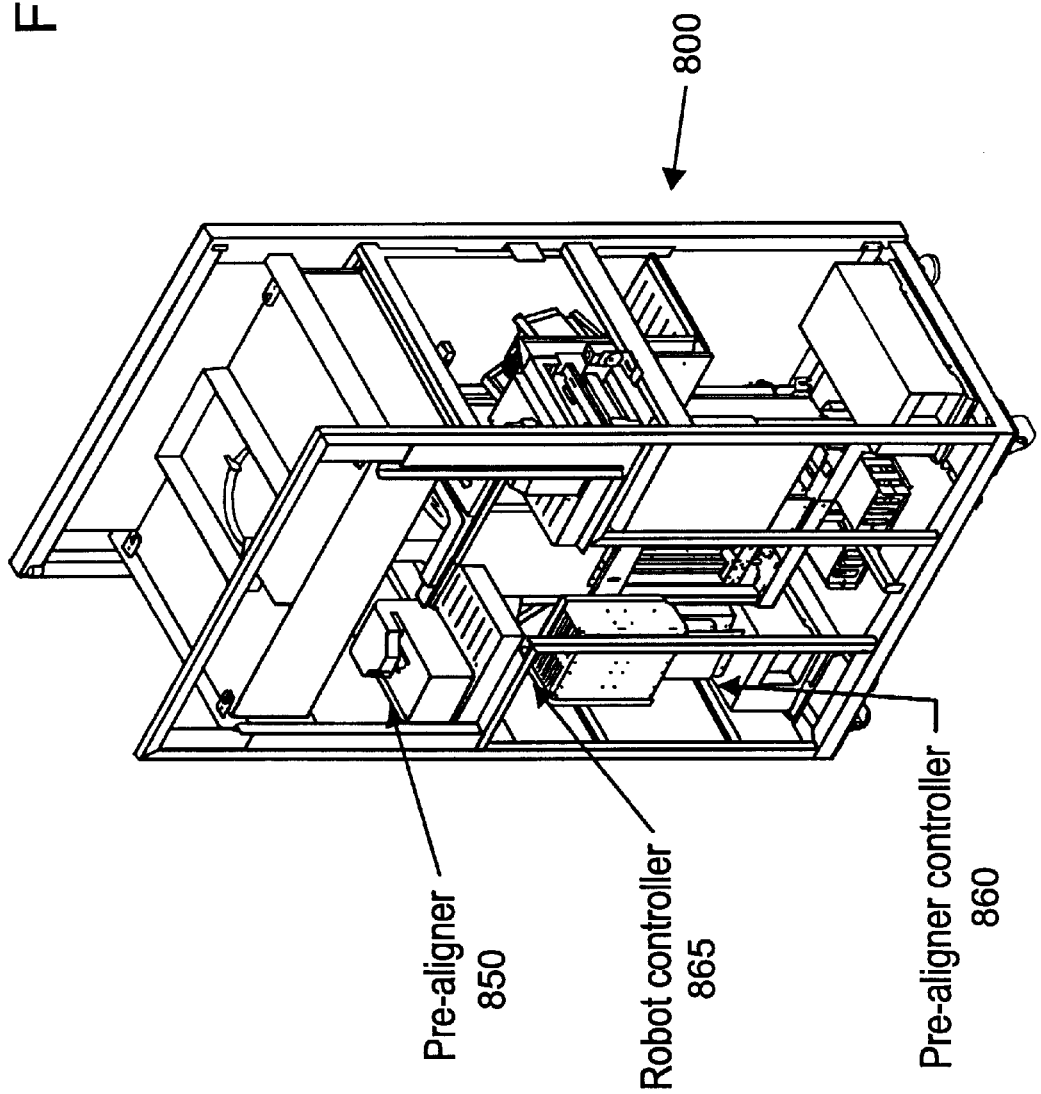
Figure 15:
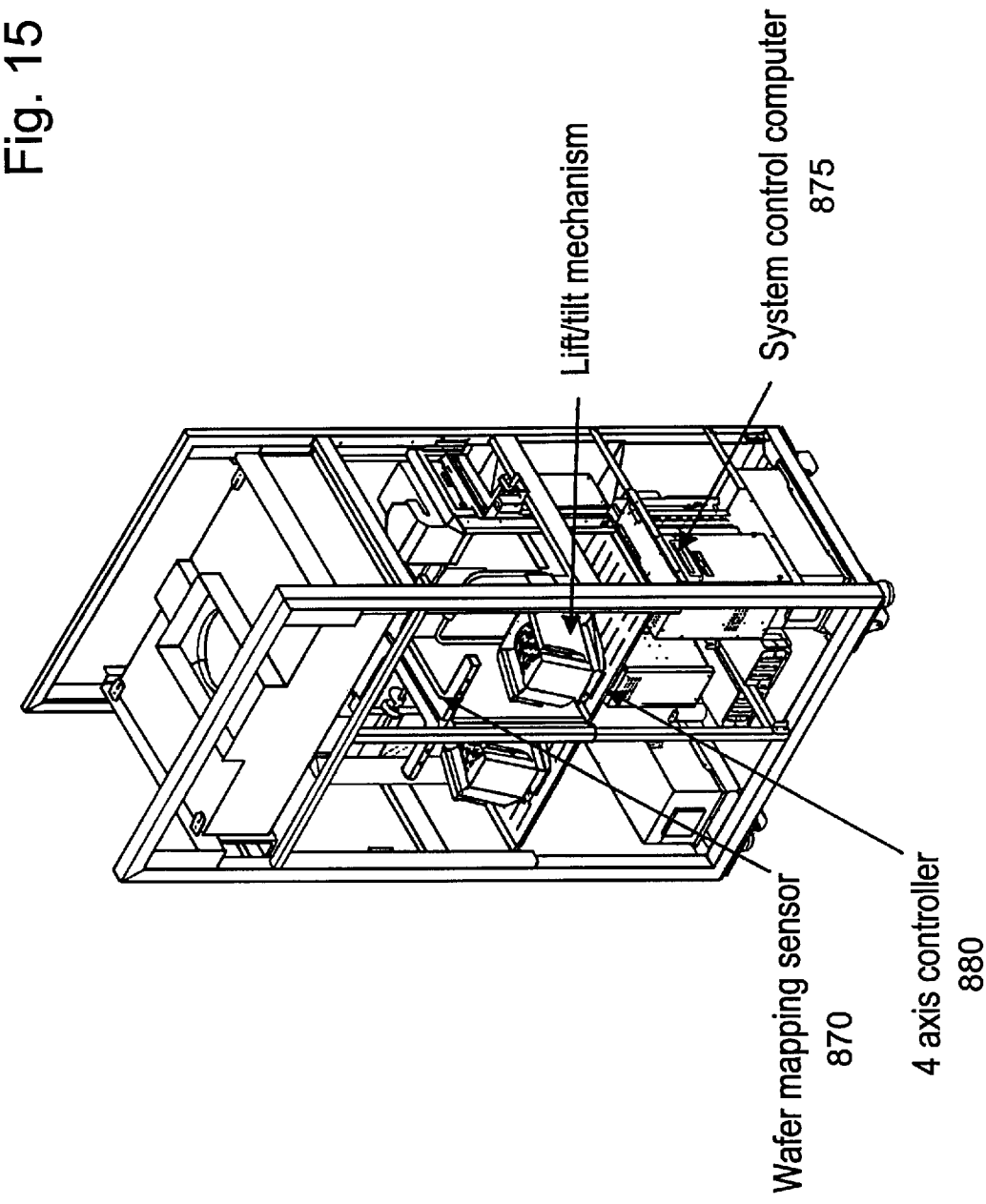

FIG. 14 is a perspective view of the input module 800 with its panels removed as viewed from the interior of apparatus 10. FIG. 15 provides a similar view of the input module 800 with respect to the exterior of apparatus 10. In the illustrated embodiment, the wafer alignment station 850 and a wafer alignment controller 860 are provided in the input module 800. A robot controller 865 used to control the wafer conveying system 60 is also disposed therein. To keep track of the wafers as they are processed, the input module 800 is provided with one or more wafer mapping sensors 870 that sense the wafers present in each cassette. Other components in the input module 800 include the system control computer 875 and a four-axis controller 880. The system control computer 875 is generally responsible for coordinating all operations of the apparatus 10.

SEMICONDUCTOR WAFER CONVEYOR

The processing tool 10 includes a semiconductor wafer conveyor 60 for transporting semiconductor wafers throughout the processing tool 10. Preferably, semiconductor wafer conveyor 60 may access each wafer cassette interface module 38, 39 and each wafer processing module 19 within processing tool 10 for transferring semiconductor wafers therebetween. This includes processing modules from either side.

One embodiment of the wafer conveyor system 60 is depicted in FIG. 16. The wafer conveyor 60 generally includes a wafer transport unit guide 66 which preferably comprises an elongated spine or rail mounted to frame 65. Alternatively, transport unit guide 66 may be formed as a track or any other configuration for guiding the wafer transport units 62, 64 thereon. The length of wafer conveyor 60 may be varied and is configured to permit access of the wafer transport units 62, 64 to each interface module 38, 39 and processing modules 20, 22, 24.

Wafer transport unit guide 66 defines the paths of movement 68, 70 of wafer transport units 62, 64 coupled therewith. Referring to FIG. 16, a spine of transport unit guide 66 includes guide rails 63, 64 mounted on opposite sides thereof. Each semiconductor wafer transport unit 62, 64 preferably engages a respective guide rail 63, 64. Each guide rail can mount one or more transport units 62, 64. Extensions 69, 75 may be fixed to opposing sides of guide 66 for providing stability of the transport units 62, 64 thereagainst and to protect guide 66 from wear. Each wafer transport unit 62, 64 includes a roller 77 configured to ride along a respective extension 69, 75 of guide 66.

It is to be understood that wafer conveyor 60 may be formed in alternate configurations dependent upon the arrangement of interface modules 38, 39 and processing modules 20, 22, 24 within the processing tool 10. Ducts 58, 59 are preferably in fluid communication with extensions from each wafer processing module 19 and an exhaust fan for removing circulated air from the workspace 11 of the processing tool 10.

Each wafer transport unit 62, 64 is powered along the respective path 68, 70 by a suitable driver. More specifically, drive operators 71, 74 are mounted to respective sides of transport unit guide 66 to provide controllable axial movement of wafer transport units 62, 64 along the transport unit guide 66.

The drive operators 71, 74 may be linear magnetic motors for providing precise positioning of wafer transport units 62, 64 along guide 66. In particular, drive operators 71, 74 are preferably linear brushless direct current motors. Such preferred driver operators 71, 74 utilize a series of angled magnetic segments which magnetically interact with a respective electromagnet 79 mounted on the wafer transport units 62, 64 to propel the units along the transport unit guide 66.

Cable guards 72, 73 may be connected to respective wafer transport units 62, 64 and frame 65 for protecting communication and power cables therein. Cable guards 72, 73 may comprise a plurality of interconnected segments to permit a fill range of motion of wafer transport units 62, 64 along transport unit guide 66.

Figure 17:
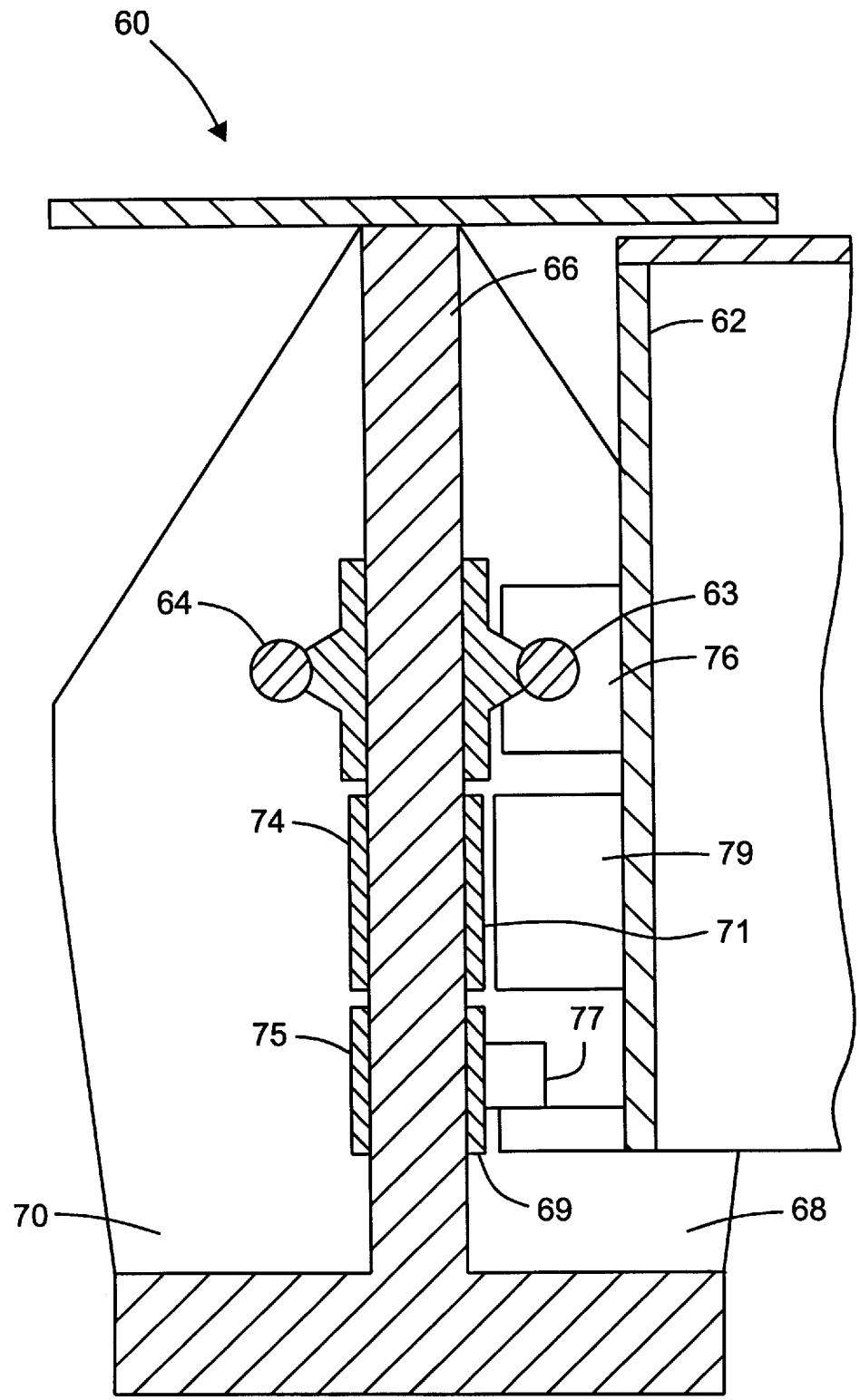

As shown in FIG. 17, a first wafer transport unit 62 is coupled with a first side of the spine of guide 66. Each wafer transport unit 62, 64 includes a linear bearing 76 for engagement with linear guide rails 63, 64. Further, the wafer transport units 62, 64 each preferably include a horizontal roller 77 for engaging a extension 69 formed upon the spine of the guide 66 and providing stability.

FIG. 17 additionally shows an electromagnet 79 of the first wafer transport unit 62 mounted in a position to magnetically interact with drive actuator 71. Drive actuator 71 and electromagnet 79 provide axial movement and directional control of the wafer transport units 62, 64 along the transport unit guide 66.

SEMICONDUCTOR WAFER TRANSPORT UNITS

Preferred embodiments of the semiconductor wafer transport units 62, 64 of the wafer conveyor 60 are described with reference to FIG. 18 and FIG. 19.

In general, each wafer transport unit 62, 64 includes a movable carriage or tram 84 coupled to a respective side of the transport unit guide 66, a wafer transfer arm assembly 86 movably connected to the tram 84 for supporting a semiconductor wafer W, and a wafer transfer arm elevator 90 for adjusting the elevation of the transfer arm assembly 86 relative to tram 84.

Figure 18:
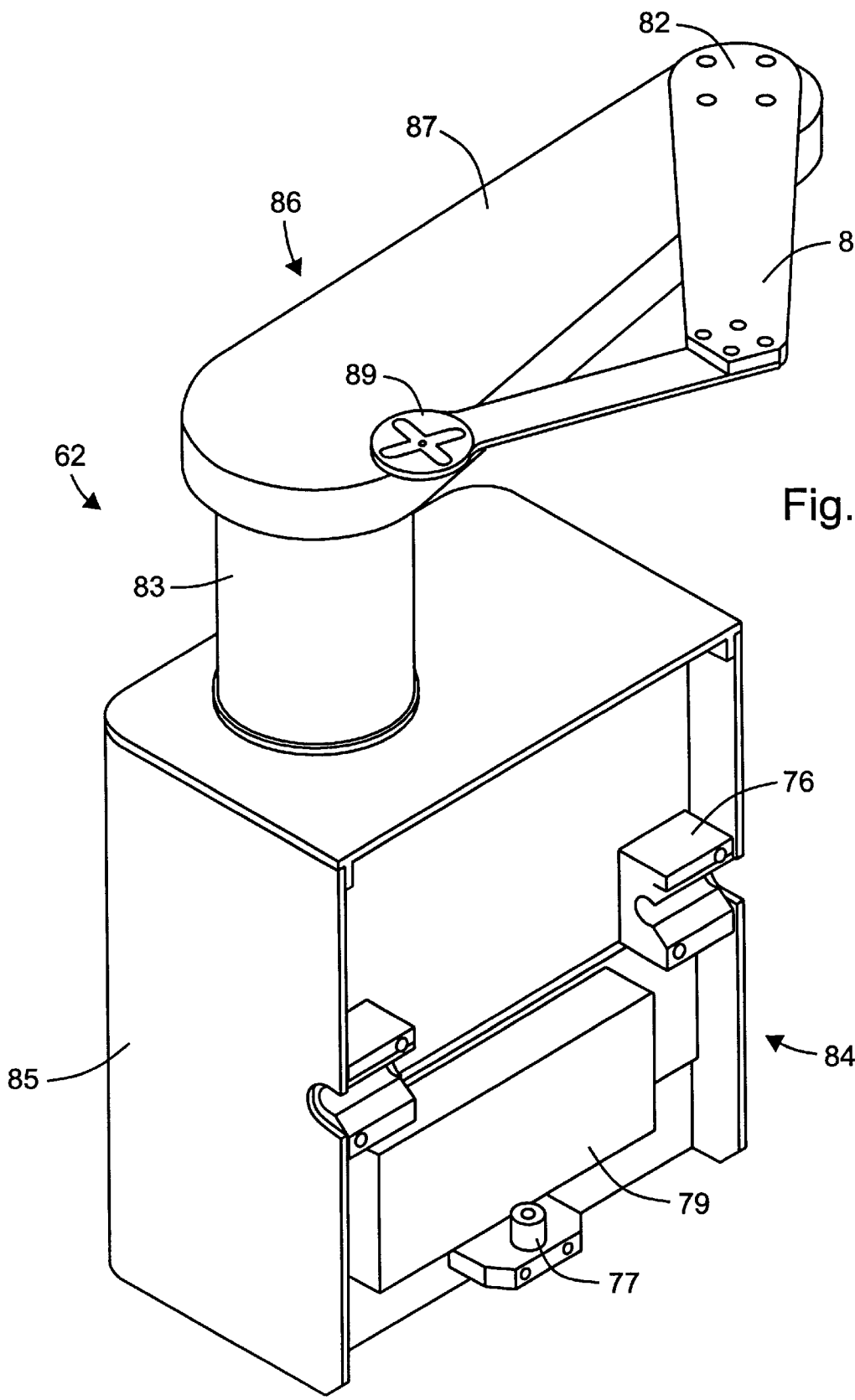

Referring to FIG. 18, a cover 85 surrounds the portion of tram 84 facing away from the transport unit guide 66. Tram 84 includes linear bearings 76 for engagement with respective guide rails 63, 64 mounted to transport unit guide 66. Linear bearings 76 maintain the tram 84 in a fixed relation with the transport unit guide 66 and permit axial movement of the tram 84 therealong. A roller 77 engages a respective extension 69 for preventing rotation of tram 84 about guide rail 63, 64 and providing stability of wafer transport unit 62. The electromagnet 79 is also shown connected with the tram 84 in such a position to magnetically interact with a respective transport unit 62, 64 drive actuator 71, 74.

A wafer transfer arm assembly 86 extends above the top of tram 84. The wafer transfer arm assembly 86 may include a first arm extension 87 coupled at a first end thereof with a shaft 83. A second arm extension 88 may be advantageously coupled with a second end of the first extension 87. The first arm extension 87 may rotate 360 degrees about shaft 83 and second arm extension 88 may rotate 360 degrees about axis 82 passing through a shaft connecting first and second arm extensions 87, 88.

Second extension 88 preferably includes a wafer support 89 at a distal end thereof for supporting a semiconductor wafer W during the transporting thereof along wafer conveyor 60. The transfer arm assembly 86 preferably includes a chamber coupled with the wafer support 89 for applying a vacuum thereto and holding a semiconductor wafer W thereon.

Providing adjustable elevation of transfer arm assembly 86, rotation of first arm extension 87 about the axis of shaft 83, and rotation of second extension 88 about axis 82 allows the transfer arm 86 to access each semiconductor wafer holder 810 of all processing modules 19 and each of the wafer cassettes 16 held by interface modules 38, 39 within the processing tool 10. Such access permits the semiconductor wafer transport units 62, 64 to transfer semiconductor wafers therebetween.

Figure 19:
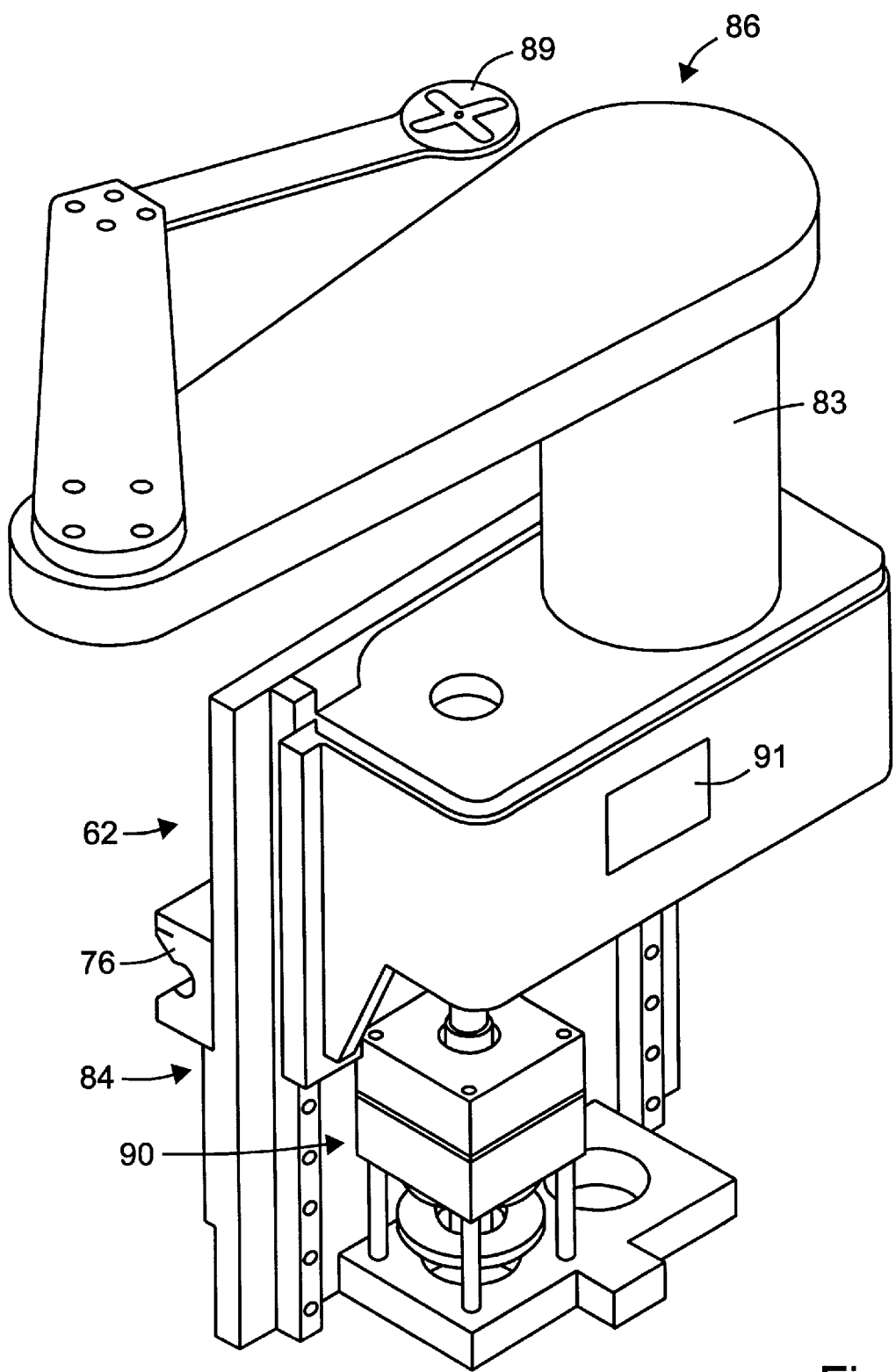
Figure 20:
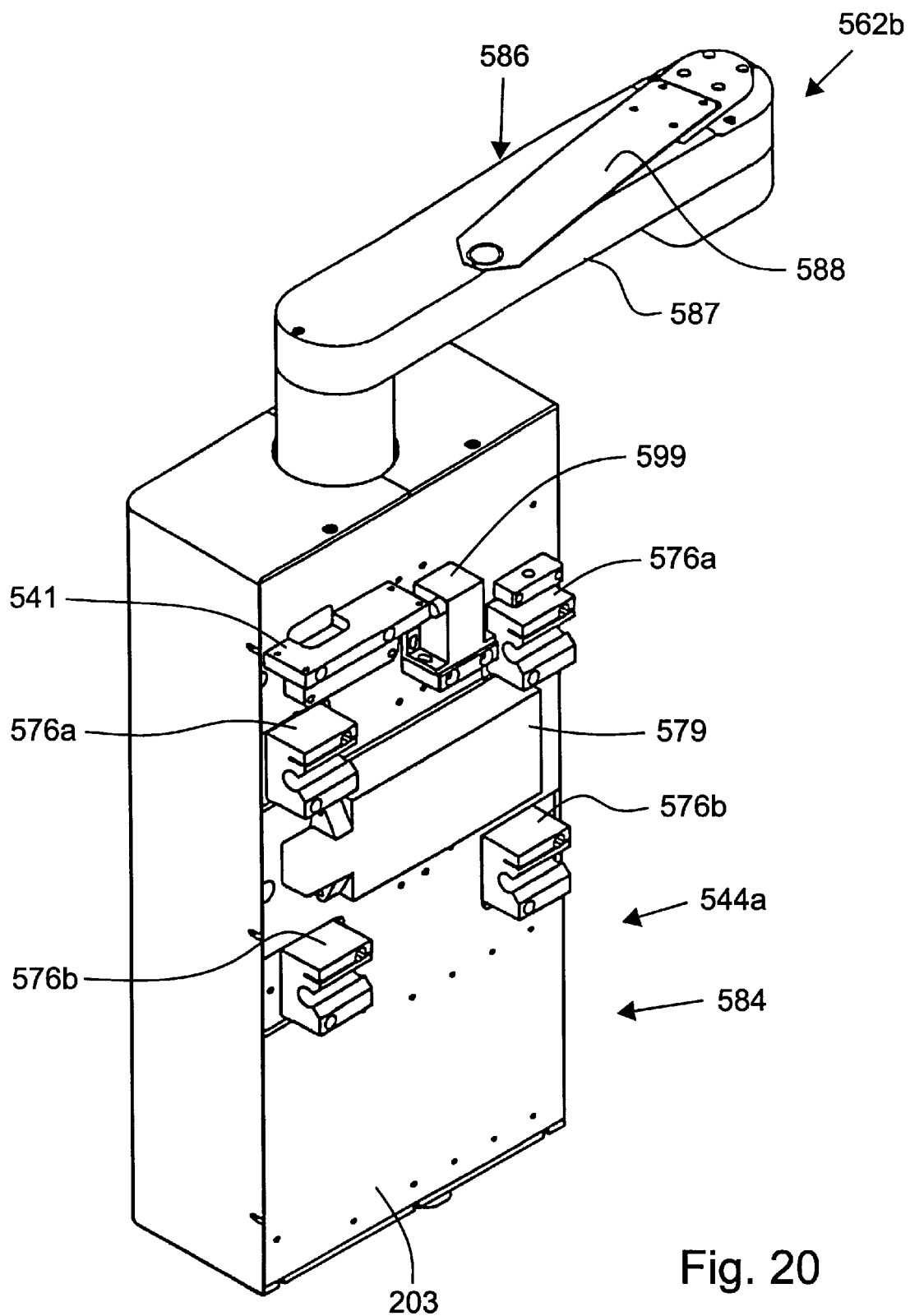
FIGS. 20–25 illustrate a further wafer conveying system in accordance with a further embodiment of the present invention.

The cover 85 has been removed from the wafer transport unit shown in FIG. 19 to reveal a wafer transfer arm elevator 90 coupled with tram 84 and transfer arm assembly 86. Transfer arm elevator 90 adjusts the vertical position of the transfer arm assembly 86 relative to the tram 84 during the steps of transferring a semiconductor wafer between the wafer support 89 and one of a wafer holder 810 and the wafer cassette 16.

The path position of the tram 84 of each wafer transport unit 62, 64 along the transport unit guide 66 is precisely controlled using a positional indicating array, such as a CCD array 91 of FIG. 19. In one embodiment of the processing tool 10, each semiconductor wafer holder 810 within a processing module 19 has a corresponding light or other beam emitter 81 mounted on a surface of the processing module 19 as shown in FIG. 2 for directing a beam of light toward the transport unit guide 66. The light emitter 81 may present a continuous beam or alternatively may be configured to generate the beam as a wafer transport unit 62, 64 approaches the respective wafer holder 810.

The transfer arm assembly 86 includes an CCD array 91 positioned to receive the laser beam generated by light emitter 81. A position indicating array 91 on shaft 83 detects the presence of the light beam to determine the location of tram 84 along transport unit guide 66. The positional accuracy of the wafer transport unit position indicator is preferably in the range less than 0.003 inch (approximately less than 0.1 millimeter).

A second embodiment of a wafer transport unit 562b is shown in FIGS. 20–25 and is similarly provided with a movable carriage or tram 584 coupled to a respective side of the transport unit guide 66, a wafer transfer arm assembly 586 movably connected to the tram 584 for supporting a semiconductor wafer W, and a wafer transfer arm elevator 590 for adjusting the elevation of the transfer arm assembly 586 relative to tram 584. A cover 585 surrounds a portion of tram 584. Tram 584 includes linear bearings 576 for engagement with respective guide rails 63, 64 mounted to transport unit guide 66. Linear bearings 576 maintain the tram 584 in a fixed relation with the transport unit guide 66 and permit axial movement of the tram 584 therealong. The electromagnet 579 magnetically interacts with the guide 66 to drive actuator 71, 74.

A wafer transfer arm assembly 586 extends above the top of tram 584. The wafer transfer arm assembly 586 includes a first arm extension 587 coupled at a first end thereof with a shaft 583. A second arm extension 588, having a wafer support 589 for supporting the semiconductor wafer W, may be advantageously coupled with a second end of the first extension 587. The first arm extension 587 may rotate 360 degrees about shaft 583 and second arm extension 588 may rotate 360 degrees about axis 582 passing through a shaft connecting first and second arm extensions 587, 588.

As with the first embodiment, providing adjustable elevation of transfer arm assembly 586, rotation of first arm extension 587 about the axis of shaft 583, and rotation of second extension 588 about axis 582 permits the semiconductor wafer transport units 562a, 562b to transfer semiconductor wafers therebetween.

Figure 21:
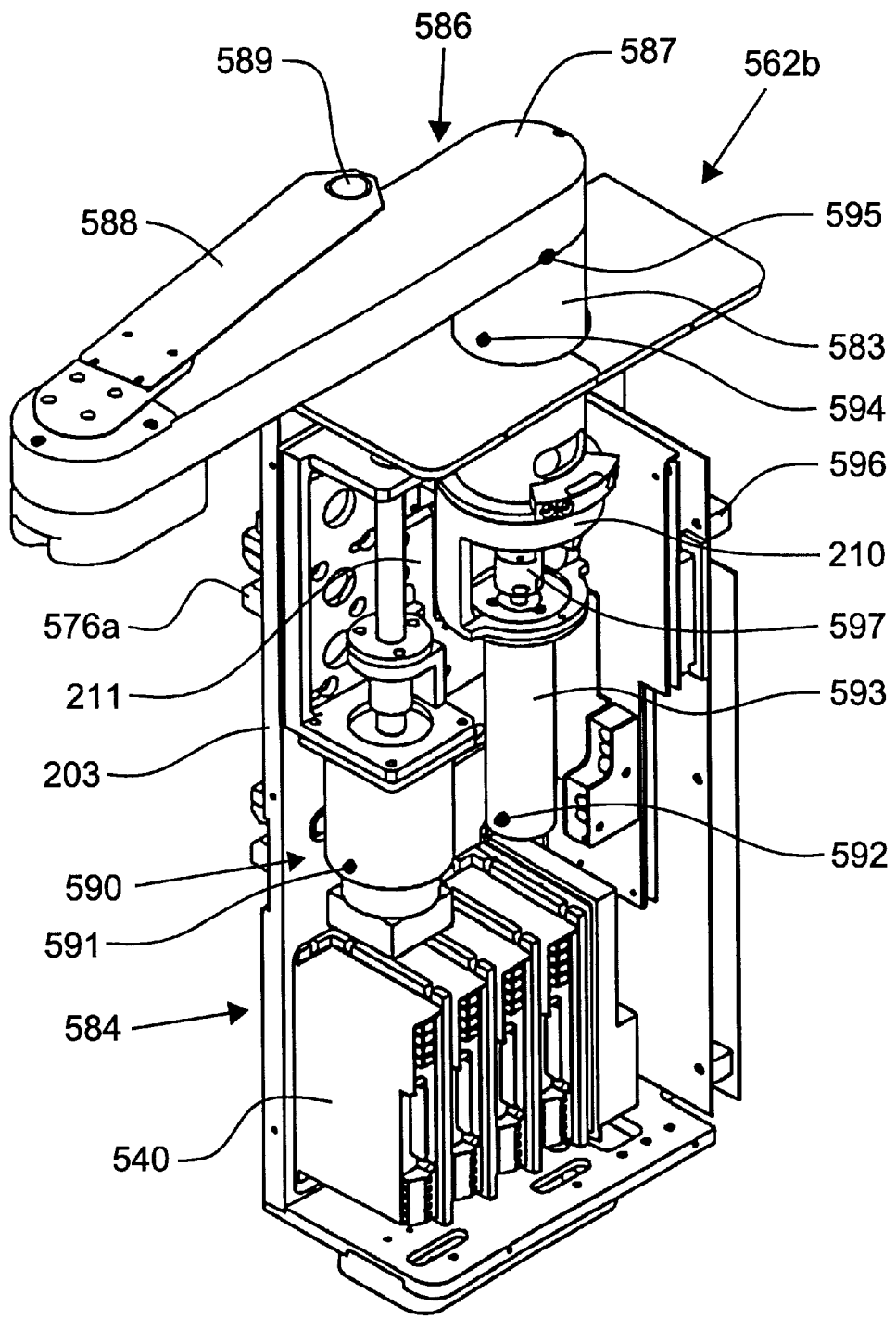

As shown in FIG. 21, cover 585 has been removed from the wafer transport unit 562b, revealing a wafer transfer arm elevator 590 coupled with tram 584 and transfer arm assembly 586. Transfer arm elevator 590 adjusts the vertical position of the transfer arm assembly 586 relative to the tram 584 during a transfer of a semiconductor wafer.

In the second embodiment of the wafer transport units 562a, 562b, a fiber optic communication path, such as a fiber optic filament, replaces wires 72, 73 to the wafer transport units through a digital-to-analog converter board 540 on each of the wafer transport units 562a, 562b. The use of fiber optics as opposed to wire harnesses lowers the inertial mass of the transport units 562a, 562b and improves reliability. One manner of implementing circuitry for such a fiber optic communication link and corresponding control at the transport units is set forth in the schematics of FIGS. 34–64. Preferably, such communications take place between the transfer unit and the system controller 875.

The path and operational position of the tram 584 of each wafer transport unit 562a, 562b along the transport unit guide 66 is precisely controlled using a combination of encoders to provide position information on the position of the tram 584, transfer arm assembly 586 and second extension 588 in three-axis space. An absolute encoder, the position of which is shown at 591, is located in the elevator 590. An absolute encoder, TPOW, is shown at 592, located in the base motor 593 of the shaft 583. An absolute encoder, TPOW, is shown at 594, located in the shaft 583. Wrist absolute encoder, the position of which is shown at 595, is located at the distal end of transfer arm assembly 586. An elbow absolute encoder, TPOWISA, 597 is provided at the base of the shaft 583. Lift absolute encoder 596 is located along the base motor 593. A linear encoder 598, head rail encoder 599 and track CDD array absolute encoder 541 are located on the base plate 203 of the base of tram 584, the latter located for sensing the beam emitter 81 mounted on a surface of the processing module 19 as shown in FIG. 2 and discussed above. The foregoing allows precise and reliable positional accuracy.

Figure 22:
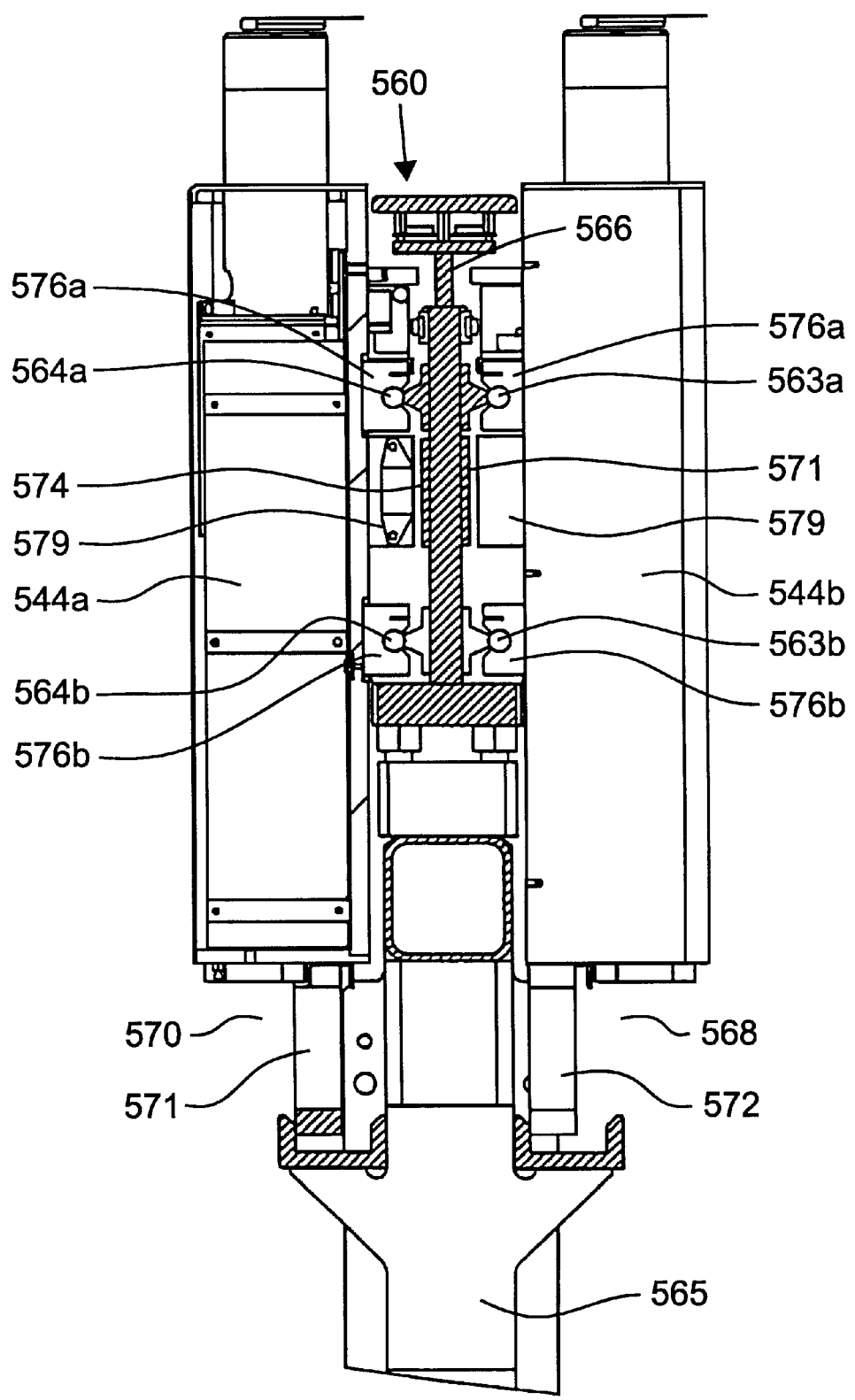

Mounting of the wafer transport units is shown in FIG. 22. As illustrated, a wafer conveyor 560 includes a wafer transport unit guide 566 which comprises an elongated spine or rail mounted to frame 565. Wafer transport unit guide 566 defines the paths of movement 568, 570 of wafer transport units 544*a*, 544*b*. A spine of transport unit guide 566 includes upper guide rails 563*a*, 564*a* and lower guide rails 563*b*, 564*b* mounted on opposite sides thereof. Each semiconductor wafer transport unit 544*a*, 544*b* preferably engages each of the respective upper guide rails 563*a*, 564*a* and lower guide rails 563*b*, 564*b*. Each of the pair of upper and lower guide rails can mount one or more transport units 544*a*, 544*b*.

Each wafer transport unit 544*a*, 544*b* is also powered along the respective path 568, 570 by drive operators 571, 574 mounted to respective sides of transport unit guide 66 to provide controllable axial movement of wafer transport units 544*a*, 544*b* along the transport unit guide 566. The drive operators 571, 574 may be linear magnetic motors for providing precise positioning of wafer transport units 544*a*, 544*b* along guide 566, and are again preferably linear brushless direct current motors utilizing a series of angled magnetic segments which magnetically interact with a respective electromagnet 579 mounted on each of the wafer transport units 544*a*, 544*b* to propel the units along the transport unit guide 566.

Fiber optic cable guards 572, 573 provide communication with the respective wafer transport units 544*a*, 544*b* and protect fiber optic cables located therein. Cable guards 572, 573 may comprise a plurality of interconnected segments to permit a full range of motion of wafer transport units 544*a*, 544*b* along transport unit guide 566.

As shown in FIG. 22, wafer transport units 544*a*, 544*b* are coupled along each side of the spine of guide 566. Each wafer transport unit 544*a*, 544*b* includes an upper linear bearing 576*a* for engagement with upper linear guide rails 563*a*, 564*a*, respectively. Further, each wafer transport units 544*a*, 544*b* includes a lower linear bearing 576*b* engaging the lower linear guide rails 563*b*, 564*b*, providing stability and more equal distribution of the weight loads upon the rails.

Figure 23:
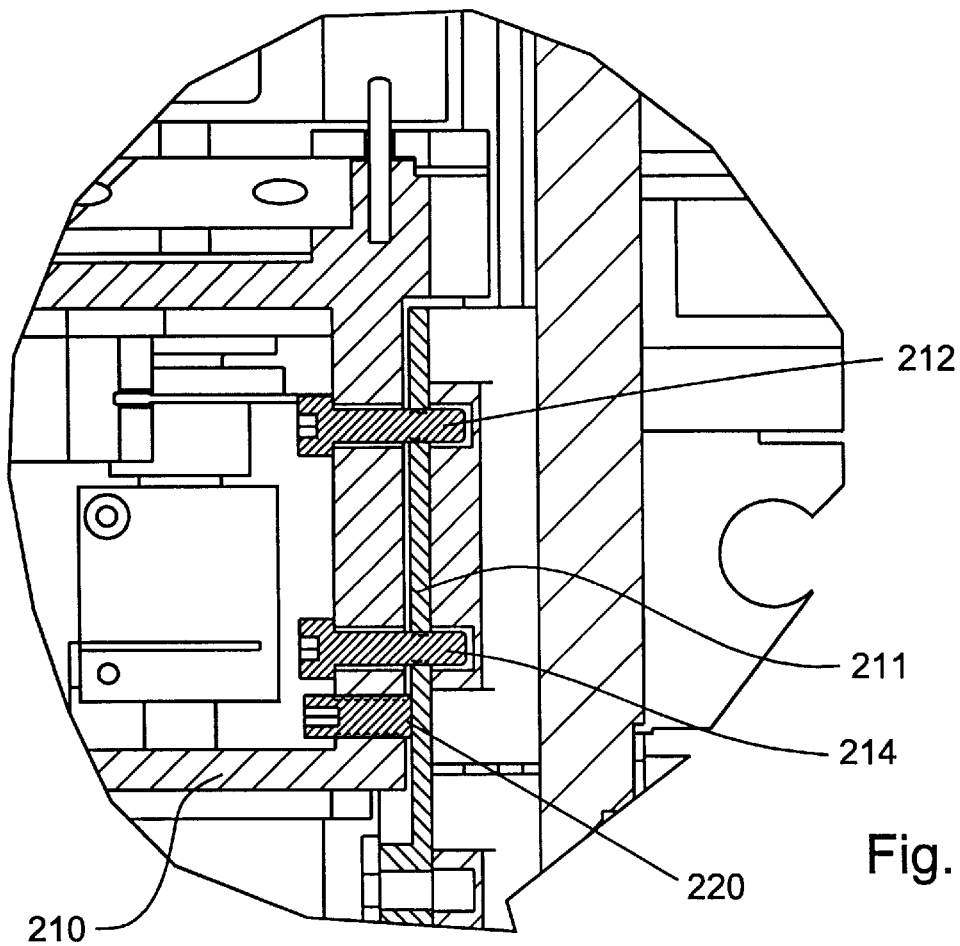
Figure 24:
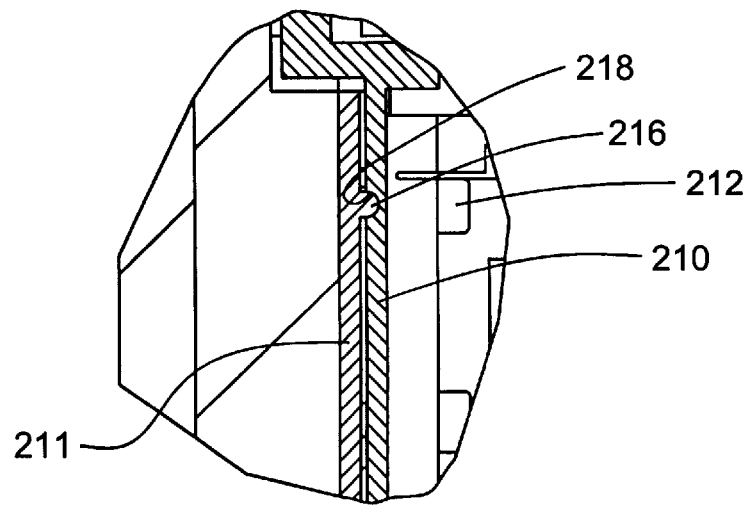
Figure 25:
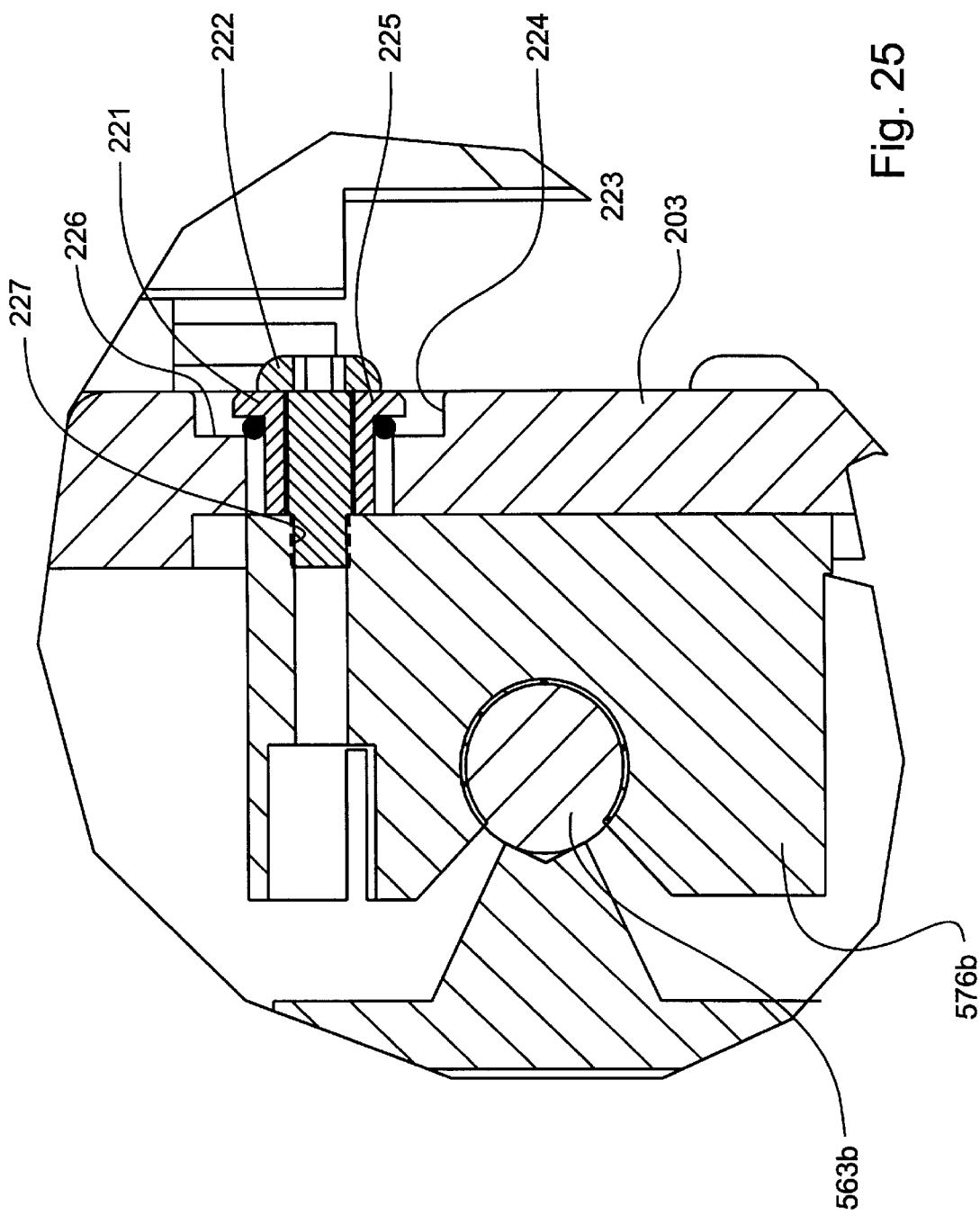

With reference to FIGS. 22–24, the upper and lower linear bearing 576*a*, 576*b* also provides a means by which the vertical axis of the wafer transfer arm assembly 586 extending above the top of tram 584 may be adjusted. It is important that the transfer arm assembly 586 rotate in a plane as close as possible to the absolute horizontal plane during the transfer of wafers within the processing tool 10. To this end, the lower elbow housing 210 of the transfer arm assembly, shown in FIG. 25, mounted to the base plate 203 of the transport unit 544*a* is provided with a tilt adjustment.

Figure 26:
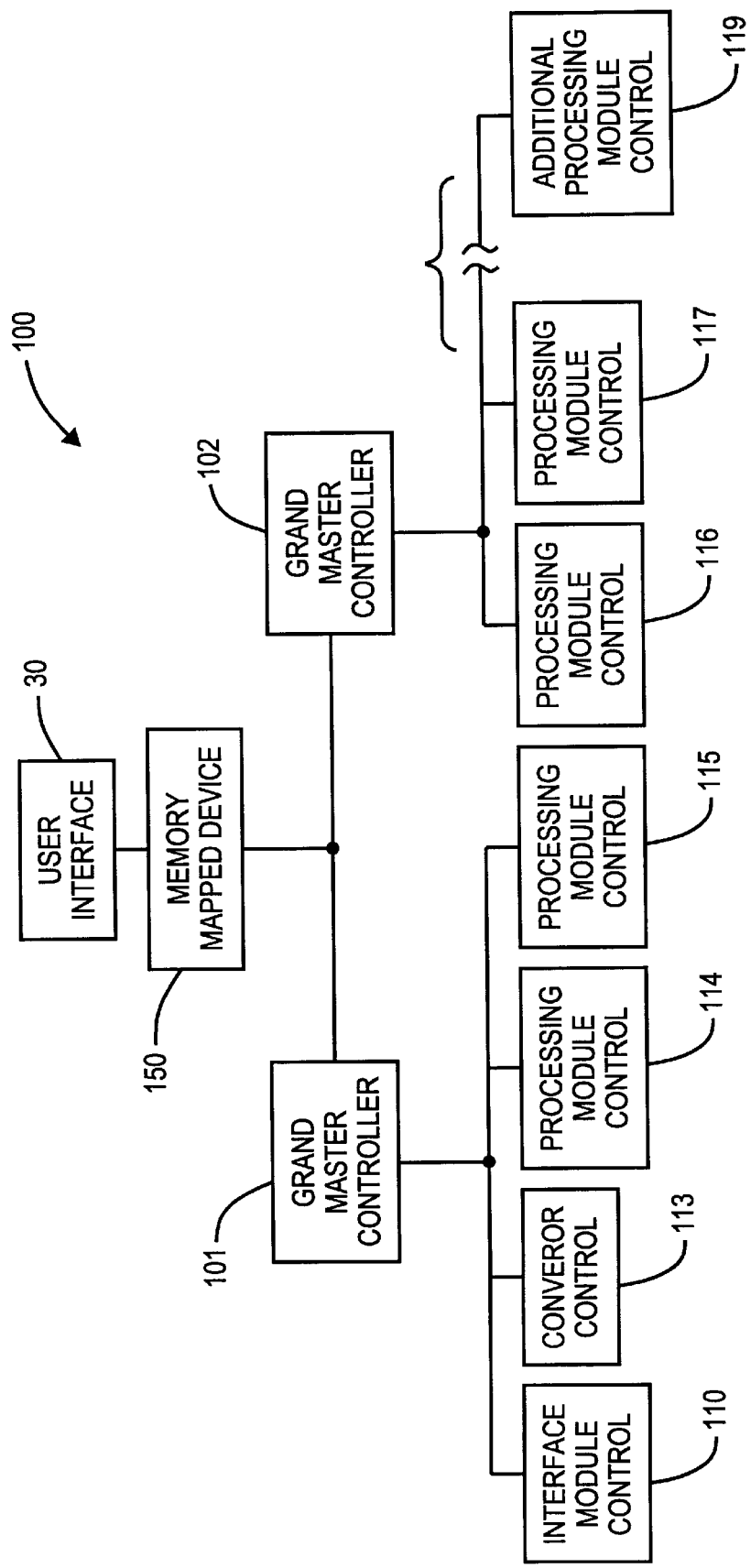
FIG. 26 is a functional block diagram of an embodiment of a control system of the semiconductor wafer processing tool.

The lower elbow housing 210 is mounted to a base plate 211, as seen in FIGS. 21, 23 and 24 through upper mounting screws 212 and lower mounting screws 214. The base plate 211 is in turn fastened to the elevator motor 590 to raise or lower the transfer arm assembly 586, better seen in FIG. 25. As seen in FIG. 26, positioned laterally between the upper mounting screws 212 are embossed pivots 216 on the base plate 211 that engage a corresponding, yet slightly smaller, lateral groove 218 on the lower elbow housing 210. The pivots 216 are preferably sized, relative the lateral groove 218 to provide a clearance between the base plate 211 and the lower elbow housing 210 so that about 0.95 degrees of tilt is available between the two. In combination with one or more leveling screws 220 and the upper and lower mounting screws 212, 214, the angular orientation of the lower elbow housing 210, and the attached transfer arm assembly 586, can be adjusted and fixed to provide rotation of the transfer arm assembly 586 as close as possible within the absolute horizontal plane during the transfer of wafers within the processing tool 10.

Figure 28:
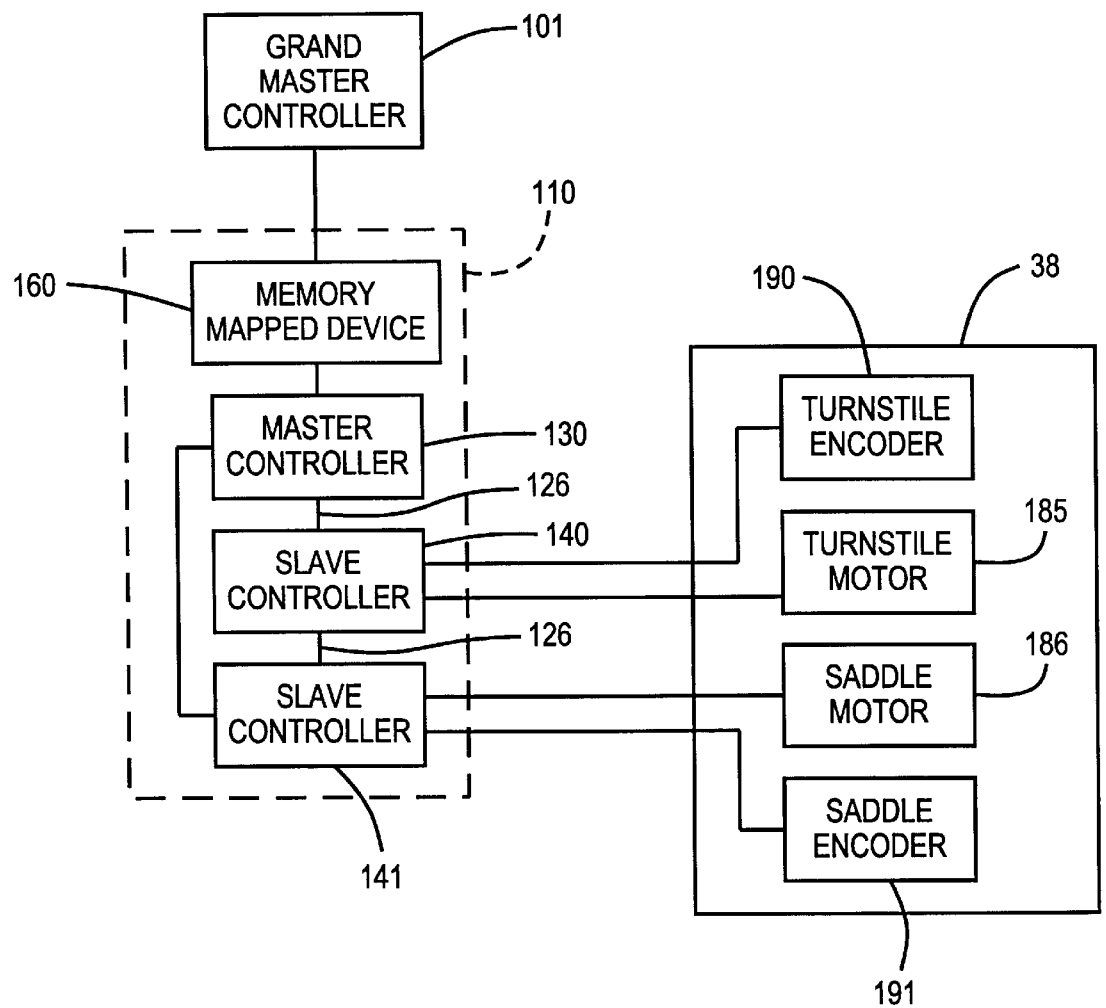
FIG. 28 is a functional block diagram of an interface module control subsystem coupled with components of a wafer cassette interface module of the processing tool.

Also, compliant attachment of the lower linear bearing guides 576*b* is important to smooth operation of the wafer transport unit 544*a*, 544*b* along the guide 566. Providing such compliant attachment, preferably allowing 0.100 inch of float, at the lower gearing guides 576*b* is obtained by use of a compliant fastening technique. A float pin 221 is positioned about mounting screw 222, with an O-ring 223, preferably VITON, positioned about the float pin. When installed within shouldered counterbore 224 of the base plate 203 into tapped hole 227 of lower bearing guide 576*b*, as shown in FIG. 28, the screw 222 bears against a flange 225 of the float pin 221, which in turn bears against the O-ring 223. The O-ring 223 then bears against the shoulder 226 of the counterbore. However, even when the screw 222 is tightened, relative motion is allowed between the lower bearing guide 576*b* and the base plate 203 to facilitate smooth motion over the entire guide 566.

CONTROL SYSTEM

Referring to FIG. 26, there is shown one embodiment of the control system 100 of the semiconductor wafer processing tool 10. As illustrated, the control system 100 generally includes at least one grand master controller 101 for controlling and/or monitoring the overall function of the processing tool 10.

The control system 100 is preferably arranged in a hierarchial configuration. The grand master controller 101 includes a processor electrically coupled with a plurality of subsystem control units as shown in FIG. 26. The control subsystems preferably control and monitor the operation of components of the corresponding apparatus (i.e., wafer conveyor 60, processing modules 20, 22, 24, interface modules 38, 39, etc.). The control subsystems are preferably configured to receive instructional commands or operation instructions such as software code from a respective grand master control 101, 102. The control subsystems 110, 113–119 preferably provide process and status information to respective grand master controllers 101, 102.

More specifically, the grand master control 101 is coupled with an interface module control 110 which may control each of the semiconductor wafer interface modules 38, 39. Further, grand master control 101 is coupled with a conveyor control 113 for controlling operations of the wafer conveyor 60 and a plurality of processing module controls 114, 115 corresponding to semiconductor wafer processing modules 20, 22 within the processing tool 10. The control system 100 of the processing tool 10 according to the present disclosure may include additional grand master controllers 102 as shown in FIG. 26 for monitoring or operating additional subsystems, such as additional wafer processing modules via additional processing module control 119. Four control subsystems may be preferably coupled with each grand master controller 101, 102. The grand master controllers 101, 102 are preferably coupled together and each may transfer process data to the other.

Each grand master controller 101, 102 receives and transmits data to the respective modular control subsystems 110–119. In a preferred embodiment of the control system 100, a bidirectional memory mapped device is provided intermediate the grand master controller and each modular subsystem connected thereto. In particular, memory mapped devices 160, 161, 162 are provided intermediate the grand master controller 101 and master controllers 130, 131, 132 within respective interface module control 110, wafer conveyor control 113 and processing module control 114.

Each memory mapped device 150, 160–162 within the control system 100 is preferably a dual port RAM provided by Cypress for a synchronously storing data. In particular, grand master controller 101 may write data to a memory location corresponding to master controller 130 and master controller 130 may simultaneously read the data. Alternatively, grand master controller 101 may read data from mapped memory device being written by the master controller 130. Utilizing memory mapped devices 160–161 provides data transfer at processor speeds. Memory mapped device 150 is preferably provided intermediate user interface 30 and the grand master controllers 101, 102 for transferring data therebetween.

A user interface 30 is preferably coupled with each of the grand master controllers 101, 102. The user interface 30 may be advantageously mounted on the exterior of the processing tool 10 or at a remote location to provide an operator with processing and status information of the processing tool 10. Additionally, an operator may input control sequences and processing directives for the processing tool 10 via user interface 30. The user interface 30 is preferably supported by a general purpose computer within the processing tool 10. The general purpose computer preferably includes a 486 100 MHz processor, but other processors may be utilized.

Each modular control subsystem, including interface module control 110, wafer conveyor control 113 and each processing module control 114–119, is preferably configured in a master/slave arrangement. The modular control subsystems 110, 113–119 are preferably housed within the respective module such as wafer interface module 38, 39, wafer conveyor 60, or each of the processing modules 20, 22, 24. The grand master controller 101 and corresponding master controllers 130, 131, 132 coupled therewith are preferably embodied on a printed circuit board or ISA board mounted within the general purpose computer supporting user interface 30. Each grand master controller 101, 102 preferably includes a 68EC000 processor provided by Motorola and each master controller 130 and slave controller within control system 100 preferably includes a 80251 processor provided by Intel.

Each master controller 130, 131, 132 is coupled with its respective slave controllers via a data link 126, 127, 129 as shown in FIG. 27–FIG. 30. Each data link 126, 127, 129 preferably comprises an optical data medium such as Optilink provided by Hewlett Packard. However, data links 126, 127, 129 may comprise alternate data transfer media.

Figure 27:
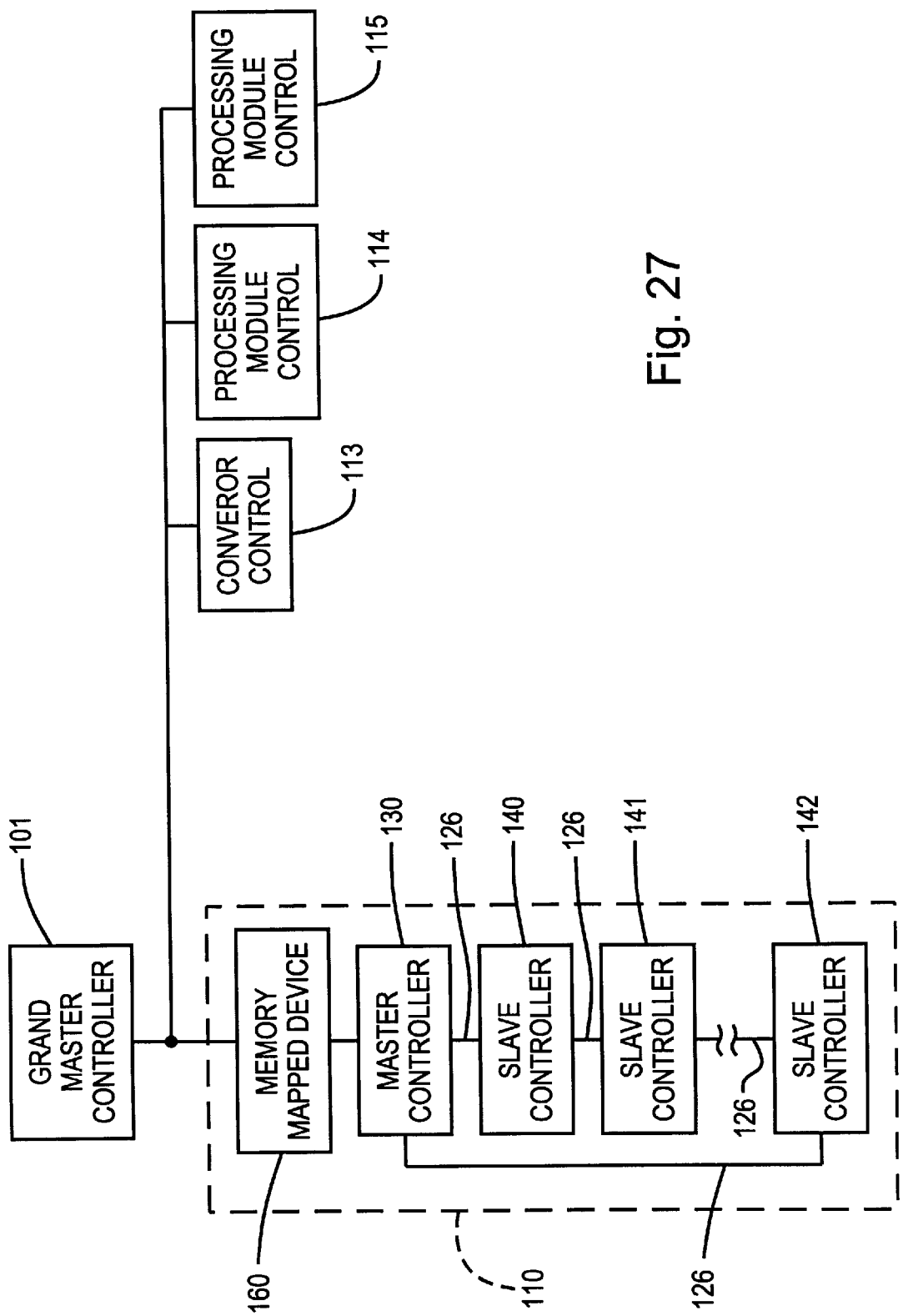
FIG. 27 is a functional block diagram of a master/slave control configuration of an interface module control subsystem for controlling a wafer cassette interface module.

Referring to FIG. 27, the master/slave control subsystem for the interface module control 110 is illustrated. Each master and related slave configuration preferably corresponds to a single module (i.e., interface, conveyor, processing) within the processing tool 10. However, one master may control or monitor a plurality of modules. The master/slave configuration depicted in FIG. 27 and corresponding to the interface module control 110 may additionally apply to the other modular control subsystems 113, 114, 115.

The grand master controller 101 is connected via memory mapped device 160 to a master controller 130 within the corresponding interface module control 110. The master controller 130 is coupled with a plurality of slave controllers 140, 141, 142. Sixteen slave controllers may be preferably coupled with a single master controller 130–132 and each slave controller may be configured to control and monitor a single motor or process component, or a plurality of motors and process components.

The control system 100 of the processing tool 10 preferably utilizes flash memory. More specifically, the operation instructions or program code for operating each master controller 130–132 and slave controller 140–147 within the control system 100 may be advantageously stored within the memory of the corresponding grand master controller 101, 102. Upon powering up, the grand master controller 101, 102 may poll the corresponding master controllers 130–132 and download the appropriate operation instruction program to operate each master controller 130–132. Similarly, each master controller 130–132 may poll respective slave controllers 140–147 for identification. Thereafter, the master controller 130–132 may initiate downloading of the appropriate program from the grand master controller 101, 102 to the respective slave controller 140–147 via the master controller 130–132.

Each slave controller may be configured to control and monitor a single motor or a plurality of motors within a corresponding processing module 19, interface module 38, 39 and wafer conveyor 60. In addition, each slave controller 140–147 may be configured to monitor and control process components 184 within a respective module 19. Any one slave controller, such as slave controller 145 shown in FIG. 36, may be configured to control and/or monitor servo motors and process components 184.

Each slave controller includes a slave processor which is coupled with a plurality of port interfaces. Each port interface may be utilized for control and/or monitoring of servo motors and process components 184. For example, a port may be coupled with a servo controller card 176 which is configured to operate a wafer transfer unit 62a, 62b. The slave processor 171 may operate the wafer transfer unit 62a, 62b via the port and servo controller 176. More specifically, the slave processor 171 may operate servo motors within the wafer transfer unit 62a, 62b and monitor the state of the motor through the servo controller 176.

Figure 32:
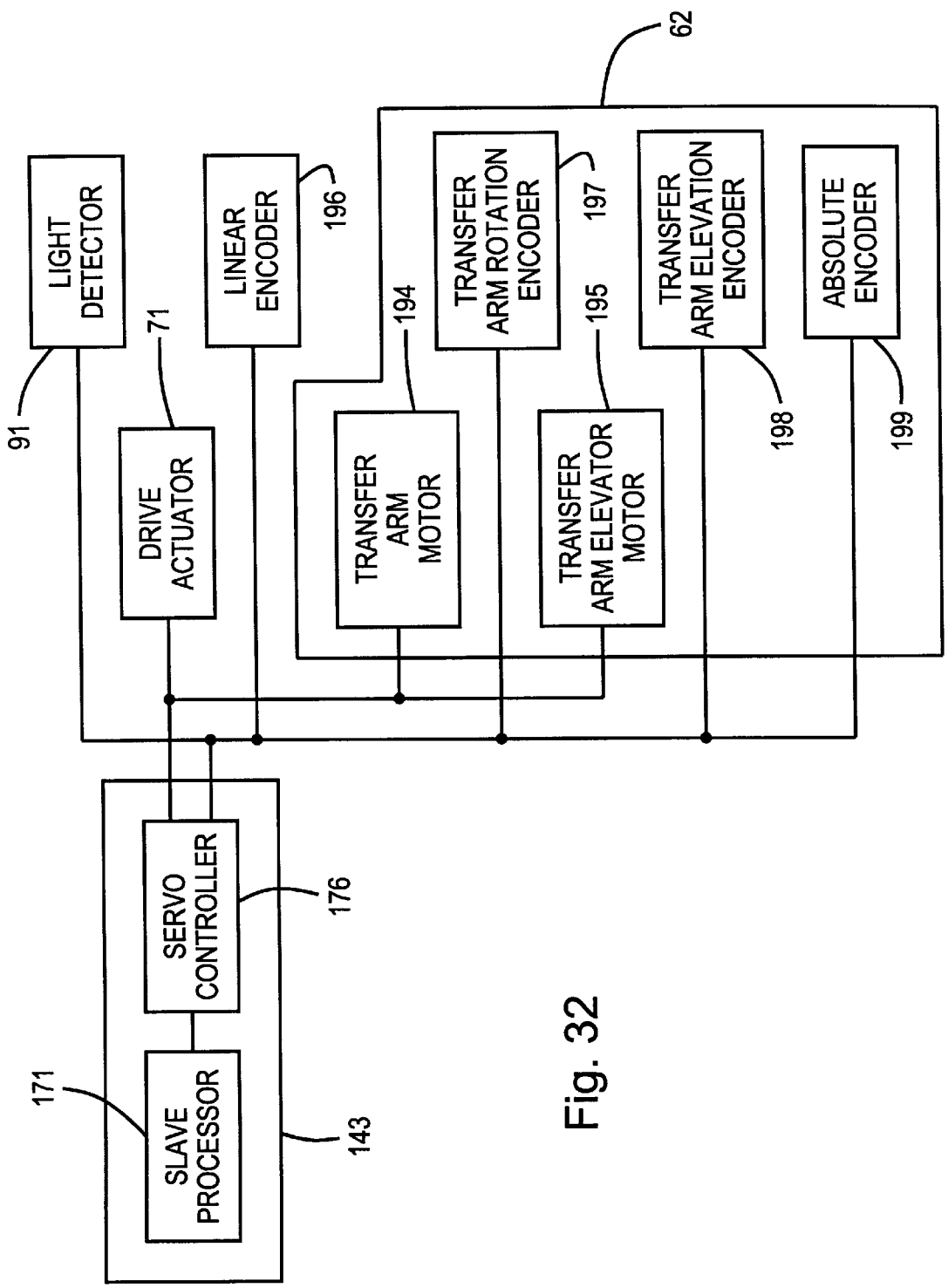
FIG. 32 is a functional block diagram of a slave processor of the wafer conveyor control subsystem coupled with components of a wafer conveyor of the processing tool.

Alternatively, different slave controllers 140, 141 may operate different components within a single processing tool device, such as interface module 38. More specifically, the interface module control 110 and components of the interface module 38 are depicted in FIG. 32. Slave controller 140 may operate turnstile motor 185 and monitor the position of the turnstile 40 via incremental turnstile encoder 190. Slave controller 140 is preferably coupled with the turnstile motor 185 and turnstile encoder 190 via a servo control card (shown in FIG. 35). Slave controller 141 may operate and monitor saddle 45 of the turnstile 40 by controlling saddle motor 186 and monitoring saddle encoder 191 via a servo control card.

A port of a slave processor may be coupled with an interface controller card 180 for controlling and monitoring process components within a respective processing module 19. For example, a flow sensor 657 may provide flow information of the delivery of processing fluid to a processing bowl within the module. The interface controller 180 is configured to translate the data provided by the flow sensors 657 or other process components into a form which may be analyzed by the corresponding slave processor 172. Further, the interface controller 180 may operate a process component, such as a flow controller 658, responsive to commands from the corresponding slave processor 172.

One slave controller 140–147 may contain one or more servo controller and one or more interface controller coupled with respective ports of the slave processor 170–172 for permitting control and monitor capabilities of various component motors and processing components from a single slave controller.

Alternatively, a servo controller and interface controller may each contain an onboard processor for improving the speed of processing and operation. Data provided by an encoder or process component to the servo controller or interface controller may be immediately processed by the on board processor which may also control a respective servo motor or processing component responsive to the data. In such a configuration, the slave processor may transfer the data from the interface processor or servo controller processor to the respective master controller and grand master controller.

CONVEYOR CONTROL SUBSYSTEM

Figure 29:
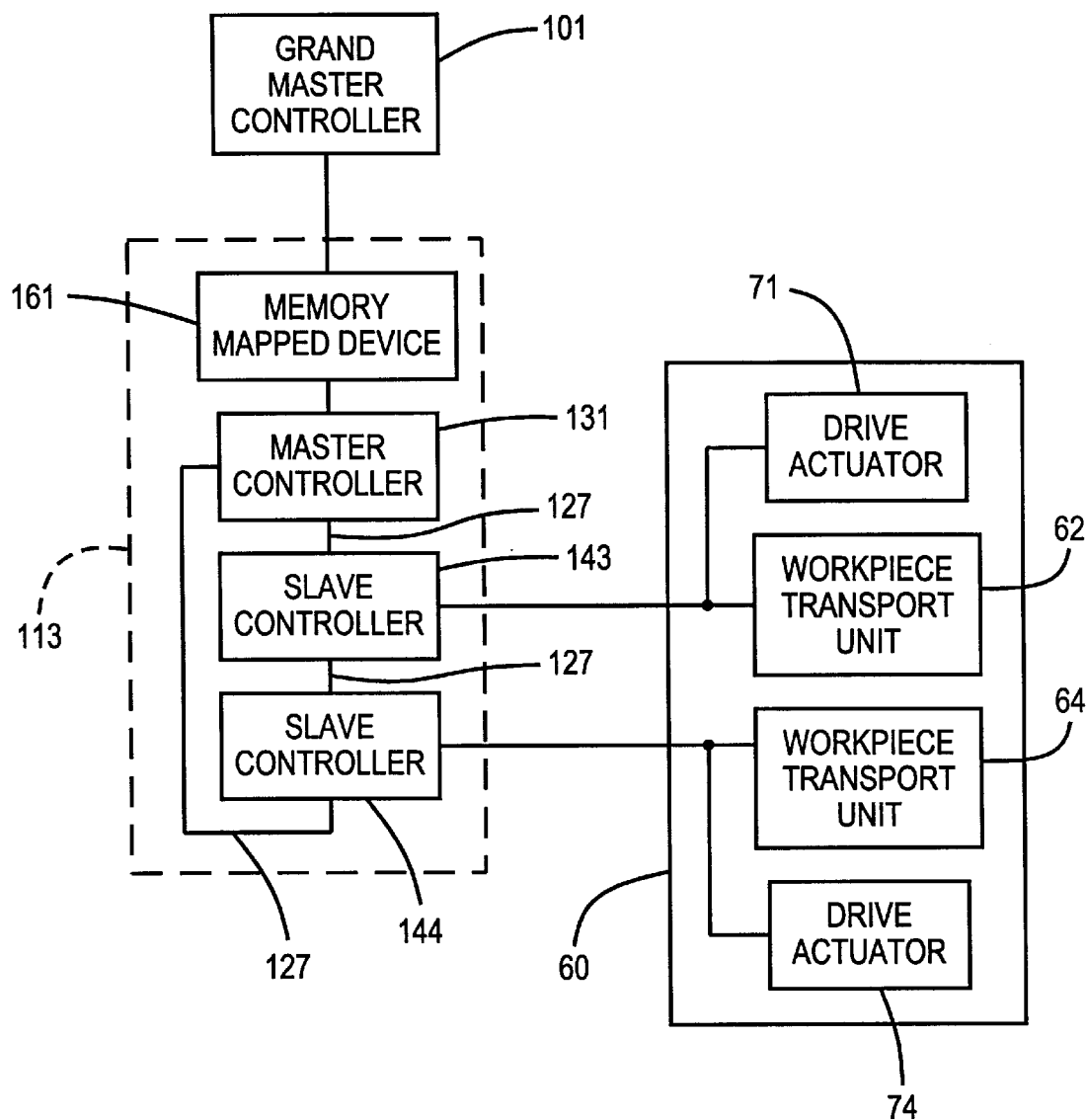
FIG. 29 is a functional block diagram of a wafer conveyor control subsystem coupled with components of a wafer conveyor of the processing tool.

The conveyor control subsystem 113 for controlling and monitoring the operation of the wafer conveyor 60 and the wafer transport units 62a, 62b or 562a, 562b or 544a, 544b therein is shown in FIG. 29. In general, a slave controller 143 of conveyor control 113 is coupled with drive actuator 71 for controllably moving and monitoring a wafer transport unit 62a along the guide 66. Further, slave controller 143 may operate transfer arm assembly 86 of the wafer transport unit 62a or 562a or 544a and the transferring of semiconductor wafers thereby. Similarly, slave controller 144 may be configured to operate wafer transport unit 62b or 562b or 544b and drive actuator 74.

Figure 36:
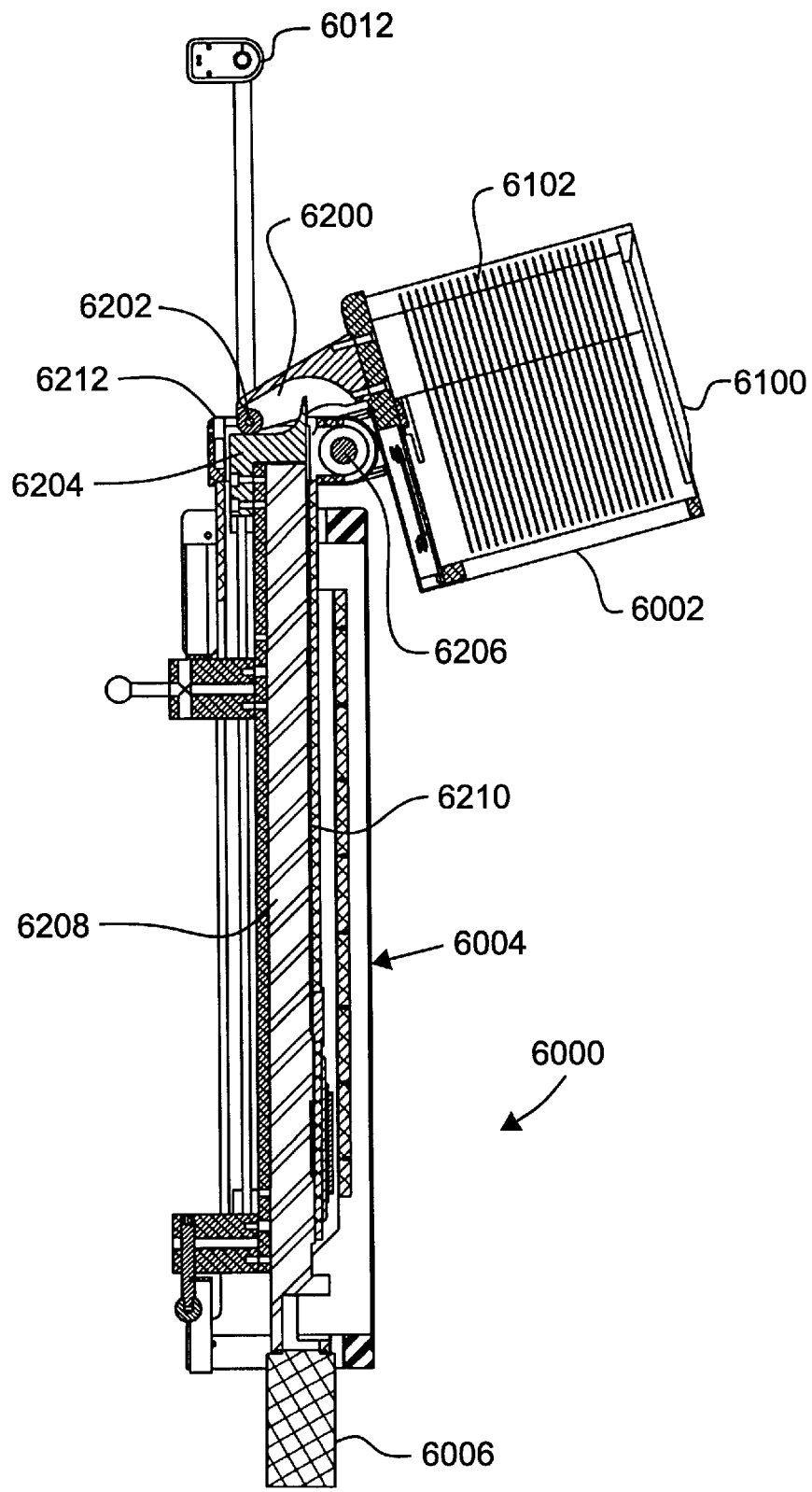
FIGS. 36–38 show section views of a lift/tilt assembly with the linear guide/actuator located at three translational locations.

The interfacing of slave controller 143 and light detector 91, drive actuator 71, linear encoder 196 and wafer transport unit 62a is shown in detail in FIG. 36. The slave processor 171 of slave controller 143 is preferably coupled with a servo controller 176. Slave processor 171 may control the linear position of wafer transport unit 62a by operating drive actuator 71 via servo controller 176. Light detector 91 may provide linear position information of the wafer transport unit 62a along guide 66. Additionally, a linear encoder 196 may also be utilized for precisely monitoring the position of wafer transport unit 62 along guide 66.

The conveyor slave processor 171 may also control and monitor the operation of the transfer arm assembly 86 of the corresponding wafer transport unit 62a.

Specifically, the conveyor processor 171 may be coupled with a transfer arm motor 194 within shaft 83 for controllably rotating the first and second arm extensions 87, 88. An incremental transfer arm rotation encoder 197 may be provided within the shaft 83 of each wafer transport unit 62a for monitoring the rotation of transfer arm assembly 86 and providing rotation data thereof to servo controller 176 and slave processor 171.

Slave controller 143 may be advantageously coupled with transfer arm elevation motor 195 within elevator 90 for controlling the elevational position of the transfer arm assembly 86. An incremental transfer arm elevation encoder 198 may be provided within the transfer arm elevator assembly 90 for monitoring the elevation of the transfer arm assembly 86.

In addition, conveyor slave controller 143 may be coupled with an air supply control valve actuator (not shown) via an interface controller for controlling a vacuum within wafer support 89 for selectively supporting a semiconductor wafer thereon.

Absolute encoders 199 may be provided within the wafer conveyor 60, interface modules 38, 39 and processing modules 19 to detect extreme conditions of operation and protect servo motors therein. For example, absolute encoder 199 may detect a condition where the transfer arm assembly 86 has reached a maximum height and absolute encoder 199 may turn off elevator 90 to protect transfer arm elevator motor 195.

A similar approach may be used for the fiber optic signal communication system of the second and third embodiments of the wafer transfer units 562a, 562b and 544a, 544b, respectively. Particular, encoder 591 located in the elevator 590, encoder 592 located in the base motor 593 of the shaft 583, encoder 594 located in the shaft 583, wrist absolute encoder 595 located at the distal end of transfer arm assembly 586 and elbow absolute encoder 597 located at the base of the shaft 583 provide the rotational input of rotational encoder 193 of FIG. 35. Likewise, lift absolute encoder 596 located along the base motor 593, linear encoder 598, head rail encoder 599 and track CDD array absolute encoder 541 provide inputs for the lift encoder 192 and absolute encoder 199 of FIG. 35, respectively.

PROCESSING MODULE CONTROL

The control system 100 preferably includes a processing module control subsystem 114–116 corresponding to each wafer processing module 20, 22, 24 within the processing tool 10 according to the present disclosure. The control system 100 may also include additional processing module control subsystem 119 for controlling and/or monitoring additional wafer processing modules 19.

Respective processing module controls 114, 115, 116 may control and monitor the transferring of semiconductor wafers W between a corresponding wafer holder 810 and wafer transport unit 62a, 62b or 562a, 562b or 544a, 544b. Further, processing module controls 114, 115, 116 may advantageously control and/or monitor the processing of the semiconductor wafers W within each processing module 20, 22, 24.

Figure 30:
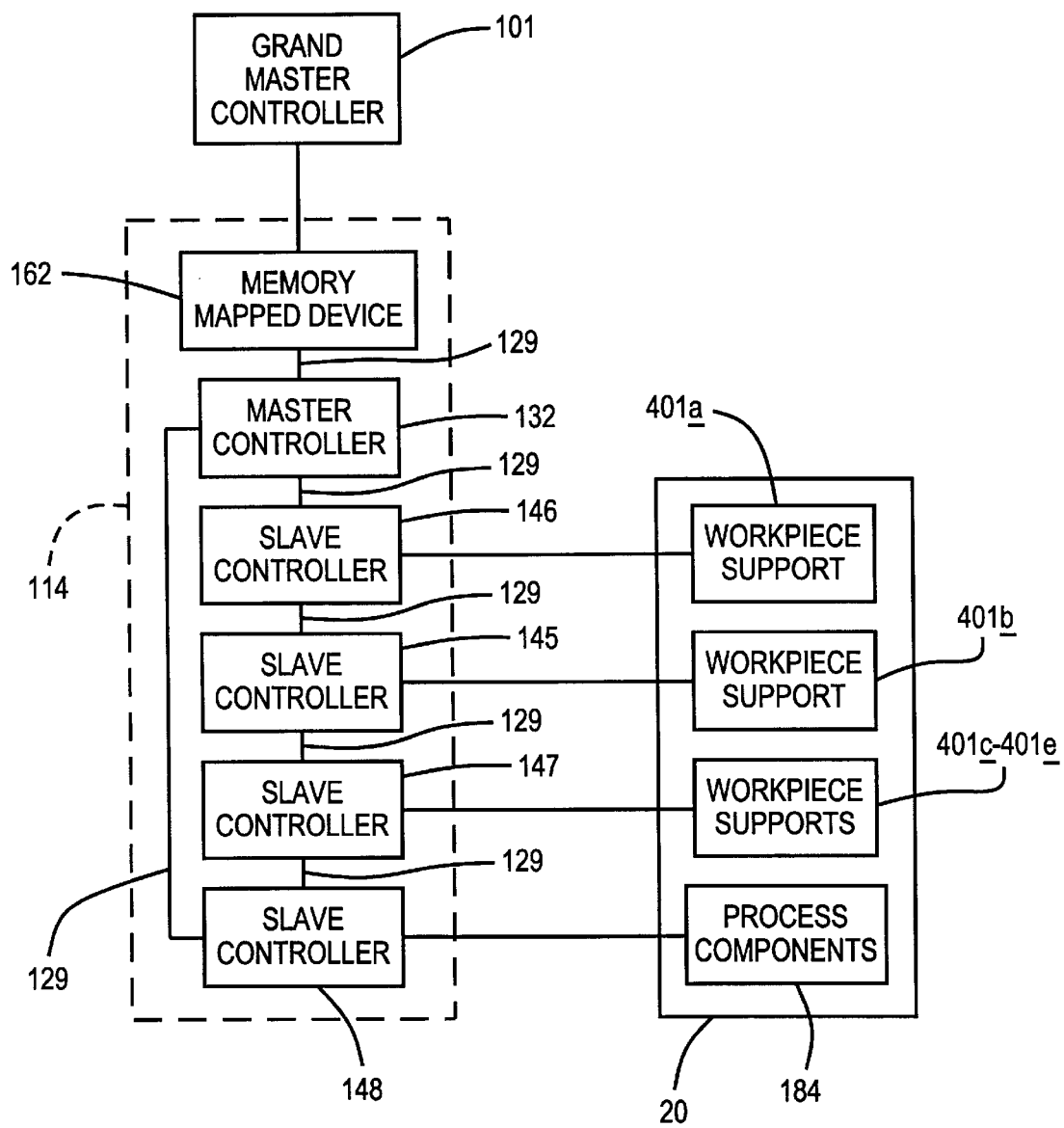
FIG. 30 is a functional block diagram of a wafer processing module control subsystem coupled with components of a wafer processing module of the processing tool.
Figure 37:
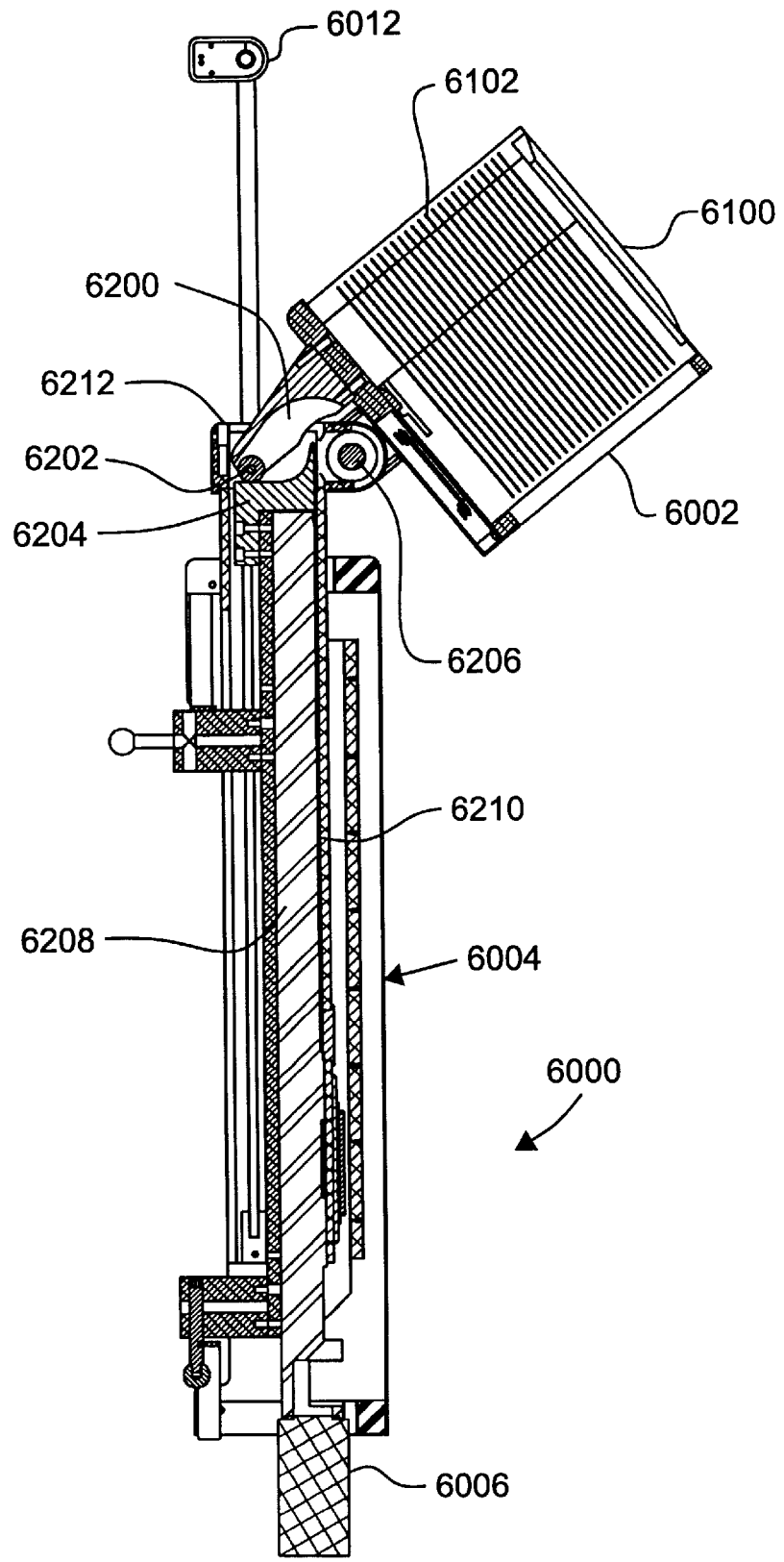

Referring to FIG. 30, a single slave controller 147 may operate a plurality of wafer holders 401c–401e within a processing module 20. Alternatively, a single slave controller 145, 146 may operate and monitor a single respective wafer holder 401a, 401b. An additional slave controller 148 may be utilized to operate and monitor all process components 184 (i.e., flow sensors, valve actuators, heaters, temperature sensors) within a single processing module 19. Further, as shown in FIG. 37, a single slave controller 145 may operate and monitor a wafer holder 410 and process components 184.

In addition, a single slave controller 145–148 may be configured to operate and monitor one or more wafer holder 401 and processing components 184. The interfacing of a slave controller 145 to both a wafer holder 401 and process components are shown in the control system embodiment in FIG. 37. In particular, a servo controller 177 and interface controller 180 may be coupled with respective ports connected to slave processor 172 of slave controller 145. Slave processor 172 may operate and monitor a plurality of wafer holder components via servo controller 177. In particular, slave processor 172 may operate lift motor 427 for raising operator arm 407 about lift drive shaft 456. An incremental lift motion encoder 455 may be provided within a wafer holder 401 to provide rotational information of lift arm 407 to the respective slave processor 172 or a processor within servo controller 177. Slave processor 172 may also control a rotate motor 428 within wafer holder 401 for rotating a processing head 406 about shafts 429, 430 between a process position and a semiconductor wafer transfer position. Incremental rotate encoder 435 may provide rotational information regarding the processing head 406 to the corresponding slave processor 172.

Spin motor 480 may also be controlled by a processor within servo controller 177 or slave processor 172 for rotating the wafer holder 478 during processing of a semiconductor wafer W held thereby. An incremental spin encoder 498 is preferably provided to monitor the rate of revolutions of the wafer holder 478 and supply the rate information to the slave processor 172.

Plating module control 114 advantageously operates the fingertips 414 of the wafer holder 478 for grasping or releasing a semiconductor wafer. In particular, slave processor 172 may operate a valve via pneumatic valve actuator 201 for supplying air to pneumatic piston 502 for actuating fingertips 414 for grasping a semiconductor wafer. The slave controller 145 within the plating module control 114 may thereafter operate the valve actuator 201 to remove the air supply thereby disengaging the fingertips 414 from the semiconductor wafer. Slave processor 172 may also control the application of electrical current through the finger assembly 824 during the processing of a semiconductor wafer by operating relay 202.

The processing module controls 114, 115, 116 preferably operate and monitor the processing of semiconductor wafers within the corresponding wafer processing modules 20, 22, 24 via instrumentation or process components 184.

Figure 33:
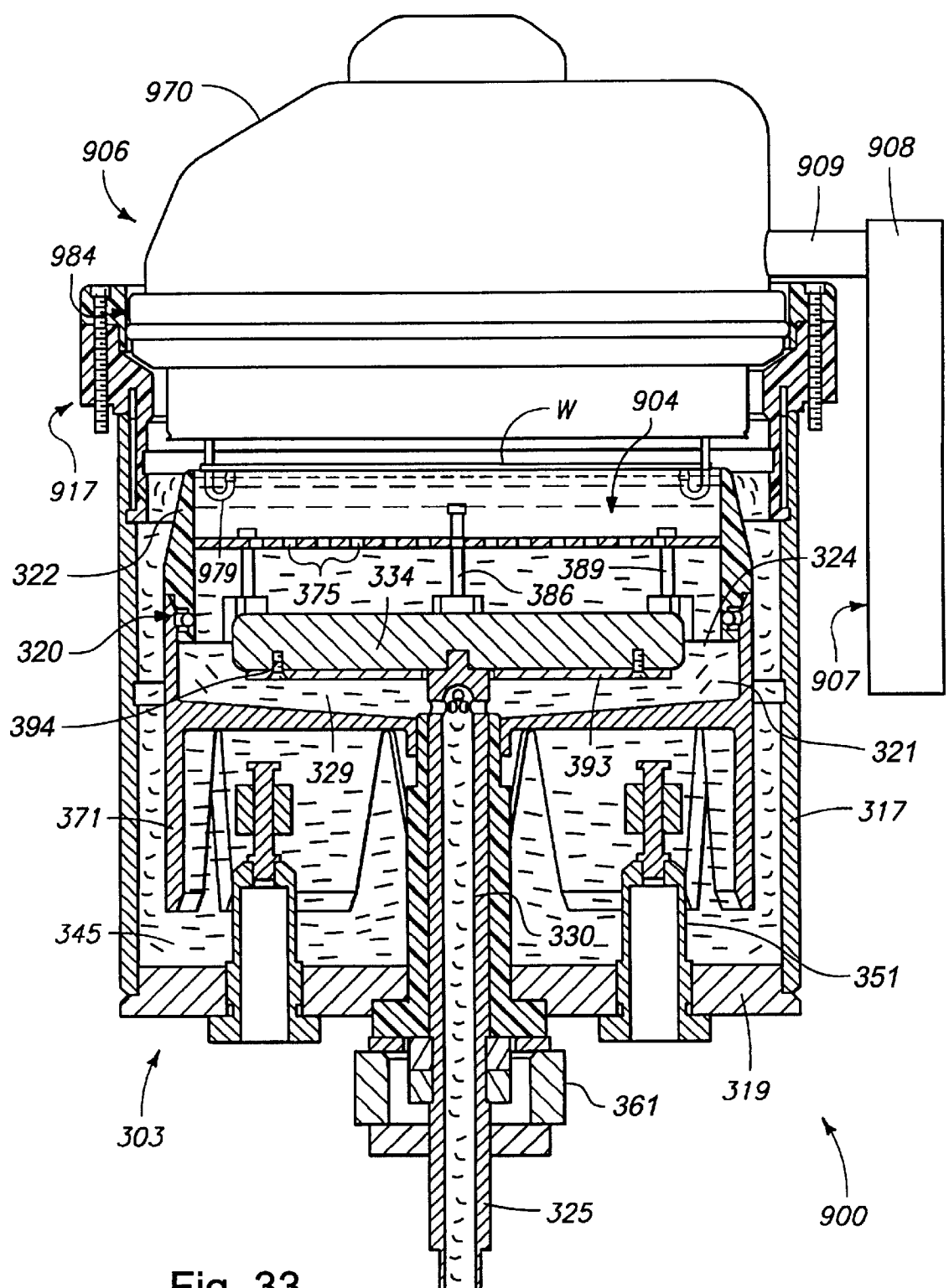
FIG. 33 is a cross-sectional view of a processing station for use in electroplating a downward facing surface of a semiconductor wafer.

Referring to FIG. 33, the control operation for the plating processing module 20 is described. Generally, slave processor 172 monitors and/or controls process components 184 via interface controller 180. Slave processor 172 within the plating module control 114 operates pump 605 to draw processing solution from the process fluid reservoir 604 to the pump discharge filter 607. The processing fluid passes through the filter, into supply manifold 652 and is delivered via bowl supply lines to a plurality of processing plating bowls wherein the semiconductor wafers are processed. Each bowl supply line preferably includes a flow sensor 657 coupled with the plating processing module control 114 for providing flow information of the processing fluid thereto. Responsive to the flow information, the slave processor 172 may operate an actuator of flow controller 658 within each bowl supply line to control the flow of processing fluid therethrough. Slave processor 172 may also monitor and control a back pressure regulator 656 for maintaining a predetermined pressure level within the supply manifold 652. The pressure regulator 656 may provide pressure information to the slave processor 172 within the plating processing control module 114.

Similarly, processing module control subsystems 115, 116 may be configured to control the processing of semiconductor wafers within the corresponding prewet module 22 and resist module 24.

INTERFACE MODULE CONTROL

Each interface module control subsystem 110 preferably controls and monitors the operation of wafer interface modules 38, 39. More specifically, interface module control 110 controls and monitors the operation of the wafer cassette turnstiles 40, 41 and elevators 42, 43 of respective semiconductor wafer interface modules 38, 39 to exchange wafer cassettes 16.

Slave processor 170 within slave controller 140 of interface module control 110 may operate and monitor the function of the interface modules 38, 39. In particular, slave processor 170 may operate doors 35, 36 for providing access into the processing tool 10 via ports 32, 33. Alternatively, master control 100 may operate doors 35, 36.

Figure 31:
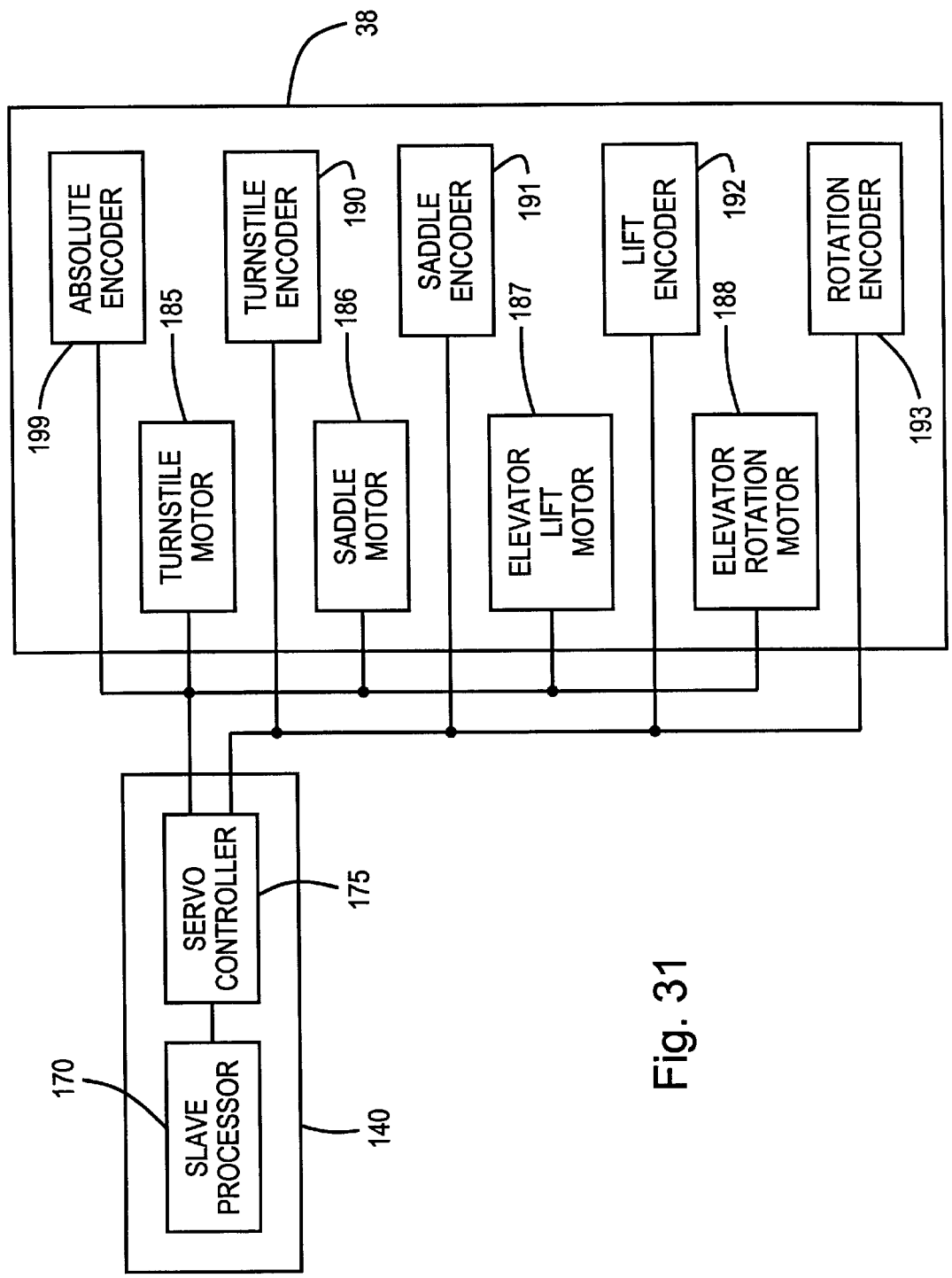
FIG. 31 is a functional block diagram of a slave processor of the interface module control subsystem coupled with components of a wafer interface module of the processing tool.

Referring to FIG. 31, an embodiment of the interface module control portion for controlling wafer interface module 38 is discussed. In particular, the slave processor 170 is coupled with servo controller 175. Either slave processor 170 or a processor on board servo controller 175 may operate the components of interface module 38. In particular, slave processor 170 may control turnstile motor 185 for operating rotate functions of turnstile 40 moving wafer cassettes 16 between a load position and a transfer position. Incremental turnstile encoder 190 monitors the position of turnstile 40 and provides position data to slave processor 170. Alternatively, servo controller 175 may include a processor for reading information from turnstile encoder 190 and controlling turnstile motor 185 in response thereto. Servo controller 175 may alert slave processor 170 once turnstile 40 has reaches a desired position.

Each wafer cassette turnstile 40 includes a motor for controlling the positioning of saddles 45, 46 connected thereto. The slave processor 170 may control the position of saddles 45, 46 through operation of the appropriate saddle motor 186 to orient wafer cassettes 16 attached thereto in one of a vertical and horizontal orientation. Incremental saddle encoders 191 are preferably provided within each wafer cassette turnstile 40 for providing position information of the saddles 45, 46 to the respective slave processor 170.

Either slave processor 170 or servo controller 175 may be configured to control the operation of the wafer cassette elevator 42 for transferring a wafer cassette 16 between either the exchange position and the extraction position. The slave processor 170 may be coupled with an elevator lift motor 187 and elevator rotation motor 188 for controlling the elevation and rotation of elevator 42 and elevator support 47. Incremental lift encoder 192 and incremental rotation encoder 193 may supply elevation and rotation information of the elevator 42 and support 47 to slave processor 170.

Absolute encoders 199 may be utilized to notify slave processor of extreme conditions such as when elevator support 47 reaches a maximum height. Elevator lift motor 187 may be shut down in response to the presence of an extreme condition by absolute encoder 199.

WAFER CASSETTE TRAY

Figure 9:
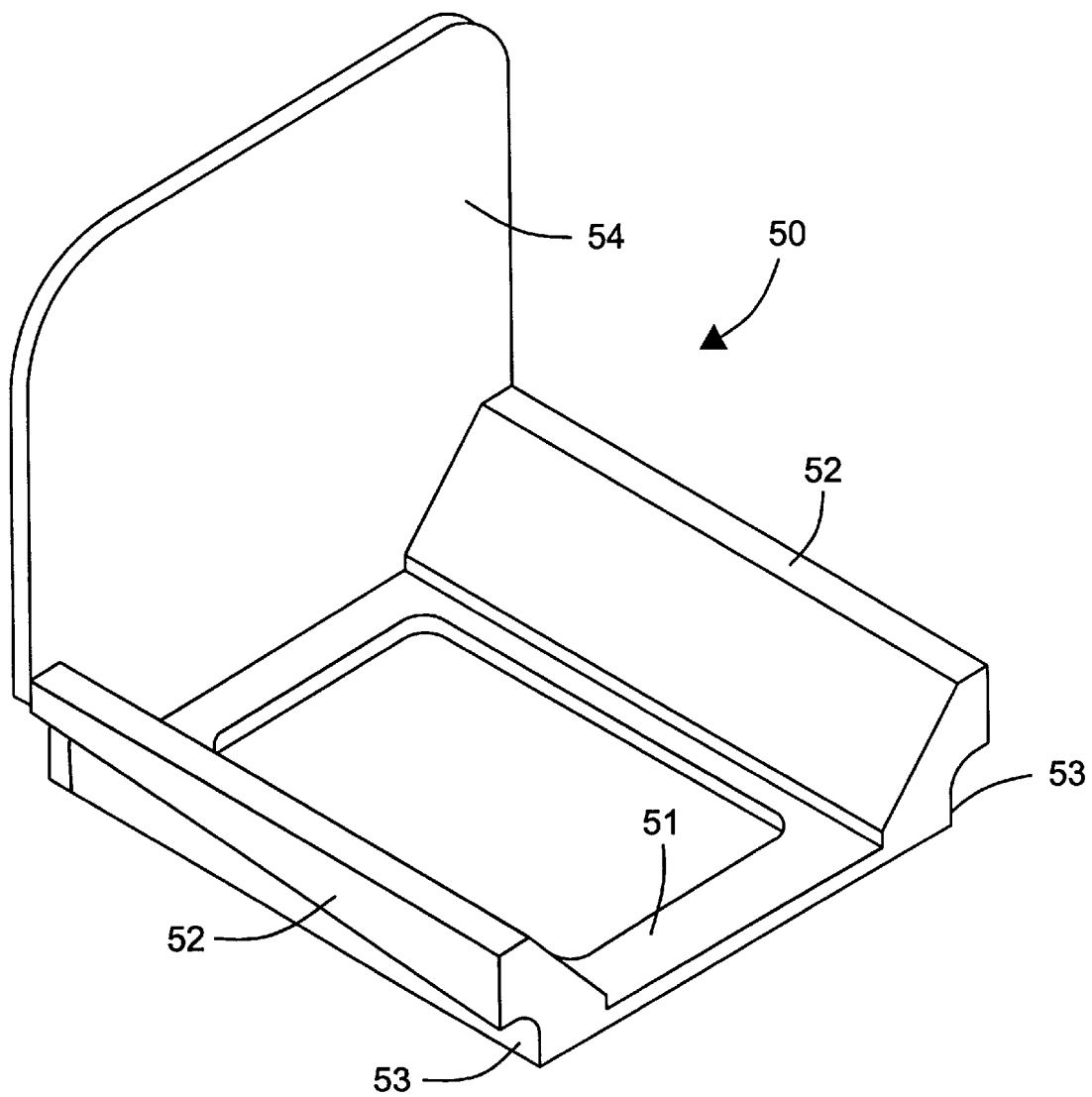
FIG. 9 is an isometric view of a preferred wafer cassette tray engageable with the turnstile of an interface module of the semiconductor wafer processing tool.

A wafer cassette tray 50 for holding a wafer cassette 16 is shown in detail in FIG. 9. Each cassette tray 50 may include a base 51 and an upright portion 54 preferably perpendicular to the base 51. Two lateral supports 52 may be formed on opposing sides of the base 51 and extend upward therefrom. Lateral supports 52 assist with maintaining wafer cassettes 16 thereon in a fixed position during the movement, rotation and exchange of wafer cassettes 16. Each lateral support 52 contains a groove 53 preferably extending the length thereof configured to engage with the forks of saddles 45, 46.

The wafer cassette trays 50 are preferably utilized during the handling of wafer cassettes 16 within the wafer cassette interface modules 38, 39 where the wafer cassettes 16 are transferred from a load position to an extraction position providing access of the semiconductor wafers W to wafer transport units 62, 64 within the conveyor 60.

ELECTROPLATING STATION

FIG. 33 shows principal components of a second semiconductor processing station 900 is specifically adapted and constructed to serve as an electroplating station. The two principal parts of processing station 900 are the wafer rotor assembly, shown generally at 906, and the electroplating bowl assembly 303.

ELECTROPLATING BOWL ASSEMBLY 303

FIG. 33 shows an electroplating bowl assembly 303. The process bowl assembly consists of a process bowl or plating vessel 316 having an outer bowl side wall 317, bowl bottom 319, and bowl rim assembly 917. The process bowl is preferably circular in horizontal cross-section and generally cylindrical in shape although other shapes may be possible.

The bowl assembly 303 includes a cup assembly 320 which is disposed within a process bowl vessel 317. Cup assembly 320 includes a fluid cup portion 321 holding the chemistry for the electroplating process. The cup assembly also has a depending skirt 371 which extends below the cup bottom 323 and may have flutes open therethrough for fluid communication and release of any gas that might collect as the chamber below fills with liquid. The cup is preferably made from polypropylene or other suitable material.

A lower opening in the bottom wall of the cup assembly 320 is connected to a polypropylene riser tube 330 which is adjustable in height relative thereto by a threaded connection. A first end of the riser tube 330 is secured to the rear portion of an anode shield 393 which supports anode 334. A fluid inlet line 325 is disposed within the riser tube 330. Both the riser tube 330 and the fluid inlet line are secured with the processing bowl assembly 303 by a fitting 362. The fitting 362 can accommodate height adjustment of both the riser tube and line 325. As such, the connection between the fitting 362 and the riser tube 330 facilitates vertical adjustment of the anode position. The inlet line 325 is preferably made from a conductive material, such as titanium, and is used to conduct electrical current to the anode 324, as well as supply fluid to the cup.

Process fluid is provided to the cup through fluid inlet line 325 and proceeds therefrom through fluid inlet openings 324. Plating fluid then fills the chamber 904 through opening 324 as supplied by a plating fluid pump (not shown) or other suitable supply.

The upper edge of the cup side wall 322 forms a weir which limits the level of electroplating solution within the cup. This level is chosen so that only the bottom surface of wafer W is contacted by the electroplating solution. Excess solution pours over this top edge surface into an overflow chamber 345. The level of fluid in the chamber 345 is preferably maintained within a desired range for stability of operation by monitoring the fluid level with appropriate sensors and actuators. This can be done using several different outflow configurations. A preferred configuration is to sense a high level condition using an appropriate sensor and then drain fluid through a drain line as controlled by a control valve. It is also possible to use a standpipe arrangement (not illustrated), and such is used as a final overflow protection device in the preferred plating station. More complex level controls are also possible.

The outflow liquid from chamber 345 is preferably returned to a suitable reservoir. The liquid can then be treated with additional plating chemicals or other constituents of the plating or other process liquid and used again.

In the preferred uses according to this invention, the anode 334 is a consumable anode used in connection with the plating of copper or other metals onto semiconductor materials. The specific anode will vary depending upon the metal being plated and other specifics of the plating liquid being used. A number of different consumable anodes which are commercially available may be used as anode 334.

FIG. 33 also shows a diffusion plate 375 provided above the anode 334 for providing a more even distribution of the fluid plating bath across the Wafer W. Fluid passages are provided over all or a portion of the diffusion plate 375 to allow fluid communication therethrough. The height of the diffusion plate is adjustable using diffuser height adjustment mechanisms 386.

The anode shield 393 is secured to the underside of the consumable anode 334 using anode shield fasteners 394 to prevent direct impingement by the plating solution as the solution passes into the processing chamber 904. The anode shield 393 and anode shield fasteners 394 are preferably made from a dielectric material, such as polyvinylidene fluoride or polypropylene. The anode shield is advantageously about 2–5 millimeters thick, more preferably about 3 millimeters thick.

The anode shield serves to electrically isolate and physically protect the back side of the anode. It also reduces the consumption of organic plating liquid additives. Although the exact mechanism may not be known at this time, the anode shield is believed to prevent disruption of certain materials which develop over time on the back side of the anode. If the anode is left unshielded, the organic chemical plating additives are consumed at a significantly greater rate. With the shield in place, these additives are not consumed as quickly.

WAFER ROTOR ASSEMBLY

The wafer rotor assembly 906 holds a wafer W for rotation within the processing chamber 904 The wafer rotor assembly 906 includes a rotor assembly 984 having a plurality of wafer-engaging fingers 979 that hold the wafer against features of the rotor. Fingers 979 are preferably adapted to conduct current between the wafer and a plating electrical power supply and may be constructed in accordance with various configurations to act as current thieves.

The various components used to spin the rotor assembly 984 are disposed in a fixed housing 970. The fixed housing is connected to a horizontally extending arm 909 that, in turn, is connected to a vertically extending arm. Together, the arms 908 and 909 allow the assembly 906 to be lifted and rotated from engagement with the bowl assembly to thereby present the wafer to the wafer conveying assembly 60 for transfer to a subsequent processing station.

ALTERNATIVE LIFT AND TILT MECHANISM

Figure 34:
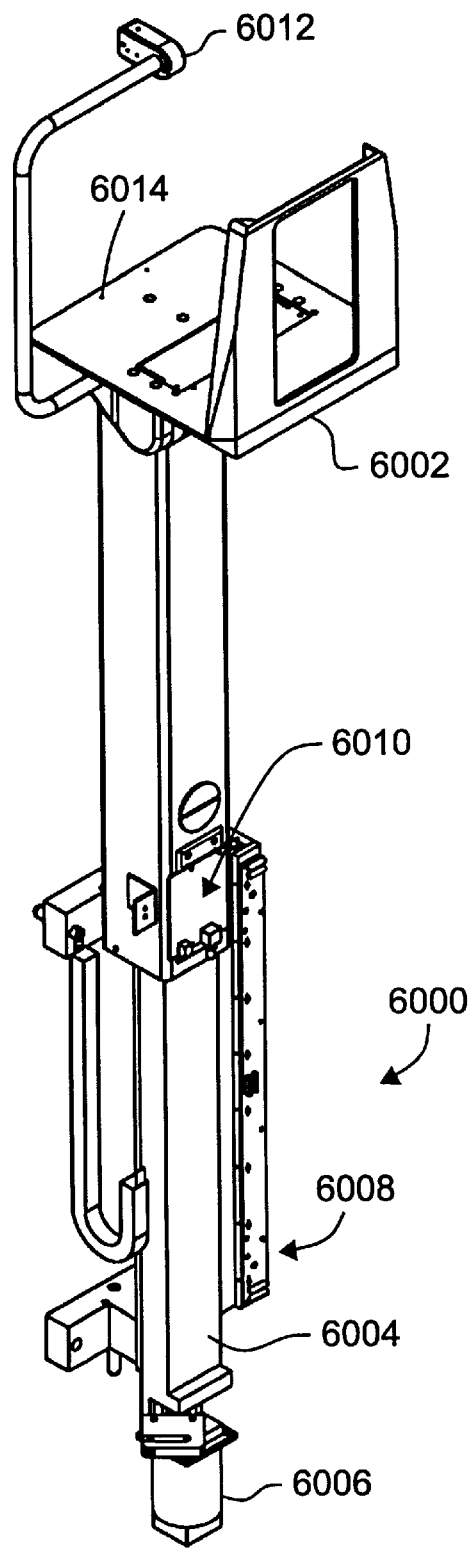
FIG. 34 illustrates a view of a lift/tilt assembly including a nest connected to a linear guide/actuator.

Turning now to FIG. 34, that figure shows an embodiment of a lift/tilt assembly 6000. The components of the lift/tilt assembly 6000 are preferably formed from hard black anodized aluminum, although stainless steel may also be used. The lift/tilt assembly 6000 may be used to load wafers into the interface modules 38,39 and may be used instead of, or in conjunction with, a wafer cassette turnstile 40 or 41 described above. Before the operation of the lift/tilt assembly 6000 is discussed, the component parts of the lift/tilt assembly 6000 will be described.

Referring again to FIG. 34, the lift/tilt assembly 6000 includes a nest 6002 coupled to a linear guide/actuator 6004 that is driven by a motor 6006. The term "nest" generally indicates a platform on which a wafer bearing cassette may be loaded. The lift/tilt assembly 6000 includes a linear encoder LED assembly 6008 and a linear encoder CCD assembly 6010. In addition, the lift/tilt assembly 6000 preferably includes a protrusion sensor 6012, a protrusion sensor receiver 6014, and an H-bar sensor (not shown) located in the nest 6002. The nest 6002 moves between two orientations generally described as wafer-horizontal and wafer-vertical. As shown in FIG. 34, the nest 6002 is in the wafer-horizontal position.

Figure 35:
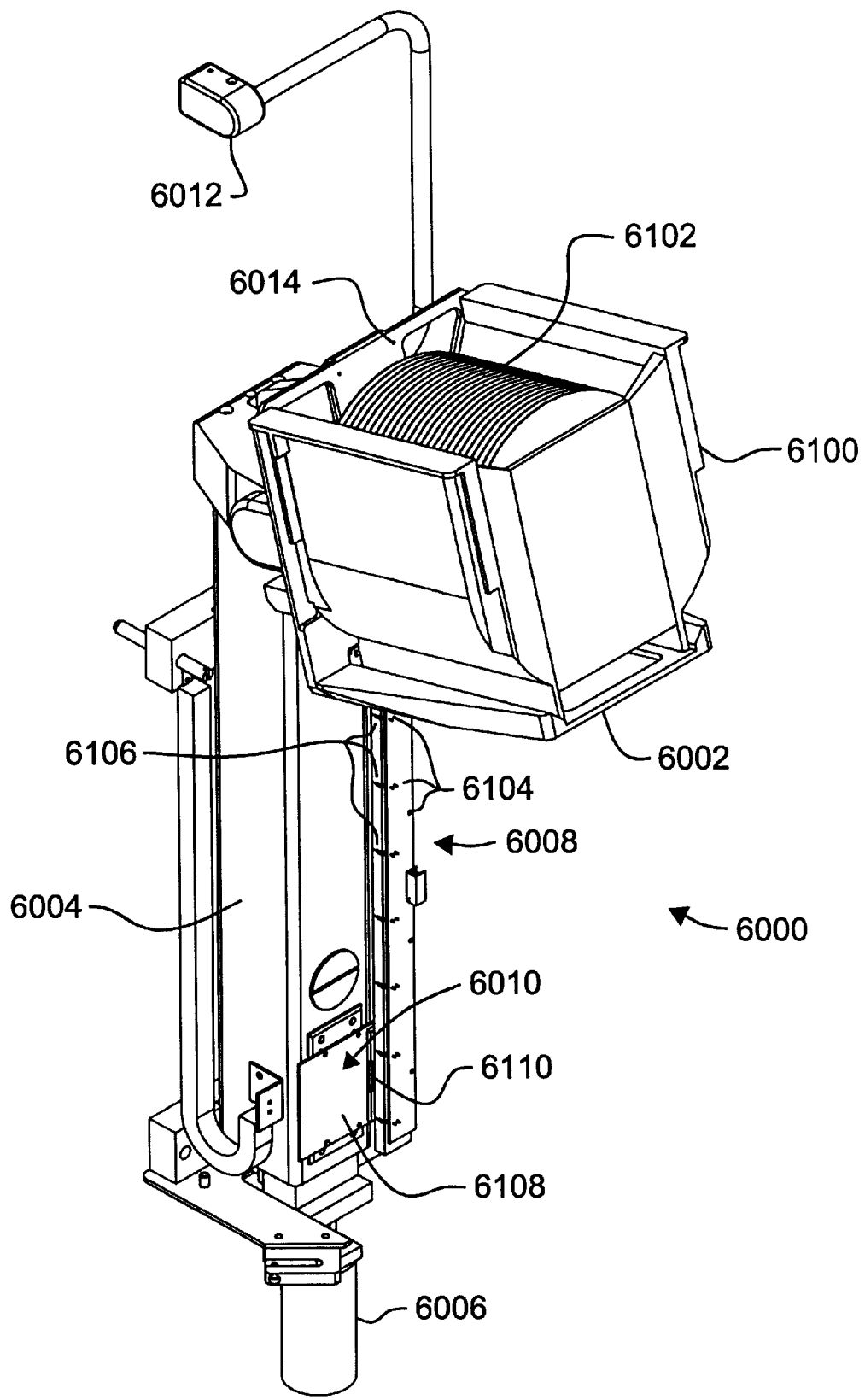
FIG. 35 illustrates another view of a lift/tilt assembly including a nest oriented in a wafer-vertical position and a loaded wafer cassette.

Turning now to FIG. 35, another view of the lift/tilt assembly 6000 is shown. A wafer cassette 6100, holding a number of wafers 6102, rests in the nest 6002. As will be described in more detail below with respect to the operation of the lift/tilt assembly 6000, the nest 6002 in FIG. 35 is oriented in the wafer-vertical position.

Figure 38:
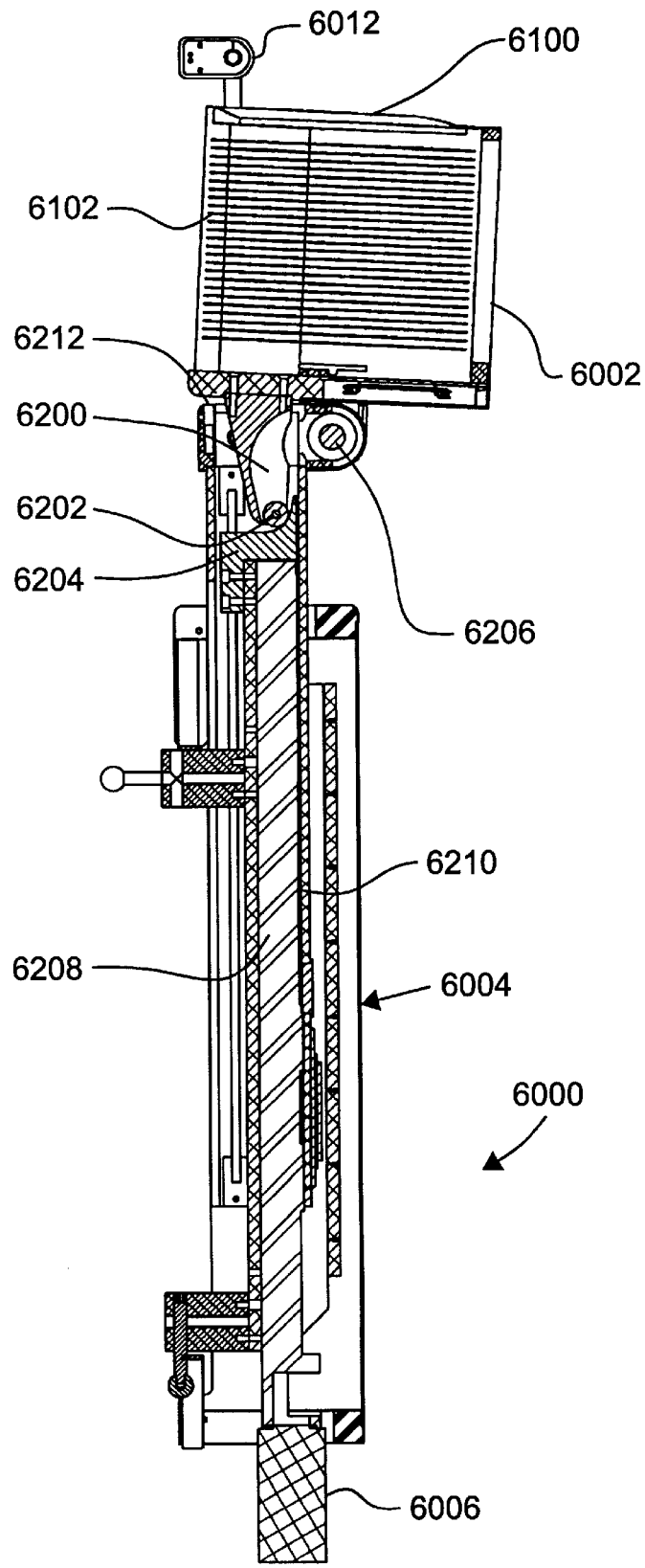

Referring to FIGS. 36–38, three section views of the lift/tilt assembly 6000 are shown. FIGS. 36–38 illustrate operation of the assembly at three translational operating points and show the resultant positioning of the nest 6002 as it moves from a near wafer-vertical position (FIG. 36) to a near wafer-horizontal position (FIG. 38). The linear guide/actuator 6004 includes a fixed frame 6208 and a movable frame 6210. The movable frame 6210 may be implemented as any structure mounted on a moving portion of the linear guide/actuator 6004. For example, the movable frame 6210 may be mounted to a carriage that moves linearly under control of the motor 6006. The linear guide/actuator 6004 may be implemented, for example, with a linear motion guide available from THK America, 200 E. Commerce Drive, Schaumburg, Ill. 60173.

Connected to the nest 6002 is a lever 6200 including a lever wheel or ball bearing 6202 which rides on a guide, for example, ramp 6204. The guide is generally implemented as a smooth surface over which the ball bearing 6020 may roll during transition between the wafer-horizontal position and the wafer-vertical position. A torsion spring assembly 6206 provides forcing bias on the nest 6002 which helps transition the nest 6002 between a wafer-vertical position and a wafer-horizontal position (where the nest 6002 may be supported by a hard stop 6212) as will be explained in more detail below. The ramp 6204 is mounted in a fixed position on top of the fixed frame 6208 while the torsion spring assembly 6206 is mounted on the movable frame 6210.

In operation, as noted above, a lift/tilt assembly 6000 is used to load wafers into the interface modules 38, 39 and may reside behind powered doors 35 or 36. During the loading or unloading process, the lift/tilt assembly 6000 returns to the wafer-vertical position shown in FIG. 35. A sensor connected to the powered doors 35, 36 may be used to inform the control system 100 (FIGS. 14–21) that the powered doors 35, 36, are in fact open, and that the lift/tilt assembly 6000 should not be allowed to move (thereby providing a safety interlock mechanism).

For loading operations, the nest 6002 preferably returns to a wafer-vertical position which is approximately 15 degrees above true vertical. The wafer-vertical position thereby holds the nest 6002 at a small slope down which the wafer cassette 6100 may slide into a completely loaded position. Furthermore, the preferred wafer-vertical position helps eliminate a contaminant generating condition related to the wafers 6102. Because the wafers 6102 fit loosely in the wafer cassette 6100, the wafers 6102 tend to rattle when in a strictly vertical orientation. When the wafers 6102 rattle, they tend to generate particles that may contaminate the processing environment. Thus, the preferred wafer-vertical position prevents the wafers 6102 from resting in a true vertical position and generating particles.

Referring again to FIGS. 36–38, those figures show the motion of the nest 6002 between its wafer-vertical position (FIG. 36) and its wafer-horizontal position (FIG. 38). The movable frame 6210 of the linear guide/actuator 6004 moves linearly along a track under control of the motor 6006, a ball screw and linear bearings (not shown). The motor 6006 generally includes a rotary encoder, typically an optical encoder, that produces a relative encoder output including a predetermined number of pulses (for example, 2000) per motor revolution. The pulses indicate the number of revolutions (or fractions of revolutions) through which the motor has turned. The pulses may therefore be converted to a linear distance by taking into account the coupling between the motor 6006 and the linear guide/actuator 6004. The pulses may be fed back to the control system 100, or may be processed by a local microcontroller which coordinates the movement of the linear way 6004.

In addition to the relative encoder output that the motor produces, the lift/tilt assembly 6000 may optionally include a linear encoder LED assembly 6008 and a linear encoder CCD assembly 6010 which operate together as an linear absolute encoder. Referring again to FIG. 35, the LED assembly 6008 is shown and includes a series of LEDs 6104 and corresponding light transmission slits 6106. The linear encoder CCD assembly 6010 includes a CCD module 6110 and associated CCD control circuitry 6108.

Each individual LED 6104 produces a light output which is directed through a corresponding slit 6106. Each slit 6106 only allows light to pass through that is produced by its corresponding LED, and to that end may, for example, be 15 mils or less in width. The LEDs 6104 are mounted on the fixed frame 6208, while the linear encoder CCD assembly 6010 is mounted on the movable frame 6210. The CCD module 6110 moves along a path underneath the slits 6106 and therefore may detect light produced by the LEDs 6104. Therefore, as the moveable frame 6210 translates up or down the linear way 6004, the CCD control circuitry 6010 may monitor the number and position of the light sources it detects and may provide feedback as to the absolute vertical position of the moveable frame 6210. Commercially available CCD modules provide sufficient resolution to determine the vertical position of the moveable frame 6210 preferably in a range of less than 10 mil resolution. The control system 100 may use feedback from the CCD control circuitry 6010, for example, as a double check against the rotary encoder output produced by the motor 6006.

As the moveable frame 6210 advances up the linear guide/actuator 6004, the nest 6002 moves up with the torsion spring assembly 6206 above from the ramp 6204. The torsion spring exerts a force on the nest 6002 and lever 6200, causing the nest 6002 to rotate around the torsion spring assembly 6206 and into the wafer-horizontal position. During the transition from the wafer-vertical position to the wafer-horizontal position, the ball bearing 6202 and lever 6200 ride on the ramp 6204 which helps ensure a smooth transition between the two positions. When the nest 6002 reaches the wafer-horizontal position, a hard stop 6212 is provided that prevents further rotation of the nest 6002 around the torsion spring assembly 6206.

It is noted that other devices may be used to induce rotational movement of the nest 6002. For example, a nest motor may produce torque on a shaft rigidly connected to the nest 6002 to cause it to rotate between the wafer-vertical and wafer-horizontal orientations. The torque producing nest motor may operate under general program control of the control system 100 to produce rotation in the nest 6002 as the moveable frame 6210 translates.

The torsion spring in the torsion spring assembly 6206 provides the force required to lift a wafer cassette 6100, including wafers 6012, from the wafer-vertical position to the wafer-horizontal position. To that end, the torsion spring is preferably formed from music wire, but may also be formed from stainless steel. When the motor 6006 activates to draw the movable frame 6210 back down the linear way 6004, the nest 6002 rotates in the opposite direction around the torsion spring assembly 6206. The level 6200 and ball bearing 6202 move smoothly along the ramp 6204 in the opposite direction to return the nest 6002 to the wafer-vertical position. At the wafer-vertical position, the lever 6200 provides a stop that holds the nest 6002 at approximately 15 degrees from true vertical (FIG. 36). It is noted that linear movement in the linear guide/actuator 6004 accomplishes both translational and rotational movements in the nest 6002.

Additional sensors may be provided on the lift/tilt assembly 6000 to provide feedback regarding the status of the nest 6002 and the wafer cassette 6100. As noted above, an H-bar sensor may be located in a variety of positions in the nest 6002. A wafer cassette 6100 generally includes two registration bars of vertical length and a registration cross bar of horizontal length. The bars are collectively referred to as an "H-bar". The H-bar sensor may be implemented as an optical sensor and receiver pair or as a mechanical switch sensor that indicates when the H-bar, and therefore a wafer cassette 6100, is present in the nest 6002. An optical H-bar sensor may operate, for example, by providing an optical transmission and reception path which is broken by an H-bar on a loaded wafer cassette 6100, while a mechanical H-bar sensor may operate by providing a mechanical switch that is triggered when the wafer cassette 6100 is inserted in the nest 6002.

Figure 39:
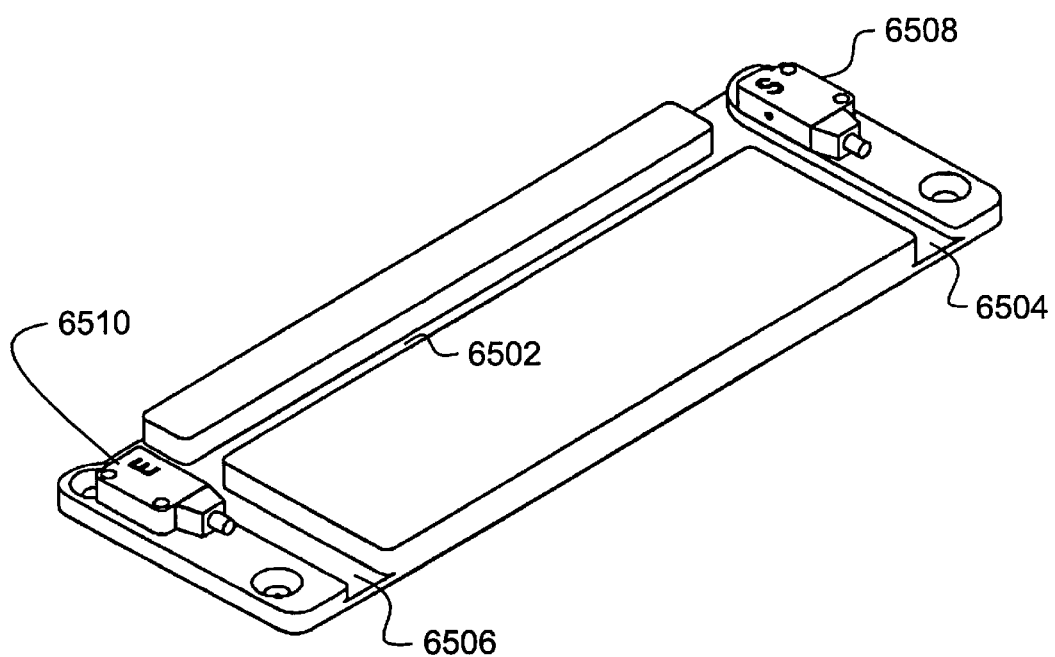
FIG. 39 illustrates a view of an H-bar assembly that may be used with a nest.

Because each wafer cassette manufacturer may control the location of the H-bar and because the wafer cassette may vary in construction between manufacturers, the nest 6002 may be configured with different H-bar assemblies that accept the wafer cassettes 6100 of various manufacturers. The H-bar sensor, in turn, is not restricted to any particular position on the nest 6002, but may be implemented as any optical or mechanical sensor positioned to detect the H-bar or other feature on a particular wafer cassette 6100. FIG. 39 shows one example of an H-bar assembly 6500.

The H-bar assembly 6500 includes a horizontal track 6502, a first vertical track 6504, and a second vertical track 6506. The H-bar assembly 6500 also includes an optical sensor 6508 and an optical emitter 6510. An H-bar on a wafer cassette 6100 fits into the horizontal track 6502 and the vertical tracks 6504, 6506.

As shown in FIG. 39, the optical emitter 6510 is positioned to emit energy along the horizontal track 6502. The optical sensor is positioned across the horizontal track 6502 to receive the emitted energy. The optical sensor 6508 may therefore detect the presence or absence of an H-bar of a wafer cassette 6100 by determining whether it is receiving energy emitted by the optical emitter 6510. The H-bar assembly may be mounted to the nest 6002, for example, across the area 6600 shown in FIG. 40.

Figure 40:
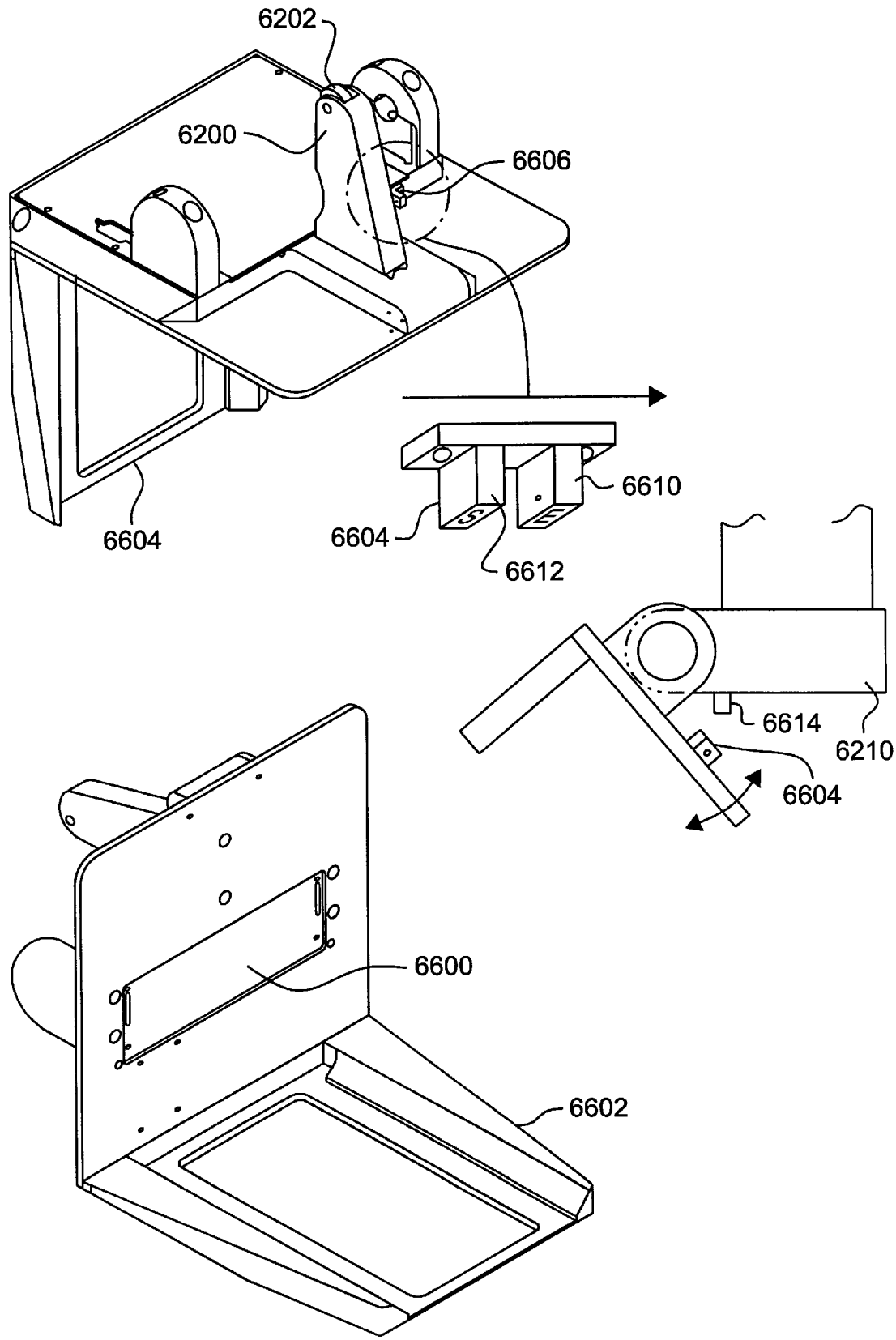
FIG. 40 shows the orientation of a tilt sensor connected to a nest.

The lift/tilt assembly 6000 may also provide a tilt position sensor. As noted above, the torsion spring assembly 6206 provides the force required to move the wafer cassette 6100 from a wafer-vertical orientation to a wafer-horizontal position. The tilt position sensor provides feedback that indicates when the nest 6002 has reached the wafer-horizontal position. FIG. 40 shows one possible implementation of a tilt sensor on a nest 6002.

FIG. 66 shows the top side 6602 of the nest 6002 and the bottom side 6604 of the nest 6002 and a tilt sensor 6604. The tilt sensor may, for example, connect to the bottom side 6604 at location 6606. The tilt sensor 6604 includes an emitter 6610 and a sensor 6612. An interrupter flag 6614 is mounted on the moveable frame 6210. As shown in FIG. 66, the emitter 6610 and the sensor 6612 are placed so that an unbroken optical path exists between the transmitter and receiver while the nest 6002 is rotated out of the wafer-horizontal orientation. The emitter 6610 and the sensor 6612 are also placed on the nest 6002 such that when the nest 6002 rotates into the wafer-horizontal orientation, the interrupter flag 6614 connected to the moveable frame 6210 breaks the path between the emitter 6610 and the sensor 6612.

A tilt sensor may also be implemented as a mechanical switch located on the hard stop 6212. The mechanical switch may then be triggered by the nest 6002 coming into the wafer-horizontal position at the hard stop 6212. Feedback from either the mechanical switch or the optical sensor may be used to determine when the torsion spring assembly 6206 is wearing out, or has failed altogether (for example, the control system 100 may detect that after a sufficient number of motor 6006 revolutions, that the tilt sensor does not indicate wafer-horizontal position for the nest 6002).

Referring again to FIG. 35, that figure illustrates the positions of a protrusion sensor 6012 and a protrusion sensor receiver 6014. The protrusion sensor 6012 houses an emitter, for example an optical emitter, that transmits a beam down to a protrusion sensor receiver 6014. As shown in FIG. 35, the protrusion sensor 6012 is oriented along the right hand side of the lift/tilt assembly 6000. FIG. 34, however, illustrates that a protrusion sensor 6012 may also be oriented along the left hand side of the lift/tile assembly 6000. The left hand orientation includes a left hand protrusion sensor receiver 6014 provided underneath the protrusion sensor 6012 (FIG. 34).

Referring again to FIG. 35, the tube sensor 6012 may detect when wafers 6102 are improperly seated in the wafer cassette 6100. For example, wafers that have become dislodged and that therefore extend out of the wafer cassette 6102 will block the sensor receiver 6014. Because dislodged wafers may catch on an exposed surface during the lift/tilt actuation 6000, the possibility exists that a dislodged wafer may be broken by vertical movement of the moveable frame 6210. Thus, when the output of the sensor receiver 6014 indicates a blocked condition, the control system 100 may respond, for example, by generating an error display, or by directing the wafer transport units 62, 64 to avoid processing the dislodged wafer. The control system 100 may also respond by returning the nest 6002 to the wafer-vertical position in an attempt to move the dislodged wafer back into place in the wafer cassette 6100. Note that, in general, the protrusion sensor 6012 provides the most meaningful feedback when the nest 6002 is in the wafer-horizontal orientation.

Each of the sensors described above may be connected to the control system 100 which may in response exercise intelligent control over the lift/tilt assembly 6000. It will be recognized that the precise placement of the sensors may vary widely while allowing the sensors to perform their intended functions. Thus, for example, it may be possible to mount the protrusion sensor receiver on a portion of the moveable frame 6210 rather than the nest 6002. Furthermore, an additional sensor system, a laser mapping unit, may be provided for indexing the wafers, or absence of wafers, in a wafer cassette 6100.

Figure 41:
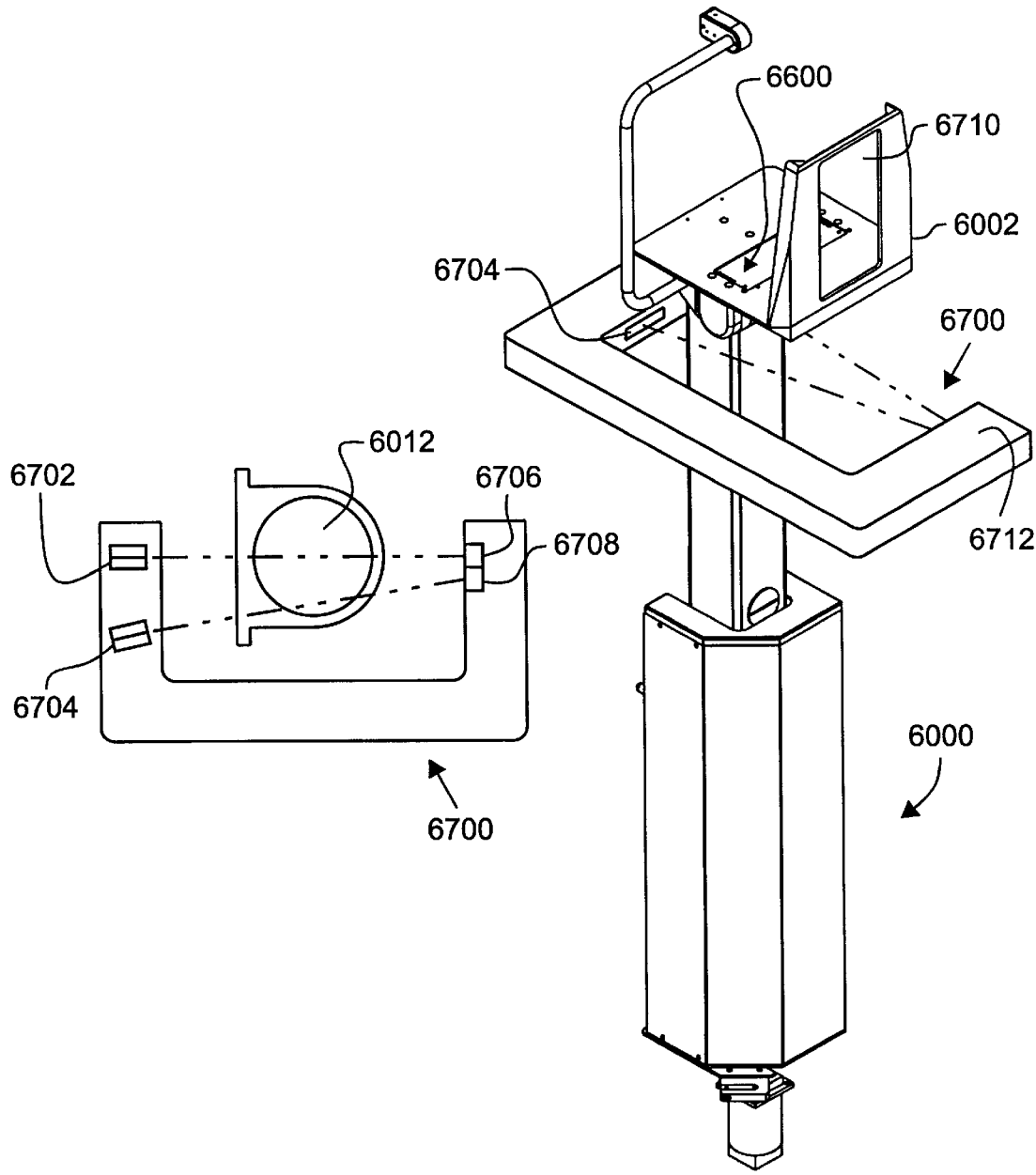
FIG. 41 illustrates a laser mapping system that may be used to detect the presence or absence of wafers in a wafer cassette.

Referring to FIG. 41, a laser mapping system 6700 in shown that includes optical transmitters 6702 and 6704 and optical receivers 6706 and 6708. The optical receivers 6706 and 6708 are placed behind an opening 6710 in the nest 6002. The optical receivers 6706 and 6708 and the optical transmitters 6702 and 6704 may be mounted on a fixed structure 6712 supported independently of the lift/tilt assembly 6000.

The optical transmitters 6702 and 6704 emit radiation, for example at visible or infrared wavelengths, along the nest 6002 and through the opening 6408. The optical receivers 6706 and 6708 produce outputs responsive to the amount of emitted radiation they detect. The nest 6002 moves vertically through the laser mapping system 6700 during the operation of the laser mapping system 6700. In particular, after the nest 6002 has reached the wafer-horizontal position, the moveable frame 6208 may continue to move the nest 6002 (which rests against the hard stop 6212) vertically.

As the nest 6002 continues to move vertically, a laser mapping function takes place during which each of the wafers 6012 passes, in turn, in front of the optical transmitters 6704 and 6706. The radiation emitted by the optical transmitters 6705 and 6706 is therefore alternately prevented and allowed to reach the optical receivers 6706 and 6708. The control system 100 may, therefore, monitor the optical receiver 6706 and 6708 outputs, the motor 6006 rotary encoder output, and optionally the linear encoder CCD assembly 6010 outputs to determine the presence or absence of wafers 6012 and the position of the present or absent wafers 6012 in the wafer cassette 6100. A single optical transmitter and receiver pair is sufficient to perform the laser mapping function, although additional individual optical transmitters, such as the optical transmitter 6704, may be provided to check exclusively for the presence of wafers or to check exclusively for the absence of wafers, for example.

Figure 42:
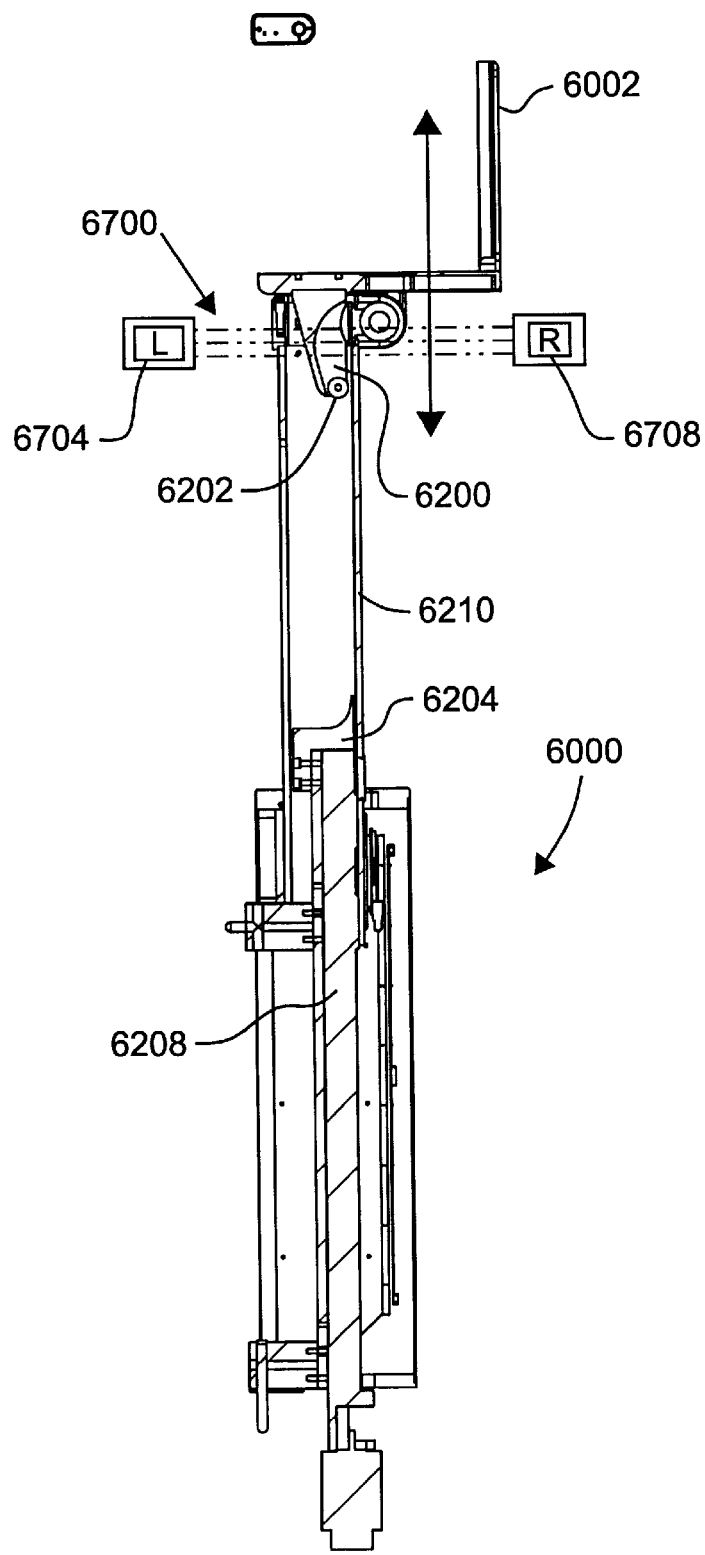
FIG. 42 illustrates a view of a lift/tilt assembly in which the nest has extended vertically past a laser mapping system.

After the laser mapping procedure has completed, the control system 100 may continue to raise the nest 6002 above the optical transmitters 6702 and 6704 so that the wafer transport units 62, 64 can access individual wafers 6012. FIG. 42 illustrates the nest 6002 in a position above the laser mapping system 6700. The control system 100 may then instruct the wafer transport units 52, 54 to operate on the wafers 6102 that the laser mapping system has detected and adjust the height of the nest 6002 so that the wafer transport units 52,52 may access individual wafers 6012. The control system 100 may also instruct the wafer transport units 52, 54 to skip gaps in wafers 6102 that may be present in the wafer cassette 6100 or may instruct the wafer transport units 52, 54 to use gaps in the wafer cassette 6100 to store processed wafers.

Numerous modifications may be made to the foregoing system without departing from the basic teachings thereof. Although the present invention has been described in substantial detail with reference to one or more specific embodiments, those of skill in the art will recognize that changes may be made thereto without departing from the scope and spirit of the invention as set forth in the appended claims.

What is claimed:

1. A lift/tilt assembly for use in a microelectronic workpiece processing device, said lift/tilt assembly comprising:
    a linear guide/actuator comprising a fixed frame and a moveable frame;
    a nest for supporting a workpiece bearing cassette, rotatably connected to said moveable frame, said nest rotating the workpieces in the cassette between a workpiece-horizontal orientation and a workpiece-vertical orientation;
    a motor coupled to said linear guide/actuator; and
    a lever connected to said nest, said lever providing an offset from true vertical for the workpieces in the cassette supported by said nest when the workpieces in the cassette supported by said nest are in said workpiece-vertical orientation.

2. The lift/tilt assembly of claim 1, further comprising a torsion spring assembly connected to said moveable frame, said torsion spring assembly comprising a torsion spring exerting a forcing bias against said nest.

3. The lift/tilt assembly of claim 1, further comprising a nest motor connected to said moveable frame, said nest motor rigidly connected to said nest to produce rotation in said nest.

4. The lift/tilt assembly of claim 1, further comprising a bearing guide connected to said fixed frame and a ball bearing connected to said lever, said bearing guide including a smooth surface over which said ball bearing may move.

5. The lift/tilt assembly of claim 4, wherein said bearing guide is a ramp.

6. The lift/tilt assembly of claim 1, further comprising a linear encoder LED assembly mounted to said fixed frame and a linear encoder CCD assembly mounted to said moveable frame.

7. The lift/tilt assembly of claim 1, further comprising a tilt sensor connected to said nest and to said moveable frame.

8. The lift/tilt assembly of claim 1, further comprising a H-bar sensor connected to said nest.

9. The lift/tilt assembly of claim 1, further comprising a protrusion sensor connected to said moveable frame and a protrusion sensor receiver connected to said nest.

10. The lift/tilt assembly of claim 1, further comprising a laser mapping unit comprising:
    at least one transmitter;
    at least one receiver;
    said transmitter disposed to transmit energy through a workpiece cassette located in said nest, and said receiver disposed to receive said energy transmitted by said transmitter.

11. The lift/tilt assembly of claim 10, wherein said transmitter transmits optical energy and wherein said receiver receives optical energy.

12. The lift/tilt assembly of claim 8, wherein said H-bar sensor is adapted for detecting the presence of a corresponding H-bar of a workpiece cassette, thereby locating the workpiece cassette as being inserted within said nest.

* * * * *